United States Patent
Nosaka

(10) Patent No.: US 10,840,886 B2
(45) Date of Patent: Nov. 17, 2020

(54) RADIO-FREQUENCY FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 16/733,236

(22) Filed: Jan. 3, 2020

(65) Prior Publication Data

US 2020/0144991 A1   May 7, 2020

Related U.S. Application Data

(63) Continuation of application No. PCT/JP2018/020350, filed on May 28, 2018.

(30) Foreign Application Priority Data

Jul. 10, 2017 (JP) ................................ 2017-134980

(51) Int. Cl.
*H03H 9/54* (2006.01)
*H03F 3/19* (2006.01)
(Continued)

(52) U.S. Cl.
CPC ............... *H03H 9/545* (2013.01); *H03F 3/19* (2013.01); *H03H 11/04* (2013.01); *H03H 11/34* (2013.01);
(Continued)

(58) Field of Classification Search
CPC ..................................................... H03H 9/545
See application file for complete search history.

(56) References Cited

U.S. PATENT DOCUMENTS

2007/0026836 A1    2/2007  Chow et al.
2010/0110940 A1*   5/2010  Hara ..................... H03H 9/725
                                                          370/277
(Continued)

FOREIGN PATENT DOCUMENTS

JP    1998-336000 A    12/1998
JP    2000-323961 A    11/2000
(Continued)

OTHER PUBLICATIONS

U.S. Appl. No. 62/420,398, Nov. 2016, Popplewell; Peter Harris Robert.*

(Continued)

*Primary Examiner* — Hsinchun Liao
(74) *Attorney, Agent, or Firm* — Xsensus LLP

(57) ABSTRACT

A radio-frequency filter includes a first series-arm circuit and a second series-arm circuit that is on a circuit path closer to the output terminal than the first series-arm circuit. A first parallel-arm circuit is connected to a ground and a node on the path between the first series-arm circuit and the second series-arm circuit. The first series-arm circuit includes a first series-arm resonator, and a first switch element, the first switch element including first semiconductor elements arranged in series. The second series-arm circuit includes a second series-arm resonator, and a second switch element, the second switch element including at least one second semiconductor element. A first stack number being higher than a second stack number, the first stack number being a number of the first semiconductor elements and the second stack number being a number of the one or more second semiconductor elements.

20 Claims, 22 Drawing Sheets

(51) Int. Cl.
*H03H 11/04* (2006.01)
*H03H 11/34* (2006.01)
*H04B 1/40* (2015.01)

(52) U.S. Cl.
CPC ......... *H04B 1/40* (2013.01); *H03F 2200/294* (2013.01); *H03F 2200/451* (2013.01)

(56) References Cited

U.S. PATENT DOCUMENTS

| | | | |
|---|---|---|---|
| 2014/0184337 A1* | 7/2014 | Nobbe | H03F 1/0227 330/296 |
| 2016/0094199 A1 | 3/2016 | David et al. | |
| 2016/0352310 A1* | 12/2016 | Tani | H04B 1/525 |

FOREIGN PATENT DOCUMENTS

| | | |
|---|---|---|
| JP | 2011-249466 A | 12/2011 |
| JP | 2012-54635 A | 3/2012 |
| JP | 2014-502803 A | 2/2014 |

OTHER PUBLICATIONS

English Translation of the Written Opinion of the International Search Authority dated Jul. 17, 2018 for PCT/JP2018/020350.
International Search Report and Written Opinion dated Jul. 17, 2018 for PCT/JP2018/020350 filed on May 28, 2018, 8 pages including English Translation of the International Search Report.

\* cited by examiner

RADIO-FREQUENCY FILTER, MULTIPLEXER, RADIO-FREQUENCY FRONT-END CIRCUIT, AND COMMUNICATION DEVICE

CROSS REFERENCE TO RELATED APPLICATIONS

This is a continuation application of PCT Patent Application No. PCT/JP2018/020350 filed on May 28, 2018, designating the United States of America, which is based on and claims priority of Japanese Patent Application No. 2017-134980 filed on Jul. 10, 2017. The entire disclosures of the above-identified applications, including the specifications, drawings and claims are incorporated herein by reference in their entirety.

FIELD

The present disclosure relates to a radio-frequency filter, a multiplexer, a radio-frequency front-end circuit, and a communication device that include a resonator.

BACKGROUND

Radio-frequency filters being frequency-tunable (tunable filters) have conventionally been proposed as radio-frequency filters that are multi-band compatible.

Such a radio-frequency filter being frequency-tunable includes a series-arm circuit, and a configuration in which a series-arm resonator is connected in parallel to a circuit constituted by a capacitor and a switch element connected in series is known as the series-arm circuit (see, for example, Patent Literature (PTL) 1).

With the above conventional configuration, since an antiresonant frequency, which is the point at which an impedance of the series-arm circuit is at a local maximum, is changed, it is possible to change a frequency of an attenuation pole configured through the antiresonant frequency, by switching between conduction (ON) and non-conduction (OFF) of a switch.

CITATION LIST

Patent Literature

[PTL 1] U.S. Unexamined Patent Application Publication No. 2007/026836

SUMMARY

Technical Problem

As recognized by the present inventor, when adopting the radio-frequency filter described above, for example, a transmission filter, the radio-frequency filter requires electric power resistance. It is desired to improve electric power resistance of the series-arm circuit in order to improve the electric power resistance of the radio-frequency filter. When improving resistance to damage of the series-arm circuit from electric power, it is imperative to not only improve electric power resistance of the series-arm resonator, but also electric power resistance of the switch included in the series-arm circuit.

For the conventional technique, however, when adopting the above radio-frequency filter for use in multi-band systems, scaling down the switch and low loss when the switch is conducting was a priority issue, but a configuration that improves electric power resistance having the trade-off relationship between scaling down the above switch and low loss had not been studied.

Accordingly, the present disclosure aims to provide a radio-frequency filter, a multiplexer, a radio-frequency front-end circuit, and a communication device that ensure electric power resistance while reducing insertion loss within a passband and scaling down the radio-frequency filter, the multiplexer, the radio-frequency front-end circuit, and the communication device.

Solutions to Problem

In order to achieve the above objective, a radio-frequency filter according to an aspect of the present disclosure includes a first series-arm circuit and a second series-arm circuit that is on a circuit path closer to the output terminal than the first series-arm circuit. A first parallel-arm circuit is connected to a ground and a node on the path between the first series-arm circuit and the second series-arm circuit. The first series-arm circuit includes a first series-arm resonator, and a first switch element, the first switch element including first semiconductor elements arranged in series. The second series-arm circuit includes a second series-arm resonator, and a second switch element, the second switch element including at least one second semiconductor element. A first stack number being higher than a second stack number, the first stack number being a number of the first semiconductor elements and the second stack number being a number of the one or more second semiconductor elements.

In the radio-frequency filter configured as such, a voltage applied when the switches are not conducting is higher in the switch element of the series-arm circuit connected close to the input terminal. Accordingly, it is possible to ensure withstand voltage ("withstand voltage" meaning a threshold voltage below which structural damage to a switch or other circuit element is avoided) while reducing a size of the radio-frequency filter by making the first stack number of the first switch element in the first series-arm circuit connected close to the input terminal higher than the second stack number of the second switch element in the second series-arm circuit connected close to the output terminal (i.e., making the second stack number lower than the first stack number). It is possible to reduce a resistance when the second switch element is conducting (ON resistance) by relatively decreasing the second stack number. As such, it is possible to reduce insertion loss within a passband of the radio-frequency filter when the second switch element is conducting. In other words, it is possible to ensure electric power resistance (or resistant to damage due to electric power) while reducing insertion loss within the passband of the radio-frequency filter being frequency-tunable.

An antiresonant frequency of the first series-arm circuit may be changed by switching between conduction and non-conduction of the first switch element, and an antiresonant frequency of the second series-arm circuit may be changed by switching between conduction and non-conduction of the second switch element.

This makes it possible to change an attenuation pole of the radio-frequency filter by changing the antiresonant frequencies of the first series-arm circuit and the second series-arm circuit.

The one or more semiconductor elements included in the first switch element and the second switch element are transistors. A gate width of each of the transistors included in the first switch element is larger than a gate width of at least one of the transistors included in the second switch element.

In the radio-frequency filter configured as such, it is desirable to ensure withstand current ("withstand current" meaning a threshold current below which damage to a switch or other circuit element is avoided) of the switch elements in order to satisfy the electric power resistance that the radio-frequency filter requires. In this regard, it is easy for a current flowing when the switch element is conducting to increase more in the switch element of the series-arm circuit connected close to the input terminal. Accordingly, it is possible to ensure withstand current realizing the electric power resistance that the radio-frequency filter requires while reducing the size of the radio-frequency filter, by making the gate width of each of the transistors included in the first switch element connected close to the input terminal larger than the gate width of at least one of the transistors included in the second switch element connected close to the output terminal. It is possible to reduce a resistance when the first switch element is conducting due to the gate width of the first switch element being relatively large. As such, it is possible to reduce insertion loss within the passband of the radio-frequency filter when the first switch element is conducting. In other words, it is possible to ensure electric power resistance more while reducing the insertion loss within the passband and scaling down the radio-frequency filter being frequency-tunable, by making not only the stack number higher than the stack number of the second switch element, but also the gate width of the first switch element higher larger than the gate width of the second switch element, i.e., making not only the stack number higher than the stack number of the second switch element lower than the stack number of the first switch element, but also the gate width of the second switch element smaller than the gate width of the first switch element.

An antiresonant frequency of the first series-arm resonator may be lower than an antiresonant frequency of the second series-arm resonator.

This makes it possible to reduce the gate widths of the first switch element and the second switch element along with the gate widths thereof, since it is possible to reduce a sum of a voltage applied to the first switch element and the second switch element and a sum of a current flowing to the first switch element and the second switch element. As such, it is possible to further reduce insertion loss within the passband and scale down the radio-frequency filter while ensuring electric power resistance.

The radio-frequency filter may further include a third series-arm circuit and a second parallel-arm circuit. The third series-arm circuit may be disposed on the path between the first series-arm circuit and the second series-arm circuit. The first parallel-arm circuit may be connected to the ground and a node that is disposed on the path between the first series-arm circuit and the third series-arm circuit. The third series-arm circuit may include a third series-arm resonator, a third capacitor, and a third switch element. The third capacitor and the third switch element may be connected in series. The third series-arm resonator may be connected in parallel to a circuit that is constituted by the third capacitor and the third switch element connected in series. The third switch element may include one or more semiconductor elements. A third stack number may be lower than the first stack number and higher than the second stack number, the third stack number being a number of the one or more semiconductor elements included in the third switch element.

This makes it possible to ensure electric power resistance while reducing the size of the radio-frequency filter even in a configuration including at least three series-arm circuits. It is also possible to make fine adjustments to a frequency and a number of attenuation poles by suitably switching between conduction and non-conduction of the switch elements in each of the at least three series-arm circuits. It is, therefore, possible to ensure electric power resistance while reducing insertion loss within the passband and scaling down the radio-frequency filter that is capable of making fine adjustments to the frequency and the number of the attenuation poles.

The one or more semiconductor elements included in the third switch element are transistors. A gate width of each of the transistors included in the third switch element may be smaller than a gate width of at least one of the transistors included in the first switch element and larger than a gate width of at least one of the transistors included in the second switch element.

This makes it possible to ensure withstand current satisfying the electric power resistance that the radio-frequency filter requires while reducing the size of the radio-frequency filter even in the configuration including at least three series-arm circuits.

The first parallel-arm circuit may include a parallel-arm resonator and a fourth switch element connected in series to the parallel-arm resonator. To be specific, at least one of a resonant frequency or an antiresonant frequency of the first parallel-arm circuit may be changed by switching between conduction and non-conduction of the fourth switch element.

This makes it possible to change (tune) at least one of a resonant frequency of an attenuation pole at the low side of the passband and an attenuation pole at the high side of the passband, by switching between conduction and non-conduction of the fourth switch element. In other words, it is possible to increase change variation in the frequency of the radio-frequency filter.

The fourth switch element includes one or more semiconductor elements connected in series. The first stack number or the second stack number may be lower than a fourth stack number that is a number of the one or more semiconductor elements included in the fourth switch element.

With this, it is easy to apply a voltage that is higher in the one or more switch elements in the parallel-arm circuit than in the one or more switch elements in the series-arm circuit. Accordingly, it is possible to ensure electric power resistance while reducing insertion loss within the passband and scaling down the radio-frequency filter, by making the fourth stack number of the fourth switch element in the first parallel-arm circuit higher than the first stack number or the second stack number (i.e., by making the first stack number or the second stack number lower than the fourth stack number).

The one or more semiconductor elements included in the fourth switch element are transistors. A gate width of each of the transistors included in the first switch element or the second switch element may be smaller than a gate width of at least one of the transistors included in the fourth switch element.

With this, it is easy for a current to flow that is greater in the one or more switch elements in the parallel-arm circuit than in the one or more switch elements in the series-arm circuit. Accordingly, it is possible to ensure electric power resistance while reducing insertion loss within the passband and scaling down the radio-frequency filter by making the gate width of the fourth switch element in the first parallel-arm circuit larger than the gate width of the first switch element or the second switch element (i.e., by making the gate width of the first switch element or the second switch element smaller than the gate width of the fourth switch element).

The multiple switch elements included in the radio-frequency filter may be included in one package.

This makes it possible to scale down the radio-frequency filter.

The one or more semiconductor elements included in each of the multiple switch elements included in the radio-frequency filter may be field-effect transistor switches containing gallium arsenide (GaAs) or a complementary metal-oxide-semiconductor (CMOS).

With this, the field-effect transistor (FET) has a planar structure and is easily integrable since the FET does not impinge on other elements, making it possible to reduce insertion loss within the passband and scale down the radio-frequency filter.

The resonators included in the radio-frequency filter use surface acoustic waves (SAWs) or bulk acoustic waves (BAWs).

This makes it possible to reduce insertion loss within the passband and scale down the radio-frequency filter, since the SAW resonators and the BAW resonators are compact and display high Q characteristics. Since it is possible to increase a steepness of an attenuation slope of the passband, it is possible to make the radio-frequency filter highly selective.

A multiplexer according to an aspect of the present disclosure includes a plurality of the above radio-frequency filters. An input terminal or an output terminal of each of the plurality of filters is directly or indirectly connected to a common terminal.

This makes it possible to provide a multiplexer that ensures electric power resistance characteristics, while scaling down the multiplexer and reducing insertion loss within the passband.

A radio-frequency front-end circuit according to an aspect of the present disclosure includes the above radio-frequency filter or the above multiplexer, and an amplifier circuit directly or indirectly connected to the radio-frequency filter or the multiplexer.

This makes it possible to provide a radio-frequency front-end circuit that ensures electric power resistance characteristics, while scaling down the radio-frequency front-end circuit and improving a gain within the passband.

The amplifier circuit is a power amplifier that amplifies a high-frequency transmission signal. The high-frequency transmission signal amplified by the power amplifier may be inputted to the input terminal of each of the plurality of filters.

This makes it possible to provide a transmission-type radio-frequency front-end circuit that ensures electric power resistance characteristics, while scaling down the radio-frequency front-end circuit and improving the gain within the passband.

The amplifier circuit is a low-noise amplifier that amplifies a high-frequency reception signal. The high-frequency reception signal amplified by the low-noise amplifier may be outputted from the output terminal of each of the plurality of filters.

This makes it possible to provide a reception-type radio-frequency front-end circuit that ensures electric power resistance characteristics, while scaling down the radio-frequency front-end circuit and improving the gain within the passband.

A communication device according to an aspect of the present disclosure includes a radio frequency (RF) signal processing circuit that processes a high-frequency signal to be transmitted by an antenna element and a high-frequency signal to be received by the antenna element, and the radio-frequency front-end circuit that transmits the high-frequency signals between the antenna element and the RF signal processing circuit.

This makes it possible to provide a communication device that ensures electric power resistance characteristics, while scaling down the communication device and improving the gain within the passband.

Advantageous Effects

A radio-frequency filter and the like according to the present disclosure make it possible to ensure electric power resistance characteristics, while scaling down the radio-frequency filter and the like and reducing insertion loss within a passband.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
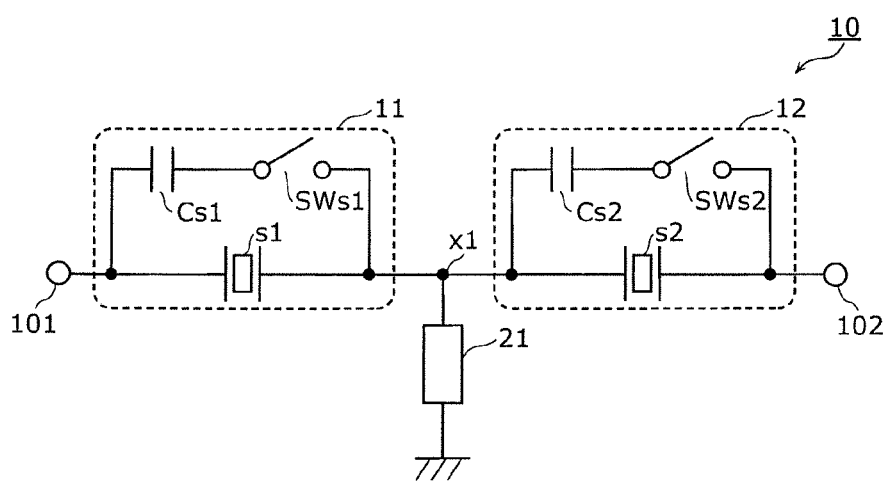
FIG. 1 is a circuit configuration diagram of a filter according to Embodiment 1.

Hereinafter, embodiments of the present disclosure will be described in detail with reference to examples and the drawings. Note that each of the embodiments described below shows a comprehensive or specific example in the present disclosure. Numerical values, shapes, materials, components, placement and connection of the components, and the like are mere examples and are not intended to limit the present disclosure. Components in the following embodiments not mentioned in any of the independent claims are described as optional elements. The sizes or ratios of sizes of components shown in the drawings are not necessarily strictly accurate. In the drawings, components that are substantially the same as components described previous thereto have the same reference numerals and overlapping descriptions may be omitted or simplified.

Hereinafter, "low end of the passband" means "lowest frequencies within the passband." "High end of the passband" means "highest frequencies within the passband". Hereinafter, "low side of the passband" means "frequencies outside of the passband and lower than the passband." Hereinafter, "high side of the passband" means "frequencies outside of the passband and higher than the passband". Hereinafter, "low frequency side" may be referred to as "low side" and "high frequency side" as "high side". "High-frequency" generally means frequencies in the radio frequency (RF) band (e.g., 800 MHz to 900 MHz range), and thus high-frequency filter and RF filter are used synonymously herein. When referring to "passband", generally the passband is defined by the filter's 3 dB attenuation points.

Resonant frequency in a resonator or a circuit is the resonant frequency for forming (i) a passband of a filter including the resonator or the circuit, or (ii) an attenuation pole close to the passband, and a frequency of a "resonance point" that is the point at which an impedance of the resonator or the circuit is at a local minimum (ideally the point at which the impedance becomes 0), unless otherwise specified.

Antiresonant frequency in a resonator or a circuit is the antiresonant frequency for forming (i) the passband of the filter including the resonator or the circuit, or (ii) the attenuation pole close to the passband, and a frequency of an "antiresonance point" that is the point at which the impedance of the resonator or the circuit is at a local maximum (ideally the point at which the impedance becomes limitless).

Note that in the following embodiments, series-arm circuit and parallel-arm circuit are defined as follows.

A parallel-arm circuit is disposed between a ground and one node on a path that connects an input terminal and an output terminal.

A series-arm circuit is disposed (i) between the input terminal or the output terminal and a node on the path to which the parallel-arm circuit is connected, or (ii) between one node on the path to which one parallel-arm circuit is connected and another node on the path to which another parallel-arm circuit is connected.

Embodiment 1

1) Basic Configuration of Radio-Frequency Filter

FIG. 1 is a circuit configuration diagram of filter 10 according to Embodiment 1. Filter (radio-frequency filter) 10 shown in the drawing includes series-arm circuits 11 and 12, parallel-arm circuit 21, and input/output terminals 101 and 102. When input/output terminal 101 is an input terminal to which a high-frequency signal is inputted, input/output terminal 102 is an output terminal. When input/output terminal 102 is the input terminal to which the high-frequency signal is inputted, input/output terminal 101 is the output terminal.

Note that when filter 10 is used as, for example, a time-division duplex (TDD) filter, high-frequency electric power may be applied to the output terminal. Even in this case, however, when comparing high-frequency electric power applied to the input terminal in one period with high-frequency electric power applied to the output terminal in another period, the former is greater than the latter. In other words, in this case, the input terminal of filter 10 is the input/output terminal, among input/output terminals 101 and 102, to which more high-frequency electric power can be applied.

Note that when filter 10 is used as, for example, a multiplexer transmission filter, reception electric power may be applied to the output terminal. Since transmission electric power is greater than reception electric power, in this case, too, the input terminal of filter 10 is the input/output terminal, among input/output terminals 101 and 102, to which more high-frequency electric power can be applied.

Series-arm circuit 11 is disposed on a path that connects input/output terminal 101 and input/output terminal 102. Series-arm circuit 12 is disposed closer to input/output terminal 102 than the path-shaped series-arm circuit 11 is. In Examples 1 and 2 that will be described later, input/output terminal 101 is the input terminal to which the high-frequency signal is inputted and input/output terminal 102 is the output terminal from which the high-frequency signal is outputted. In this case, series-arm circuit 11 is also referred to as a first series-arm circuit and series-arm circuit 12 as a second series-arm circuit. In Examples 3 that will be described later, input/output terminal 101 is the output terminal from which the high-frequency signal is outputted and input/output terminal 102 is the input terminal to which the high-frequency signal is inputted. In this case, series-arm circuit 11 is also referred to as the second series-arm circuit and series-arm circuit 12 as the first series-arm circuit. In other words, the series-arm circuit close to the input terminal is the first series-arm circuit and the series-arm circuit close to the output terminal is the second series-arm circuit.

Parallel-arm circuit 21 is a first parallel-arm circuit that is (i) disposed between series-arm circuit 11 and series-arm circuit 12, and (ii) connected between a ground and the path that connects input/output terminal 101 and input/output terminal 102. The first parallel-arm circuit may include, for example, a parallel-arm resonator that is an acoustic wave resonator, or may also be a resonant circuit including multiple resonators that are, for example, vertically combined resonators. The first parallel-arm circuit may be, for example, a resonant circuit including an inductor and a capacitor. The parallel-arm circuit is not limited to being a resonant circuit, and may also be an impedance element such as an inductor or a capacitor.

Series-arm circuit 11 includes series-arm resonator s1, capacitor Cs1, and switch SWs1. Switch SWs1 is a switch element that is (i) connected in series to capacitor Cs1 and (ii) includes one or more semiconductor elements connected in series. Series-arm circuit 12 includes series-arm resonator s2, capacitor Cs2, and switch SWs2. Switch SWs2 is a switch element that is (i) connected in series to capacitor Cs2 and (ii) includes one or more semiconductor elements connected in series. The one or more semiconductor elements included in switch SWs1 and switch SWs2 are, for example, transistors. Note that hereinafter, the one or more one semiconductor elements (transistors) are also referred to as at least one semiconductor element (transistor).

When input/output terminal 101 is the input terminal to which the high-frequency signal is inputted and input/output terminal 102 is the output terminal from which the high-frequency signal is outputted; series-arm resonator s1, capacitor Cs1, and switch SWs1 are also respectively referred to as a first series-arm resonator, a first capacitor, and a first switch element; and series-arm resonator s2, capacitor Cs2, and switch SWs2 are also respectively referred to as a second series-arm resonator, a second capacitor, and a second switch element. However, when input/output terminal 101 is the output terminal from which the high-frequency signal is outputted and input/output terminal 102 is the input terminal to which the high-frequency signal is inputted; series-arm resonator s1, capacitor Cs1, and switch SWs1 are also respectively referred to as the second series-arm resonator, the second capacitor, and the second switch element; and series-arm resonator s2, capacitor Cs2, and switch SWs2 are also respectively referred to as the first series-arm resonator, the first capacitor, and the first switch element.

Note that series-arm circuit 12 has the same configuration as series-arm circuit 11 except that series-arm circuit 12 is connected close to input/output terminal 102 and has a different circuit constant. To be specific, series-arm resonator s1, capacitor Cs1, and switch SWs1 in series-arm circuit 11 respectively correspond to series-arm resonator s2, capacitor Cs2, and switch SWs2 in series-arm circuit 12. Accordingly, series-arm circuit 11 will hereinafter be described and description of series-arm circuit 12 will be simplified.

Note that resonator division numbers of series-arm resonator s1 and series-arm resonator s2 may differ from each other. Series-arm circuit 11 and series-arm circuit 12 may also have different configurations due to at least one of series-arm circuit 11 and series-arm circuit 12 including an element with a different circuit configuration that will be described later. These matters also apply to descriptions of subsequent circuit configurations.

Series-arm resonator s1 is an acoustic wave resonator using acoustic waves, and uses, for example, surface acoustic waves (SAWs) or bulk acoustic waves (BAWs), or is a film bulk acoustic resonator (FBAR), etc. Note that SAWs do not only include surface waves but also boundary waves. Note that series-arm resonator s1 may be a circuit having a resonant frequency and an antiresonant frequency like an equivalent circuit of a resonator including an LC element (circuit that is constituted by (i) a circuit constituted by an inductor and a capacitor connected in series, and (ii) a capacitor connected in parallel to the circuit).

A passband is configured through the resonant frequency of series-arm circuit 11 and an attenuation pole is configured through an antiresonant frequency of series-arm circuit 11. In series-arm circuit 11, series-arm resonator s1 is connected in parallel to a circuit constituted by capacitor Cs1 and switch SWs1 connected in series. By switching between conduction and non-conduction of switch SWs1 in accordance with a control signal from a controller (not illustrated) such as a radio frequency integrated circuit (RFIC), an impedance of series-arm circuit 11 is changed, i.e., the antiresonant frequency of series-arm circuit 11 is changed. With this, a frequency of the attenuation pole of filter 10 is changed (a type of frequency tuning). Since the circuit, which is constituted by capacitor Cs1 and switch SWs1 connected in series, does not function when switch SWs1 is not conducting, series-arm circuit 11 substantially has the same resonance characteristics as series-arm resonator s1. However, since series-arm circuit 11 becomes a circuit that is constituted by series-arm resonator s1 and capacitor Cs1 connected in parallel when switch SWs1 is conducting, the antiresonant frequency of series-arm circuit 11 is lower than an antiresonant frequency of series-arm resonator s1.

A frequency-tunable range of the attenuation pole of filter 10 is dependent on an element value of capacitor Cs1, and, for example, increases with an increase in the element value of capacitor Cs1. Accordingly, it is possible to suitably determine the element value of capacitor Cs1 in accordance with frequency specifications that filter 10 requires. Capacitor Cs1 may be a variable capacitor such as a varicap or a digitally tunable capacitor (DTC).

Switch SWs1 is a single pole single throw (SPST) switch element including a transistor that is a semiconductor element. To be specific, switch SWs1 includes a field-effect transistor (FET), and contains, for example, gallium arsenide (GaAs) or a complementary metal-oxide-semiconductor (CMOS). It is possible to scale down filter 10, since the switch using such a semiconductor is compact.

With the above circuit configuration, the impedance of series-arm circuit 11 is changed by switching between conduction and non-conduction of switch SWs1, and with this, the antiresonant frequency of series-arm circuit 11 is changed. To be specific, the antiresonant frequency is changed (tunable) to a low side or a high side in accordance with conduction and non-conduction of switch SWs1.

In filter 10 according to Embodiment 1, since a series circuit of capacitor Cs1 and switch SWs1 is connected in parallel to series-arm resonator s1, the antiresonant frequency of series-arm circuit 11 is changed to the high side, by switching switch SWs1 from conduction to non-conduction. Since the frequency of the attenuation pole of filter 10 is regulated by the antiresonant frequencies of series-arm circuits 11 and 12, the frequency of the attenuation pole of filter 10 becomes tunable by switching between conduction and non-conduction of switches SWs1 and SWs2.

Hereinafter, configurations of switches SWs1 and SWs2 included in filter 10 will be described in detail with reference to FIG. 2A and FIG. 2B.

2) Structure and Characteristics of Switch Elements

Figure 2A:
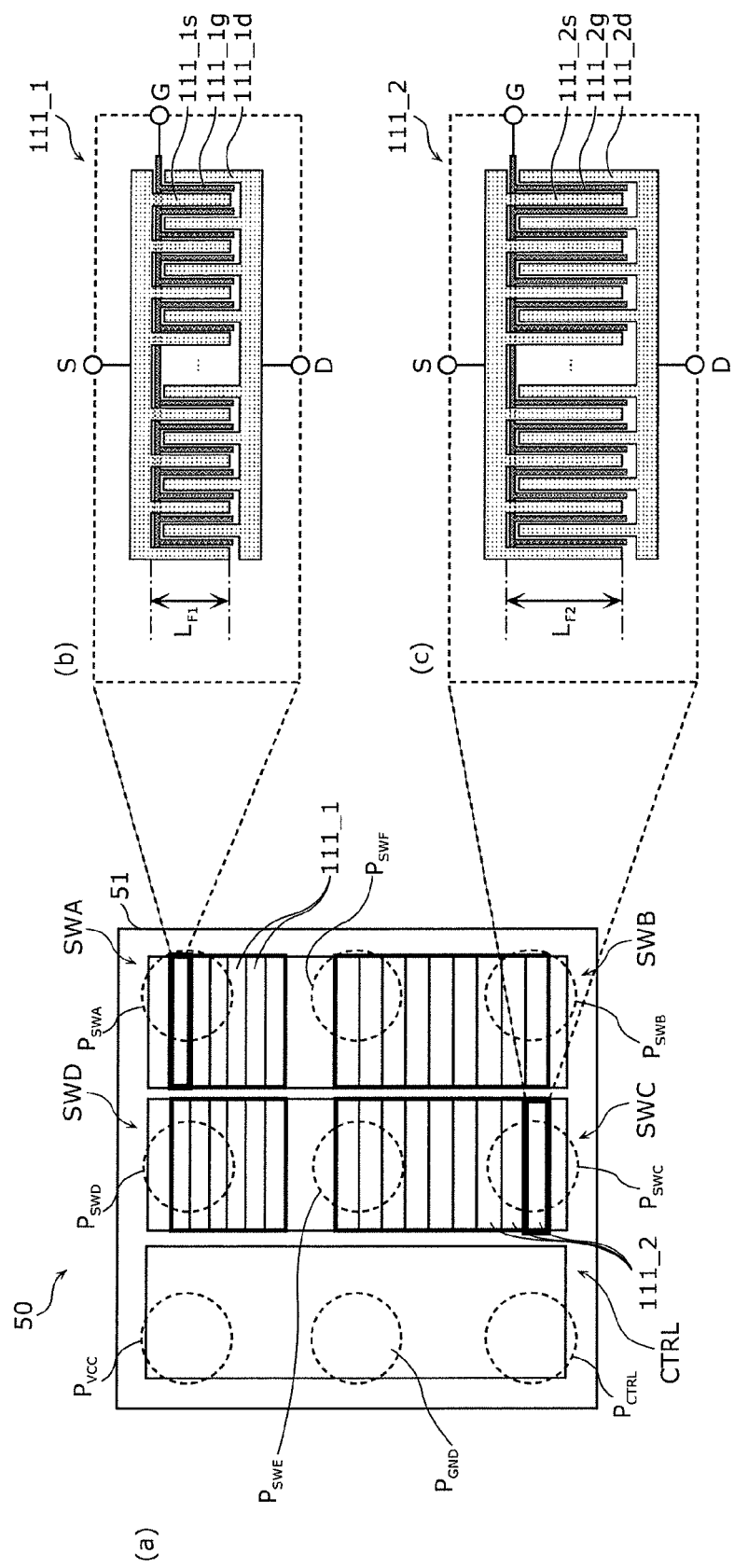
FIG. 2A is a schematic view of a configuration of switches.
Figure 2B:
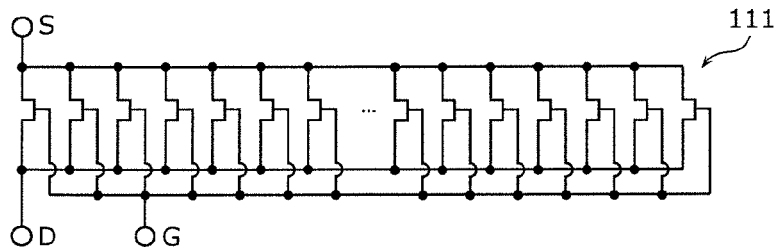
FIG. 2B is a circuit configuration diagram of a semiconductor element included in the switch.

FIG. 2A is a schematic view of a configuration of switch integrated circuit (IC) 50 according to Embodiment 1. FIG. 2B is a circuit configuration diagram of transistor 111 included in switch IC 50. (a) of FIG. 2A shows an implementation example of the switch IC including four switches SWA-SWD.

As illustrated in (a) of FIG. 2A, switches SWA-SWD are disposed on substrate 51. Power supply terminal $P_{VCC}$; control terminal $P_{CTRL}$; ground terminal $P_{GND}$; and switch terminals $P_{SWA}$, $P_{SWB}$, $P_{SWC}$, $P_{SWD}$, $P_{SWE}$, and $P_{SWF}$ are disposed on a rear surface of substrate 51. Switch SWA is connected between switch terminals $P_{SWA}$ and $P_{SWF}$, switch SWB is connected between switch terminals $P_{SWB}$ and $P_{SWF}$, switch SWC is connected between switch terminals $P_{SWC}$ and $P_{SWE}$, and switch SWD is connected between switch terminals $P_{SWD}$ and $P_{SWE}$.

When implementing filter 10 according to Embodiment 1 through switch IC 50 shown in FIG. 2A, switch SWs1 included in filter 10 corresponds to switch SWA, switch SWs2 corresponds to switch SWC, and switches SWB and SWD are not in use. Note that switch IC 50 is not limited to the configuration shown in FIG. 2A, and may also include only switches SWA and SWC among switches SWA-SWD shown in FIG. 2A. Note that in the descriptions for FIG. 2A and FIG. 2B, input/output terminal 102 is the input terminal to which the high-frequency signal is inputted, switch SWC corresponding to switch SWs2 being connected close to input/output terminal 102.

For example, control circuit CTRL is disposed on substrate 51, control circuit CTRL (i) operating through power supply voltage VCC supplied from a power supply circuit such as a power management IC and (ii) generating multiple switch drive voltages that separately make switches SWs1-SWs4 conduct and not conduct, in accordance with the control signal inputted from the RFIC.

Switches SWA-SWD each have a circuit configuration in which multiple transistors 111 are connected in series. Note that switches SWA-SWD may also each include one transistor 111. As illustrated in (b) of FIG. 2A, transistor 111_1 included in switch SWA is, for example, a FET that includes a source electrode consisting of multiple source electrode fingers 111_1s, a drain electrode consisting of multiple drain electrode fingers 111_1d, and a gate electrode consisting of multiple gate electrode fingers 111_1g. As illustrated in (c) of FIG. 2A, transistor 111_2 included in switch SWC is, for example, a FET that includes a source electrode consisting of multiple source electrode fingers 111_2s, a drain electrode consisting of multiple drain electrode fingers 111_2d, and a gate electrode consisting of multiple gate electrode fingers 111_2g. In other words, in transistor 111 (111_1 and 111_2), multiple single FETs including a source electrode finger, a drain electrode finger, and a gate electrode finger that face one another are disposed in parallel (comb-shaped).

In switches SWA-SWD configured as such, a length overlapping the electrode finger included in one transistor 111 is referred to as finger length $L_F$, and finger length $L_F$ multiplied by finger number $N_F$ is referred to as gate width W. The number of transistors 111 included in one switch is referred to as stack number Ns.

As illustrated in (a) of FIG. 2A, stack number Ns2 (here in this example, there are 9 fingers) of transistors 111_2 included in switch SWC corresponding to switch SWs2 is higher than stack number Ns1 (here, 6 fingers) of transistors 111_1 included in switch SWA corresponding to switch SWs1. In other words, stack number Ns2 (here, a first stack number) of switch SWs2 (here, the first switch element) in series-arm circuit 12 (here, the first series-arm circuit) is higher than stack number Ns2 (here, a second stack number) of switch SWs1 (here, the second switch element) in series-arm circuit 11 (here, the second series-arm circuit).

Gate width W2 of each of one or more (here, multiple) transistors 111_2 included in switch SWC corresponding to switch SWs2 is larger than at least one gate width W1 of one or more (here, multiple) transistors 111_1 included in switch SWA corresponding to switch SWs1. In other words, gate width W2 of each of one or more transistors included in switch SWs2 (here, the first switch element) in series-arm circuit 12 (here, the first series-arm circuit) is larger than at least one gate width W1 of each of one or more transistors included in switch SWs1 (here, the second switch element) in series-arm circuit 11 (here, the second parallel-arm circuit).

For example, as illustrated in (b) and (c) of FIG. 2A, finger number $N_{F1}$ of switch SWA and finger number $N_{F2}$ of switch SWC are the same, and finger length $L_{F2}$ of switch SWC is longer than finger length $L_{F1}$ of switch SWA.

In this manner, in filter 10 being frequency-tunable through switch SWs1 of series-arm circuit 11 and switch SWs2 of series-arm circuit 12, switches SWs1 and SWs2 are designed as follows. In other words, stack number Ns2 of switch SWs2 in series-arm circuit 12 connected close to the input terminal is designed to be higher than stack number Ns1 of switch SWs1 in series-arm circuit 11. Gate width W2 of switch SWs2 is designed to be larger than gate width W1 of switch SWs1.

Note that in Embodiment 1, a significant structural element of the present disclosure is that the first stack number of the first switch element in the first series-arm circuit connected close to the input terminal is higher than the second stack number of the second switch element in the second series-arm circuit. On the other hand, the gate width of one or more transistor included in first switch element being larger than at least one gate width of one or more transistors included in second switch element is not as significant of an element of the present disclosure.

This makes it possible to ensure electric power resistance in filter 10, while reducing insertion loss within the passband and scaling down filter 10. This will be described with reference to a relationship between stack number Ns and switch characteristics and a relationship between gate width W and the switch characteristics.

Figure 3A:
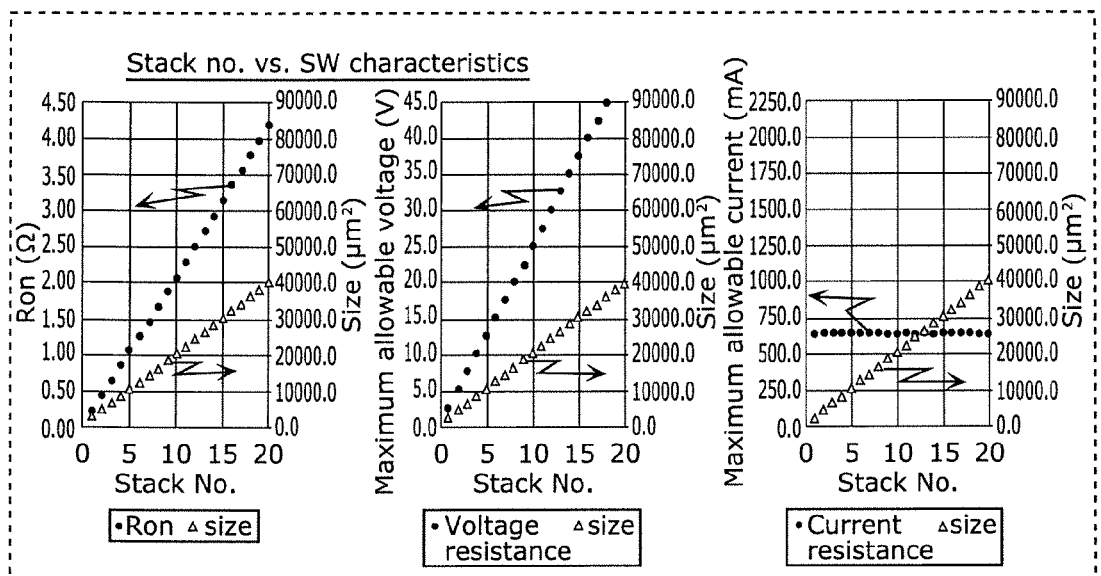
FIG. 3A is a graph showing a relationship between a stack number and switch characteristics of the switch.
Figure 3B:
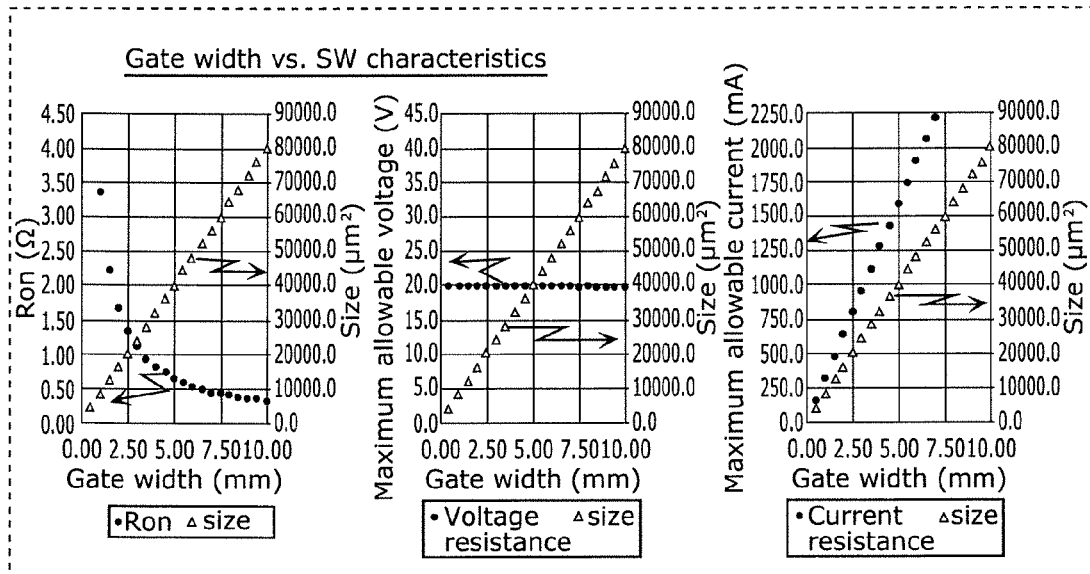
FIG. 3B is a graph showing a relationship between a gate width and the switch characteristics of the switch.

FIG. 3A is a graph showing the relationship between stack number Ns and the switch characteristics of switches SWs1 and SWs2. To be specific, FIG. 3A is a graph expressing the relationship between stack number Ns and the switch characteristics of the switches included in transistor 111 when gate width W is fixed. FIG. 3B is a graph showing the relationship between gate width W and the switch characteristics of switches SWs1 and SWs2 according to Embodiment 1. To be specific, FIG. 3B is a graph showing the relationship between gate width W and the switch characteristics of the switches included in transistor 111 when stack number Ns is fixed.

As illustrated in the left side and center of FIG. 3A, when gate width W is fixed, resistance Ron when the switch is conducting and withstand voltage when the switches are not conducting (maximum allowable voltage when the switches are not conducting) increase with an increase in stack number Ns. As illustrated in the right side of FIG. 3A, when gate width W is fixed, withstand current when the switches are conducting (maximum allowable current when the switches are conducting) is fixed without being dependent on stack number Ns. As illustrated in the left side, center, and right side of FIG. 3A, when gate width W is fixed, a size of the switches increases with an increase in stack number Ns.

As illustrated in the left side of FIG. 3B, when stack number Ns is fixed, resistance Ron when the switches are conducting decreases with an increase in gate width W. As illustrated in the center of FIG. 3B, when stack number Ns is fixed, withstand voltage when the switches are not conducting is fixed without being dependent on gate width W. As illustrated in the right side of FIG. 3B, when stack number Ns is fixed, withstand current when the switches are conducting increases with an increase in gate width W. As illustrated in the left side, center, and right side of FIG. 3B, when stack number Ns is fixed, the size of the switches increases with an increase in gate width W.

Note that withstand voltage of one transistor 111 in which multiple single FETs are connected in parallel is, for example, approximately 2.5 V, withstand current with respect to the gate width is, for example, approximately 318 mA/mm; and are regulated by a material of the gate electrode, a gap between source electrode finger 111$s$ and drain electrode finger 111$d$, and a width of the electrode fingers.

In switches SWs1-SWs4, withstand voltage improves with an increase in stack number Ns of transistor 111, but there is a trade-off relationship in which the size increases along with the resistance increasing when the switches are conducting. Moreover, the resistance when the switches are conducting decreases with an increase in gate width W of transistor 111, but there is a trade-off relationship in which the size increases.

Note that even when gate width W is the same, the resistance when the switches are conducting decreases with a decrease in finger length $L_F$ and an increase in finger number $N_F$. This is caused by a resistance component in a longitudinal direction of the electrode fingers decreasing with a decrease in finger length $L_F$. Therefore, a configuration in which finger length $L_F$ is shortened and the finger number is increased when gate width W is fixed makes it possible to improve withstand current and reduce the resistance when the switches are conducting more compared to a configuration in which finger length $L_F$ is enlarged and the finger number is reduced. Note that when there are multiple semiconductor elements of the at least one semiconductor element included in the switch element, a finger length and finger number of each of the multiple semiconductor elements may differ from one another.

The inventors have gained the following insights from these relationships about the radio-frequency filter being frequency-tunable through series-arm circuits 11 and 12 and switches SWs1 and SWs2.

In other words, a higher voltage is applied when the switches are not conducting to the first switch element in the first series-arm circuit connected closer to the input terminal than to the second switch element in the second series-arm circuit connected closer to the output terminal. In other words, in this case, the first switch element requires high withstand voltage, but the withstand voltage that the second switch element requires is not high. It is, therefore, possible to reduce loss and scale down filter 10 while ensuring withstand voltage, by making the second stack number of the second switch element lower than the first stack number of the first switch element.

More current flows when the switches are conducting to the first switch element in the first series-arm circuit connected closer to the input terminal than to the second switch element in the second series-arm circuit connected closer to the output terminal. In other words, the first switch element requires high withstand current, but the withstand current that the second switch element requires is not high. It is, therefore, possible to ensure withstand current and scale down filter 10, by making the gate width of the first switch element larger than the gate width of the second switch element. Since it is possible to reduce the resistance when the first switch element is conducting, it is possible to reduce loss when the first switch element is conducting.

In the second switch element, compared to the first switch element, the resistance per transistor 111 is high when the second switch element is conducting due to the gate width being small, but the stack number is low. This makes it possible to reduce the resistance of the entire second switch element when the second switch element is conducting, the resistance being expressed with a multiplication value of the resistance per transistor 111 when the second switch element is conducting and the stack number. Accordingly, it is possible to reduce loss when the second switch element is conducting.

Note that hereinafter, the voltage applied to the switches may also be referred to as "voltage across the switch" or "voltage across the switch element".

3) Relationship Between Voltage Across Switch Element and Switch Element Structure Magnitudes of voltage Vs1 across switch SWs1 and voltage Vs2 across switch SWs2 are proportional to an amount of high-frequency electric power applied to filter 10. Especially when switches SWs1 and SWs2 are not conducting, voltages Vs1 and Vs2 increase since impedances of switches SWs1 and SWs2 increase.

In regular switches, multiple semiconductor elements are stacked (connected in series) and the voltage applied to each semiconductor element is divided. However, a resistance when the switch element is conducting increases along with the stack number and size increasing.

In other words, electric power resistance of the filter improves upon increasing the stack number of semiconductor elements, but since the resistance and the size increases when the switch element is conducting, insertion loss within the passband when the switch element is conducting worsens. However, electric power resistance of the filter worsens upon reducing the stack number of semiconductor elements, but since it is possible to reduce the resistance when the switch element is conducting along with scaling down the filter, insertion loss within the passband decreases when the switch element is conducting. In other words, adjusting the stack number of semiconductor elements included in the switch elements leads to a trade-off relationship between (i) electric power resistance and (ii) the size and insertion loss within the passband of the filter.

From the above standpoint, the filter has the problem of the size increasing and insertion loss within the passband worsening when the stack numbers of the switch elements in each series-arm circuit are the same in order to realize the electric power resistance that the radio-frequency filter being frequency-tunable requires.

In filter 10 according to Embodiment 1, the magnitude of voltage Vs1 across switch SWs1 is dependent on the amount of applied electric power and from which of input/output terminals 101 and 102 high-frequency electric power is applied (application direction of high-frequency electric power). The magnitude of voltage Vs2 across switch SWs2 is, similarly, dependent on the application direction of the above high-frequency electric power and the amount of applied electric power. For example, when high-frequency electric power is applied from the side of input/output terminal 102, a high-frequency applied voltage caused by applying the high-frequency electric power increases with proximity to input/output terminal 102. In other words, the high-frequency applied voltage is higher in series-arm circuit 12 than in series-arm circuit 11 when high-frequency electric power is applied from the side of input/output terminal 102.

For example, in a configuration in which input/output terminal 102 is the input terminal to which the high-frequency signal is inputted, stack number Ns1 is lower than stack number Ns2 since voltage Vs1 across switch SWs1 is lower than voltage Vs2 across switch SWs2.

With this, in filter 10, in order to ensure withstand voltage of the switch elements with respect to high-frequency input electric power, stack number Ns1 of switch SWs1 is, for example, lower than stack number Ns2 of switch SWs2 compared to when each switch element has the same configuration, i.e., the same stack number. As such, it is possible to reduce stack number Ns1 and scale down the radio-frequency filter more than with a radio-frequency filter being frequency-tunable in which each switch element has the same stack number. Since it is possible to reduce resistance when switch SWs1 is conducting by relatively reducing stack number Ns1 of switch SWs1, it is possible to reduce insertion loss within the passband of filter 10 when switch SWs1 is conducting. On the other hand, it is possible to ensure the electric power resistance of filter 10 due to stack number Ns2 of switch SWs2, across which a voltage is relatively high, being higher than stack number Ns1 of switch SWs1. In other words, it is possible to ensure electric power resistance while reducing loss when the switches of series-arm circuits 11 and 12 are conducting, and scaling down the filter.

4) Examples 1-3 and Comparative Example 1

Embodiment 1 described above makes it possible to ensure electric power resistance while reducing insertion loss within the passband and scaling down filter 10 being frequency-tunable. Hereinafter, these advantageous effects will be described with reference to examples (Examples 1-3) and comparison to a comparative example thereof (Comparative Example 1). Note that a filter according to Comparative Example 1 has the same configuration as the filter according to Examples 1-3 except that design parameters differ from one another.

Figure 4:
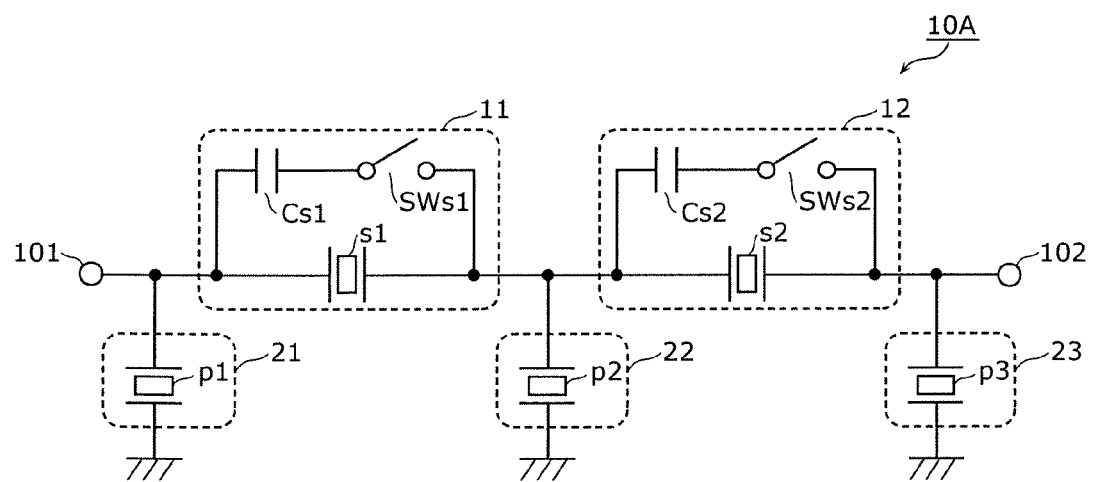
FIG. 4 is a circuit configuration diagram of a filter according to Examples 1 to 3 and Comparative Example 1.

FIG. 4 is a circuit configuration diagram of filter 10A according to Examples 1 to 3 and Comparative Example 1. Filter 10A shown in the drawing differs from filter 10 according to Embodiment 1 in that a number of parallel-arm circuits differs. Hereinafter, descriptions of filter 10A according to Examples 1-3 that are the same as filter 10 according to Embodiment 1 will be omitted and differences will be mainly described.

As illustrated in FIG. 4, filter 10A includes series-arm circuits 11 and 12; parallel-arm circuits 21, 22, and 23; and input/output terminals 101 and 102.

Parallel-arm circuits 21-23 are each connected to the ground and a node on a path that connects input/output terminal 101 and input/output terminal 102. To be specific, parallel-arm circuit 21 is connected to the ground and a node on the path between input/output terminal 101 and series-arm circuit 11. Parallel-arm circuit 22 is connected to the ground and a node on the path between series-arm circuit 11 and series-arm circuit 12. Parallel-arm circuit 23 is connected to the ground and a node on the path between input/output terminal 102 and series-arm circuit 12. Parallel-arm circuits 21, 22, and 23 respectively include parallel-arm resonators p1, p2, and p3.

In filter 10A, a passband is configured through the resonant frequencies of series-arm circuits 11 and 12, and an attenuation pole is configured through the antiresonant frequencies of series-arm circuits 11 and 12. In series-arm circuit 11, series-arm resonator s1 is connected in parallel to the circuit constituted by capacitor Cs1 and switch SWs1 connected in series. In series-arm circuit 12, series-arm resonator s2 is connected in parallel to a circuit constituted by capacitor Cs2 and switch SWs2 connected in series. By switching between conduction and non-conduction of switches SWs1 and SWs2 in accordance with a control signal from the controller (not illustrated) such as an RFIC, the impedances of series-arm circuits 11 and 12 are changed, i.e., the antiresonant frequencies of series-arm circuits 11 and 12 are changed. With this, a frequency of the attenuation pole of filter 10A is changed. When switches SWs1 and SWs2 are not conducting, series-arm circuit 11 substantially has the same resonance characteristics as series-arm resonator s1 since the circuit that is constituted by capacitor Cs1 and switch SWs1 connected in series does not function, and series-arm circuit 12 substantially has the same resonance characteristics as series-arm resonator s2 since the circuit that is constituted by capacitor Cs2 and switch SWs2 connected in series does not function. However, when switches SWs1 and SWs2 are conducting, the antiresonant frequency of series-arm circuit 11 is lower than the antiresonant frequency of series-arm resonator s1 since series-arm circuit 11 becomes a circuit that is constituted by series-arm resonator s1 and capacitor Cs1 connected in parallel, and the antiresonant frequency of series-arm circuit 12 is lower than the antiresonant frequency of series-arm resonator s2 since series-arm circuit 12 becomes a circuit that is constituted by series-arm resonator s2 and capacitor Cs2 connected in parallel.

In filter 10A according to the present example, since each series-arm resonator (s1, s2) is connected in parallel to the series circuits of the capacitors (Cs1, Cs2) and the switches (SWs1, SWs2), the antiresonant frequency of each series-arm circuit (11, 12) is changed to the high side (Faon⇒Faoff) by switching switches SWs1 and SWs2 from conduction to non-conduction. Since the frequency of the attenuation pole of filter 10A is regulated by the resonant frequencies and the antiresonant frequencies of series-arm circuits 11 and 12, and the resonant frequencies and the antiresonant frequencies of parallel-arm circuits 21-23; the passband and the attenuation band of filter 10A become tunable by switching between conduction and non-conduction of switches SWs1 and SWs2.

The filters according to Examples 1-3 and Comparative Example 1 are radio-frequency filters that are capable of switching between (i) first filter characteristics in which Band 27-Tx (807-824 MHz) is a first passband and Band 27-Rx (852-869 MHz) is a first attenuation band, and (ii) second filter characteristics in which Band 26-Tx (814-849 MHz) is a second passband and Band 26-Rx (859-894 MHz) is a second attenuation band, by switching between conduction and non-conduction of switches SWs1 and SWs2. In other words, these filters are radio-frequency filters being frequency-tunable (tunable filter) that are capable of switching between being a transmission filter compatible with Band 27 and a transmission filter compatible with Band 26, by switching between the conduction and non-conduction of switches SWs1 and SWs2.

In any one of Examples 1-3 and Comparative Example 1, switches SWs1 and SWs2 are designed to ensure withstand current and withstand voltage for switches SWs1 and SWs2 when +36 dBm of high-frequency electric power is applied to either input/output terminal 101 or 102. Hereinafter, designs of switches SWs1 and SWs2 in Examples 1-3 and Comparative Example 1 will be concretely described.

4.1) Comparative Example 1

In Comparative Example 1, the stack numbers of switches SWs1 and SWs2 are configured to be equal taking into consideration a maximum voltage of a switch among switches SWs1 and SWs2 to which the highest voltage is applied. The gate widths of switches SWs1 and SWs2 are configured to be equal taking into consideration a maximum current of a switch among switches SWs1 and SWs2 to which the most current flows. Note that in Comparative Example 1, input/output terminal 101 is the input terminal to which the high-frequency signal is inputted.

Table 1 shows the design parameters of the filter according to Comparative Example 1, a maximum current flowing to the switches (peak current: referred to as "switch current Is_max"), and a maximum voltage applied to the switches (peak voltage: referred to as "switch voltage Vs_max"). In this table, (i) gate width WF and stack number Ns of the switch in the series-arm circuit, and (ii) resonant frequency Fr and antiresonant frequency Fa when the switch is conducting and not conducting are shown as the design parameters. In this table, the maximum current flowing to the switches (peak current: referred to as "switch current Is_max") and the maximum voltage applied to the switches (peak voltage: referred to as "switch voltage Vs_max") when the switch in the series-arm circuit is conducting and not conducting are shown. Furthermore, in this table, (i) a greatest one among each switch current Is_max and a greatest one among each switch voltage Vs_max when the switches are conducting and not conducting, and (ii) resistance Ron when the switches are conducting are shown. The same applies to subsequent tables. Table 2 shows an allowable input current, an allowable input voltage, and a size of each switch of the filter according to Comparative Example 1, and total sums thereof. Table 3 shows insertion loss within the passband of the filter according to Comparative Example 1.

Figure 5:
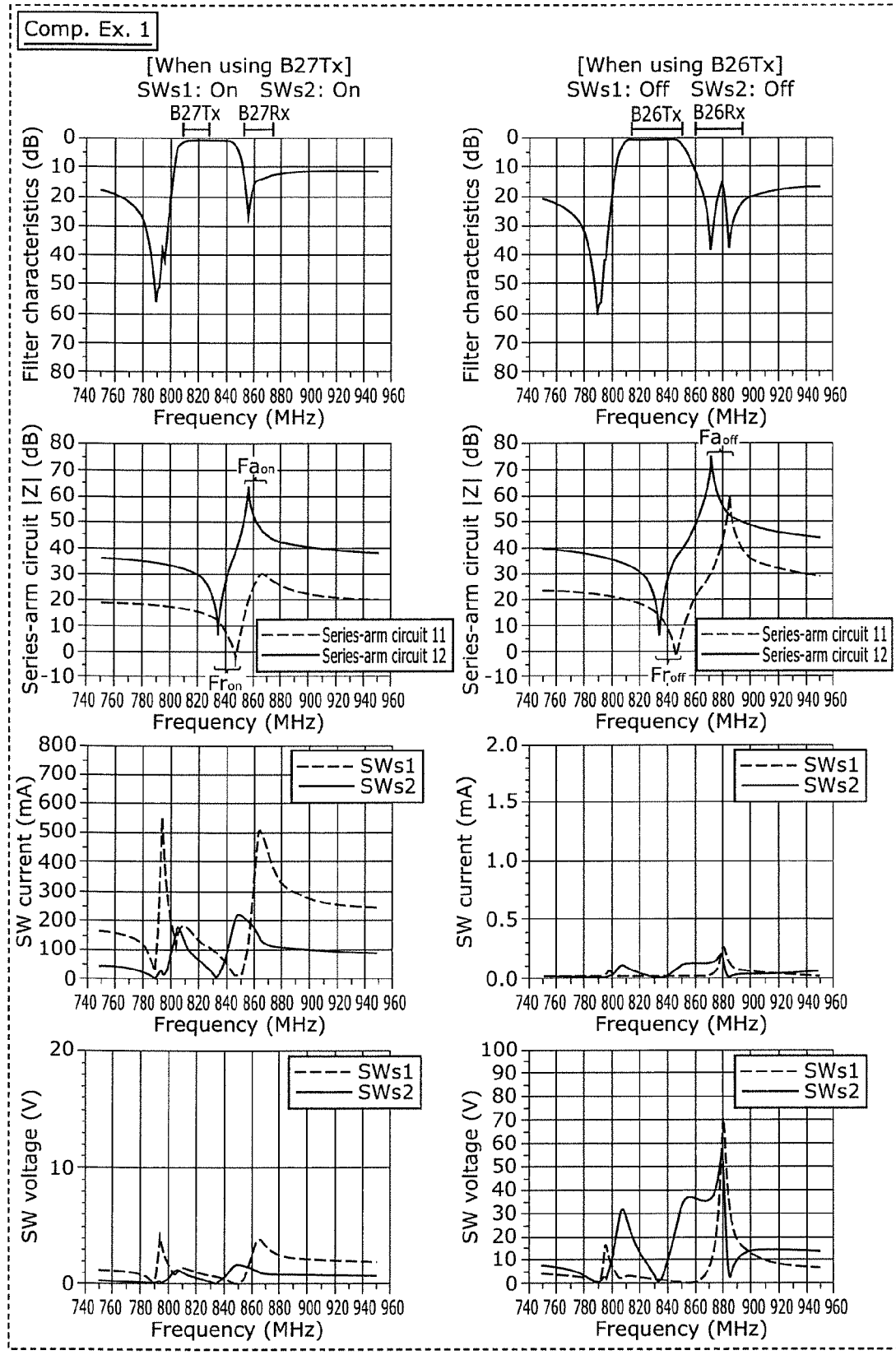
FIG. 5 is a graph showing various characteristics regarding the filter according to Comparative Example 1.

FIG. 5 is a graph showing various characteristics regarding the filter according to Comparative Example 1. To be specific, in the drawing, pass characteristics of the filter are shown on the first row from the top (hereafter referred to as "first row"). Impedance characteristics of series-arm circuits 11 and 12 are shown on the second row from the top (hereafter referred to as "second row"). Characteristics of the current flowing to the switches (switch current characteristics) are shown on the third row from the top (hereafter referred to as "third row"). Characteristics of the voltage applied to the switches (switch voltage characteristics) are shown on the fourth row from the top (hereafter referred to as "fourth row"). In the left column, the various characteristics regarding the filter of the first filter characteristics in which Band 27-Tx is the first passband and Band 27-Rx is the first attenuation band when switches SWs1 and SWs2 are conducting are shown. In the right column, various characteristics regarding the filter of the second filter characteristics in which Band 26-Tx is the second passband and Band 26-Rx is the second attenuation band when switches SWs1 and SWs2 are not conducting are shown. The same applies to subsequent graphs showing various characteristics regarding the filter.

TABLE 1

| Comp. Ex. 1 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 1.80 | 29 | On | 846.5 | 866.1 | 556 | 4.1 | 556 | 71.96 | 6.74 |
| | | | Off | 846.6 | 884.7 | 0 | 72.0 | | | |
| Series-arm circuit 12 | 1.80 | 29 | On | 834.1 | 856.0 | 219 | 1.6 | 219 | 58.20 | 6.74 |
| | | | Off | 834.1 | 871.6 | 0 | 58.2 | | | |

TABLE 2

| Comp. Ex. 1 | Allowable input current (mA) | Allowable input Voltage (V) | Size (μm²) |
|---|---|---|---|
| Switch SWs1 | 572 | 72.5 | 52200 |
| Switch SWs2 | 572 | 72.5 | 52200 |
| Total | 1144 | 145.0 | 104400 |

TABLE 3

| | Comp. Ex. 1 | IL@B27Tx (dB) | IL@B26Tx (dB) |
|---|---|---|---|
| Filter characteristics | SWs1, SWs2 On | 1.690 | — |
| | SWs1, SWs2 Off | — | 1.505 |

4.2) Example 1

In Example 1, the stack numbers of the semiconductor elements included in switches SWs1 and SWs2 are configured individually taking into consideration the voltage applied to switches SWs1 and SWs2, and specifically satisfy the following relationships. Note that the gate widths of the semiconductor elements included in switches SWs1 and SWs2 are configured to be equal taking into consideration the maximum current flowing to switches SWs1 and SWs2.

Stack number of switch SWs1>stack number of switch SWs2

Gate width of switch SWs1=gate width of switch SWs2

Note that in Example 1, input/output terminal 101 is the input terminal to which the high-frequency signal is inputted. In other words, switch SWs1 connected close to input/output terminal 101 (input terminal) is the first switch element and switch SWs2 connected close to input/output terminal 102 (output terminal) is the second switch element.

Table 4 shows design parameters and the like of the filter according to Example 1. Table 5 shows an allowable input current, an allowable input voltage, and a size of each switch of the filter according to Example 1, and total sums thereof. Table 6 shows insertion loss within the passband of the filter according to Example 1.

Figure 6:
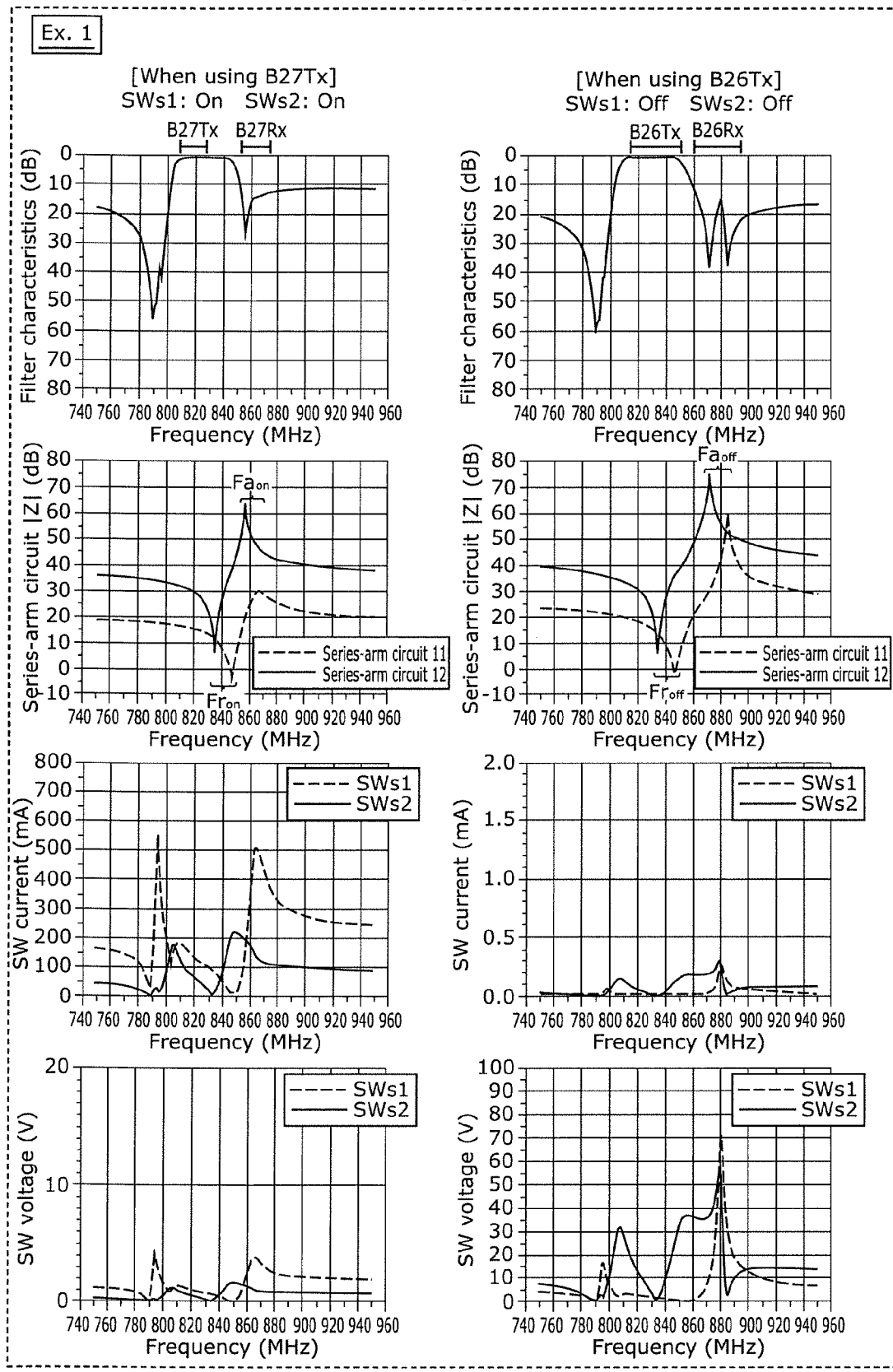
FIG. 6 is a graph showing various characteristics regarding the filter according to Example 1.

FIG. 6 is a graph showing various characteristics regarding the filter according to Example 1.

TABLE 4

| Ex. 1 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 1.80 | 29 | On | 846.5 | 866.1 | 556 | 4.1 | 556 | 71.96 | 6.74 |
|  |  |  | Off | 846.6 | 884.7 | 0 | 72.0 |  |  |  |
| Series-arm circuit 12 | 1.80 | 24 | On | 834.1 | 856.0 | 219 | 1.6 | 219 | 58.17 | 5.58 |
|  |  |  | Off | 834.1 | 871.6 | 0 | 58.2 |  |  |  |

TABLE 5

| Ex. 1 | Allowable input current (mA) | Allowable input voltage (V) | Size (µm²) |
|---|---|---|---|
| Switch SWs1 | 572 | 72.5 | 52200 |
| Switch SWs2 | 572 | 60.0 | 43200 |
| Total | 1144 | 132.5 | 95400 |

TABLE 6

| Ex | 1 | IL@B27Tx (dB) | IL@B26Tx (dB) |
|---|---|---|---|
| Filter characteristics | SWs1, SWs2 On | 1.669 | — |
|  | SWs1, SWs2 Off | — | 1.506 |

4.3) Example 2

In Example 2, the stack numbers of the semiconductor elements included in switches SWs1 and SWs2 are configured individually taking into consideration the voltage applied to switches SWs1 and SWs2. The gate widths of the semiconductor elements included in switches SWs1 and SWs2 are configured individually taking into consideration the current flowing to switches SWs1 and SWs2, and specifically satisfy the following relationships.

Stack number of switch SWs1>stack number of switch SWs2

Gate width of switch SWs1>gate width of switch SWs2

Note that in Example 2, input/output terminal 101 is the input terminal to which the high-frequency signal is inputted. In other words, switch SWs1 connected close to input/output terminal 101 (input terminal) is the first switch element and switch SWs2 connected close to input/output terminal 102 (output terminal) is the second switch element.

Table 7 shows design parameters and the like of the filter according to Example 2. Table 8 shows an allowable input current, an allowable input voltage, and a size of each switch of the filter according to Example 2, and total sums thereof. Table 9 shows insertion loss within the passband of the filter according to Example 2.

Figure 7:
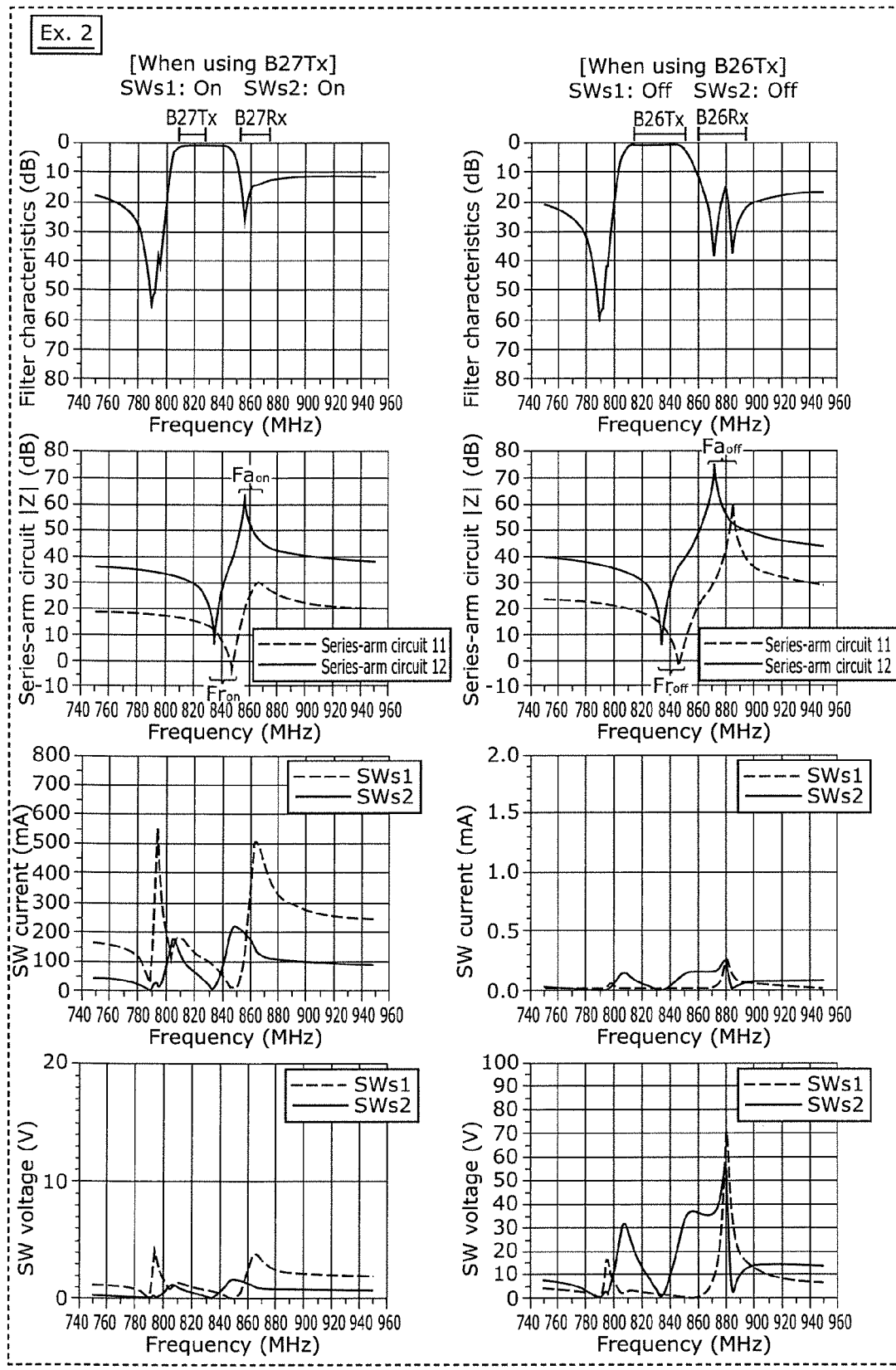
FIG. 7 is a graph showing various characteristics regarding the filter according to Example 2.

FIG. 7 is a graph showing various characteristics regarding the filter according to Example 2.

TABLE 7

| Ex. 2 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 1.80 | 29 | On | 846.5 | 866.1 | 556 | 4.1 | 556 | 71.96 | 6.74 |
|  |  |  | Off | 846.6 | 884.7 | 0 | 72.0 |  |  |  |
| Series-arm circuit 12 | 1.50 | 24 | On | 834.1 | 856.0 | 219 | 1.6 | 219 | 58.17 | 6.70 |
|  |  |  | Off | 834.1 | 871.6 | 0 | 58.2 |  |  |  |

TABLE 8

| Ex. 2 | Allowable input current (mA) | Allowable input voltage (V) | Size (µm²) |
|---|---|---|---|
| Switch SWs1 | 572 | 72.5 | 52200 |
| Switch SWs2 | 477 | 60.0 | 36000 |
| Total | 1049 | 132.5 | 88200 |

TABLE 9

| Ex. 2 | | IL@B27Tx (dB) | IL@B26Tx (dB) |
|---|---|---|---|
| Filter characteristics | SWs1, SWs2 On | 1.688 | — |
|  | SWs1, SWs2 Off | — | 1.506 |

4.4) Example 3

In Example 3, the stack numbers of the semiconductor elements included in switches SWs1 and SWs2 are configured individually taking into consideration the voltage applied to switches SWs1 and SWs2. The gate widths of the semiconductor elements included in switches SWs1 and SWs2 are configured individually taking into consideration the current flowing to switches SWs1 and SWs2, and specifically satisfy the following relationships.

Stack number of switch SWs2>stack number of switch SWs1

Gate width of switch SWs2>gate width of switch SWs1

Note that in Example 3, input/output terminal 102 is the input terminal to which the high-frequency signal is inputted. In other words, switch SWs2 connected close to input/output terminal 102 (input terminal) is the first switch element and switch SWs1 connected close to input/output terminal 101 (output terminal) is the second switch element.

Table 10 shows design parameters and the like of the filter according to Example 3. Table 11 shows an allowable input current, an allowable input voltage, and a size of each switch of the filter according to Example 3, and total sums thereof. Table 12 shows insertion loss within the passband of the filter according to Example 3.

Figure 8:
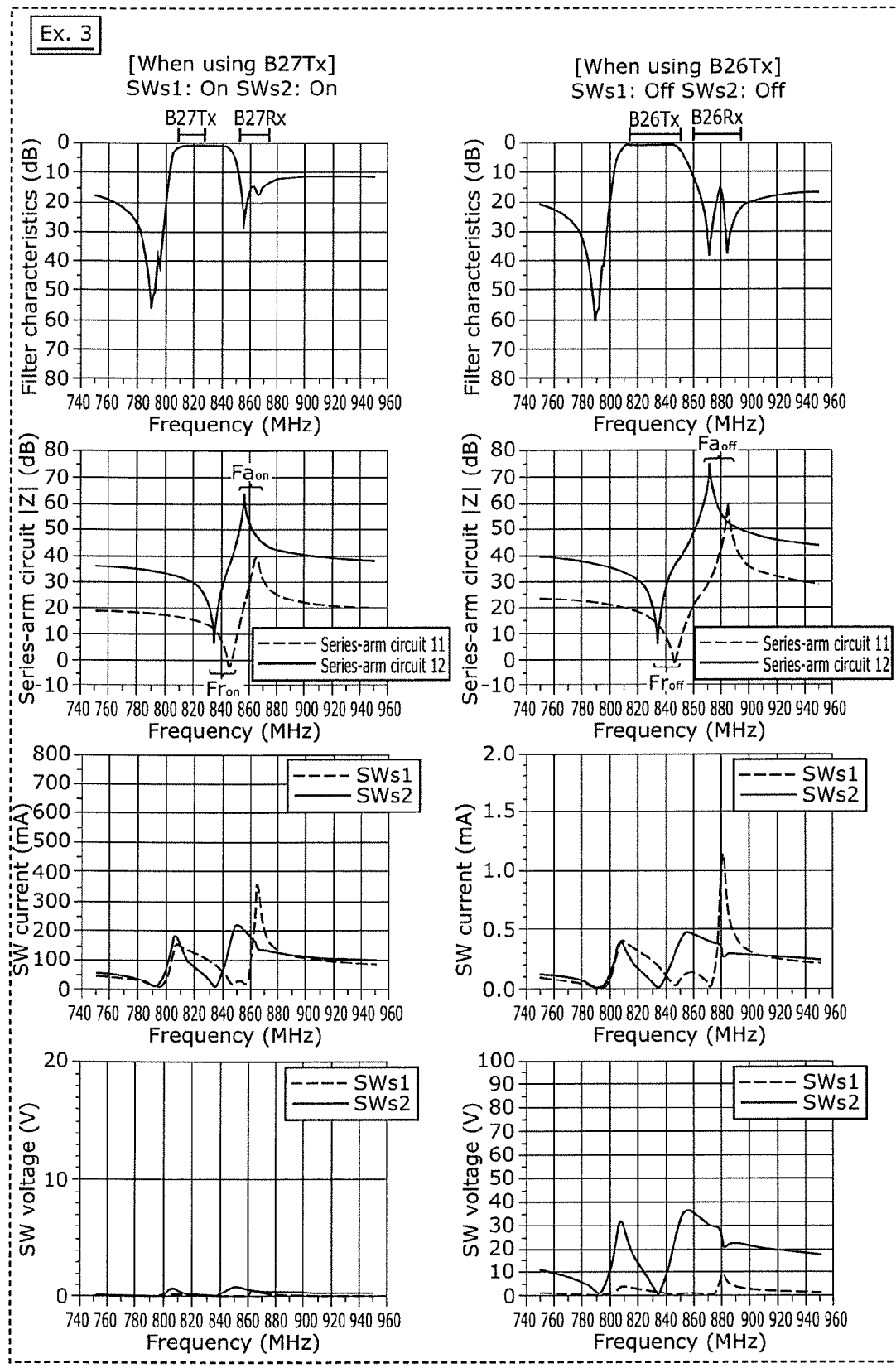
FIG. 8 is a graph showing various characteristics regarding the filter according to Example 3.

FIG. 8 is a graph showing various characteristics regarding the filter according to Example 3.

TABLE 10

| Ex. 3 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 1.10 | 4 | On | 846.5 | 865.2 | 360 | 0.6 | 360 | 9.91 | 1.52 |
| | | | Off | 846.6 | 884.7 | 1 | 9.9 | | | |
| Series-arm circuit 12 | 1.30 | 15 | On | 834.1 | 856.0 | 220 | 0.8 | 220 | 36.76 | 4.83 |
| | | | Off | 834.1 | 871.6 | 0 | 36.8 | | | |

TABLE 11

| Ex. 3 | Allowable input current (mA) | Allowable input voltage (V) | Size (μm²) |
|---|---|---|---|
| Switch SWs1 | 350 | 10.0 | 4400 |
| Switch SWs2 | 413 | 37.5 | 19500 |
| Total | 763 | 47.5 | 23900 |

TABLE 12

| Ex. 3 | | IL@B27Tx (dB) | IL@B26Tx (dB) |
|---|---|---|---|
| Filter characteristics | SWs1, SWs2 On | 1.536 | — |
| | SWs1, SWs2 Off | — | 1.509 |

4.5) Comparison of Examples 1-3 with Comparative Example 1

As illustrated in FIG. 5 to FIG. 8, table 1, table 4, table 7, and table 10, the resonance characteristics (resonant frequencies and antiresonant frequencies) of series-arm circuits 11 and 12 are substantially the same in the filters according to Comparative Example 1 and Examples 1-3. As illustrated in the first row of FIG. 5 to FIG. 8, these filters are capable of switching between the first filter characteristics compatible with Band 27 and the second filter characteristics compatible with Band 26.

To be specific, in series-arm circuits 11 and 12, the impedances of switches SWs1 and SWs2 are exceedingly high (ideally limitless) when switches SWs1 and SWs2 are not conducting, and characteristics of series-arm resonators s1 and s2 become dominant. As such, in this case, characteristics of series-arm circuits 11 and 12 shown in the right column of the second row in FIG. 5 to FIG. 8 are respectively substantially the same as characteristics of series-arm resonators s1 and s2. In other words, the antiresonant frequencies of series-arm circuits 11 and 12 in this case ("$Fa_{off}$" in the drawings) are respectively substantially the same as antiresonant frequencies of series-arm resonators s1 and s2.

On the other hand, the impedances of switches SWs1 and SWs2 are exceedingly low (ideally zero) when switches SWs1 and SWs2 are conducting, and series-arm circuits 11 and 12 become circuits that constitute the series-arm resonators (s1, s2) and the capacitors (Cs1, Cs2) connected in parallel. In this case, as illustrated in the left column of the second row in FIG. 5 to FIG. 8, the antiresonant frequencies of the series-arm circuits (11, 12) ("$Fa_{on}$" in the drawings) are respectively changed more toward the low frequency side than the antiresonant frequencies of the series-arm resonators (s1, s2).

Accordingly, by switching between conduction and non-conduction of switches SWs1 and SWs2, it is possible to change the frequency of the attenuation pole at the high side of the passband, and it is possible to switch between the first filter characteristics and the second filter characteristics.

Upon comparing Example 1 with Comparative Example 1, in Example 1, the stack number (second stack number) of switch SWs2 (second switch element) is lower than the stack number (first stack number) of switch SWs1 (first switch element). Example 1 makes it possible to reduce insertion loss within the passband (1.669 dB: Example 1 (see table 6), 1.690 dB: Comparative Example 1 (see table 3)) when switches SWs1 and SWs2 are conducting (i.e., when using Band 27-Tx), while reducing a total size of switches SWs1 and SWs2 more than Comparative Example 1 (95400 pmt: Example 1 (see table 5), 104400 pmt: Comparative Example 1 (see table 2)).

Upon comparing Example 2 with Comparative Example 1, in Example 2, the stack number (second stack number) of switch SWs2 (second switch element) is lower than the stack number (first stack number) of switch SWs1 (first switch element), and the gate width of switch SWs2 is smaller than the gate width of switch SWs1. Example 2 makes it possible to reduce insertion loss within the passband (1.688 dB: Example 2 (see table 9), 1.690 dB: Comparative Example 1 (see table 3)) when switches SWs1 and SWs2 are conducting (i.e., when using Band27-Tx), while reducing the total size of switches SWs1 and SWs2 more than Comparative Example 1 (88200 pmt: Example 2 (see table 8), 104400 μm²: Comparative Example 1 (see table 2)).

Upon comparing Example 3 with Comparative Example 1, in Example 3, the stack number (second stack number) of switch SWs1 (second switch element) is lower than the stack number (first stack number) of switch SWs2 (first switch element), and the gate width of switch SWs1 is smaller than the gate width of switch SWs2. The antiresonant frequency of series-arm resonator s2 (first series-arm resonator) in series-arm circuit 12 (first series-arm circuit) connected close to input/output terminal 102 (input terminal) is lower than the antiresonant frequency of series-arm resonator s1 (second series-arm resonator) in series-arm circuit 11 (second series-arm circuit) connected close to input/output terminal 101 (output terminal). Note that in Comparative Example 1 and Examples 1 and 2, the antiresonant frequency of series-arm resonator s1 (first series-arm resonator) in series-arm circuit 11 (first series-arm circuit) connected close to input/output terminal 101 (input terminal) is higher than the antiresonant frequency of series-arm resonator s2 (second series-arm resonator) in series-arm circuit 12 (second series-arm circuit) connected close to input/output terminal 102 (output terminal). Example 3 makes it possible to further reduce insertion loss within the passband (1.536 dB: Example 3 (see table 12), 1.690 dB: Comparative Example 1 (see table 3)) when switches SWs1 and SWs2 are conducting (i.e., when using Band 27-Tx), while reducing the total size of switches SWs1 and SWs2 more than Comparative Example 1 (23900 pmt: Example 3 (see table 11), 104400 pmt: Comparative Example 1 (see table 2)).

To be specific, in Comparative Example 1, switch SWs2 is also designed taking into consideration switch SWs1 in which the switch voltage is at a maximum and the switch current is also at a maximum. In other words, switches SWs1 and SWs2 are each designed to have a high stack number and a large gate width. Thus, the resistance per semiconductor element included in switches SWs1 and SWs2 is low, but since the stack number is high, resistance Ron when switches SWs1 and SWs2 are conducting increases to 6.74Ω. In Comparative Example 1, since switches SWs1 and SWs2 each have a high stack number and a large gate width, the total size of switches SWs1 and SWs2 is also large.

In Example 1, however, resistance Ron when the switch SWs1 is conducting increases to 6.74Ω since switch SWs1, in which the switch voltage is at a maximum and the switch current is also at a maximum, is designed to have a high stack number and a large gate width. However, the switch voltage of switch SWs2 is lower than the switch voltage of switch SWs1. As such, it is possible to reduce the stack number of switch SWs2 more than the stack number of switch SWs1.

As such, in Example 1, it is possible to reduce resistance Ron when switch SWs2 is conducting more than in Comparative Example 1 to 5.58Ω. In other words, it is possible to reduce insertion loss within the passband when switches SWs1 and SWs2 are conducting (i.e., when using Band 27-Tx). Since it is possible to reduce the stack number of switch SWs2, it is also possible to reduce the total size of switches SWs1 and SWs2.

In Example 2, the gate width of switch SWs2 is smaller than in Example 1. Therefore, resistance Ron when switch SWs2 is conducting is 6.70Ω and not too different (i.e., loss insertion within the passband is not too different) from that of switch SWs1, but it is possible to further reduce the total size of switches SWs1 and SWs2.

In Example 3, since the switch voltages and the switch currents of switches SWs1 and SWs2 are lower on the whole than in Example 2, it is possible to reduce the stack numbers and the gate widths of switches SWs1 and SWs2. This is to further make the antiresonant frequency of series-arm resonator s2 (first series-arm resonator) in series-arm circuit 12 (first series-arm circuit) connected close to input/output terminal 102 (input terminal) lower than the antiresonant frequency of series-arm resonator s1 (second series-arm resonator) in series-arm circuit 11 (second series-arm circuit) connected close to input/output terminal 101 (output terminal).

It is, therefore, possible in Example 3 to reduce resistance Ron when switch SWs1 is conducting more than in Example 2 to 1.52Ω, and to reduce resistance Ron of when switch SWs2 is conducting more than in Example 2 to 4.83Ω. In other words, it is possible to further reduce insertion loss within the passband when switches SWs1 and SWs2 are conducting (i.e., when using Band 27-Tx). Since it is possible to reduce the stack numbers and the gate widths of switches SWs1 and SWs2, it is also possible to further reduce the total size of switches SWs1 and SWs2.

5) Example 4 and Comparative Example 2

Note that a number of the series-arm circuits and a number of the parallel-arm circuits in the filter are not limited to the configuration of filter 10A shown in FIG. 4. The filter may, for example, have a ladder filter structure including the first series-arm circuit, the second series-arm circuit, the third series-arm circuit, the first parallel-arm circuit, and the second parallel-arm circuit. The third series-arm circuit is disposed between the first series-arm circuit and the second series-arm circuit on the path that connects the input terminal and the output terminal. The first parallel-arm circuit is connected to the ground and a node on the path between the first series-arm circuit and the third series-arm circuit. The second parallel-arm circuit is connected to the ground and a node on the path between the second series-arm circuit and the third series-arm circuit. Hereinafter, a filter with a configuration different from the configuration of filter 10A will be described with reference to Example 4 and comparison to Comparative Example 2. Note that a filter according to Comparative Example 2 has the same configuration as the filter according to Example 4 except that design parameters differ from each other.

Figure 9:
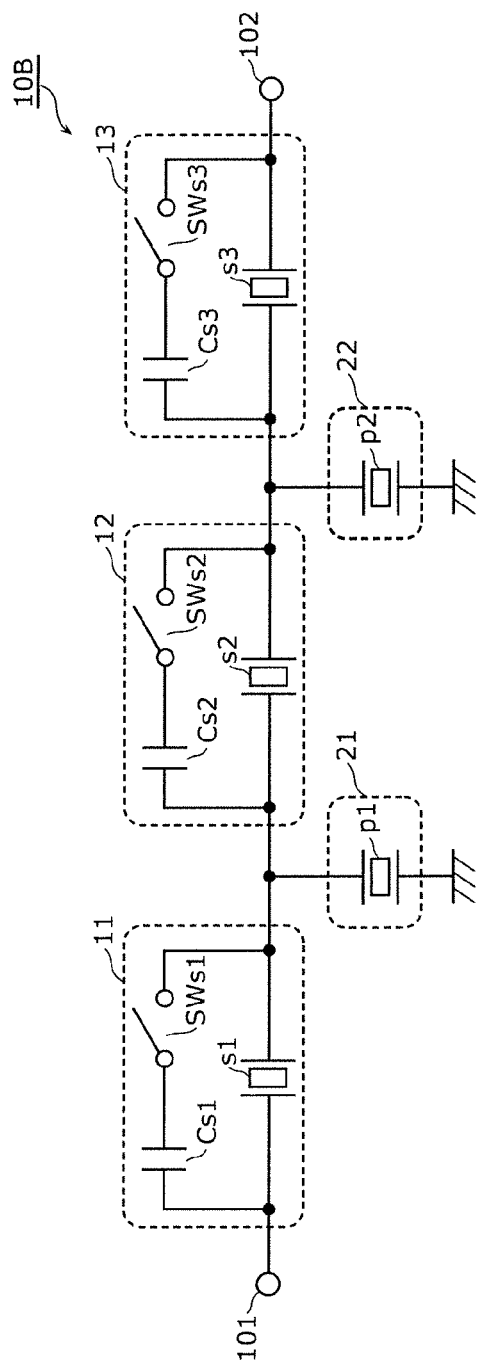
FIG. 9 is a circuit configuration diagram of a filter according to Examples 4 and Comparative Example 2.

FIG. 9 is a circuit configuration diagram of filter 10B according to Example 4 and Comparative Example 2. Filter 10B shown in the drawing differs from filter 10A according to Examples 1-3 in that the number of series-arm circuits and the number parallel-arm circuits differ. Hereinafter, descriptions of filter 10B according to Example 4 that are the same as filter 10 according to Embodiment 1 will be omitted and differences will be mainly described.

As illustrated in FIG. 9, filter 10B includes series-arm circuits 11, 12, and 13; parallel-arm circuits 21 and 22; and input/output terminals 101 and 102.

Series-arm circuit 11 is disposed on the path that connects input/output terminal 101 and input/output terminal 102. Series-arm circuit 13 is disposed closer to input/output terminal 102 than the path-shaped series-arm circuit 11 is. Series-arm circuit 12 is the series-arm circuit that is disposed on the path between series-arm circuit 11 and series-arm circuit 13.

Parallel-arm circuit 21 is connected to the ground and a node on the path between series-arm circuit 11 and series-arm circuit 12. Parallel-arm circuit 22 is connected to the ground and a node on the path between series-arm circuit 13 and series-arm circuit 12. Parallel-arm circuits 21 and 22 respectively include parallel-arm resonators p1 and p2.

In Example 4, input/output terminal 101 is the output terminal from which the high-frequency signal is outputted and input/output terminal 102 is the input terminal to which the high-frequency signal is inputted. In this case, series-arm circuit 11 is also referred to as the second series-arm circuit, series-arm circuit 13 as the first series-arm circuit, parallel-arm circuit 21 as the second parallel-arm circuit, and parallel-arm circuit 22 as the first parallel-arm circuit.

Series-arm circuit 13 includes series-arm resonator s3, capacitor Cs3, and switch SWs3. Switch SWs3 is a switch element that is (i) connected in series to capacitor Cs3 and (ii) includes one or more semiconductor elements connected in series. In Example 4, input/output terminal 101 is the output terminal from which the high-frequency signal is outputted and input/output terminal 102 is the input terminal to which the high-frequency signal is inputted; series-arm resonator s1, capacitor Cs1, and switch SWs1 are also respectively referred to as the second series-arm resonator, the second capacitor, and the second switch element; and series-arm resonator s3, capacitor Cs3, and switch SWs3 are also respectively referred to as the first series-arm resonator, the first capacitor, and the first switch element. In Example 4, series-arm resonator s2, capacitor Cs2, and switch SWs2 are also respectively referred to as the third series-arm resonator, the third capacitor, and the third switch element.

Note that since series-arm circuit 13 has the same configuration as series-arm circuits 11 and 12 except that series-arm circuit 13 has a different circuit constant, detailed description thereof is omitted.

In filter 10B, a passband is configured through the resonant frequencies of series-arm circuits 11-13 and an attenuation pole is configured through the antiresonant frequencies of series-arm circuits 11-13. In series-arm circuit 11, series-arm resonator s1 is connected in parallel to the circuit constituted by capacitor Cs1 and switch SWs1 connected in series. In series-arm circuit 12, series-arm resonator s2 is connected in parallel to the circuit constituted by capacitor Cs2 and switch SWs2 connected in series. In series-arm circuit 13, series-arm resonator s3 is connected in parallel to a circuit constituted by capacitor Cs3 and switch SWs3 connected in series. By switching between conduction and non-conduction of switches SWs1-SWs3 in accordance with a control signal from the controller (not illustrated) such as an RFIC, the impedances of series-arm circuits 11-13 are changed, i.e., the antiresonant frequencies of series-arm circuits 11-13 are changed. With this, a frequency of the attenuation pole of filter 10B is changed. When switches SWs1-SWs3 are not conducting, series-arm circuit 11 substantially has the same resonance characteristics as series-arm resonator s1 since the circuit that is constituted by capacitor Cs1 and switch SWs1 connected in series does not function, series-arm circuit substantially has the same resonance characteristics as series-arm resonator s2 since the circuit that is constituted by capacitor Cs2 and switch SWs2 connected in series does not function, and series-arm circuit 13 substantially has the same resonance characteristics as series-arm resonator s3 since a circuit that is constituted by capacitor Cs3 and switch SWs3 connected in series does not function. However, switches SWs1-SWs3 are conducting, the antiresonant frequency of series-arm circuit 11 is lower than an antiresonant frequency of series-arm resonator s1 since series-arm circuit 11 becomes the circuit that is constituted by series-arm resonator s1 and capacitor Cs1 connected in parallel, the antiresonant frequency of series-arm circuit 12 is lower than an antiresonant frequency of series-arm resonator s2 since series-arm circuit 12 becomes the circuit that is constituted by series-arm resonator s2 and capacitor Cs2 connected in parallel, and the antiresonant frequency of series-arm circuit 13 is lower than an antiresonant frequency of series-arm resonator s3 since series-arm circuit 13 becomes a circuit that is constituted by series-arm resonator s3 and capacitor Cs3 connected in parallel.

In filter 10B according to the present variation, since the series circuits of the capacitors (Cs1-Cs3) and the switches (SWs1-SWs3) are respectively connected in parallel to each series-arm resonator (s1-s3), the antiresonant frequencies of each series-arm circuit (11-13) are changed to the high side (Faon⇒Faoff) by switching switches SWs1-SWs3 from conduction to non-conduction. Since the passband and the attenuation band of filter 10B are regulated by the resonant and the antiresonant frequencies of series-arm circuits 11-13, and the resonant frequencies and the antiresonant frequencies of parallel-arm circuits 21 and 22; the passband and the attenuation band of filter 10B become tunable by switching between conduction and non-conduction of switches SWs1-SWs3.

The filters according to Example 4 and Comparative Example 2 are radio-frequency filters that are capable of switching between (i) the first filter characteristics in which Band 27-Tx is the first passband and Band 27-Rx is the first attenuation band, and (ii) the second filter characteristics in which Band 26-Tx is the second passband and Band 26-Rx is the second attenuation band, by switching between conduction and non-conduction of switches SWs1-SWs3. In other words, these filters are radio-frequency filters being frequency-tunable (tunable filters) that are capable of switching between being a transmission filter compatible with Band 27 and a transmission filter compatible with Band 26, by switching between conduction and non-conduction of switches SWs1-SWs3.

In any one of Example 4 and Comparative Example 2, switches SWs1-SWs3 are designed to ensure withstand current and withstand voltage for switches SWs1-SWs3 when +36 dBm of high-frequency electric power is applied to any of input/output terminals 101 and 102. Hereinafter, designs of switches SWs1-SWs3 in Example 4 and Comparative Example 2 will be concretely described.

5.1) Comparative Example 2

In Comparative Example 2, the stack numbers of switches SWs1-SWs3 are configured to be equal taking into consideration a maximum voltage of a switch among switches SWs1-SWs3 to which the highest voltage is applied. The gate widths of switches SWs1-SWs3 are configured to be equal taking into consideration a maximum current of a switch among switches SWs1-SWs3 to which the most current flows. Note that in Comparative Example 2, input/output terminal 101 is the input terminal to which the high-frequency signal is inputted.

Table 13 shows design parameters and the like of the filter according to Comparative Example 2. Table 14 shows an allowable input current, an allowable input voltage, and a size of each switch of the filter according to Comparative Example 2, and total sums thereof. Table 15 shows insertion loss within the passband of the filter according to Comparative Example 2.

Figure 10:
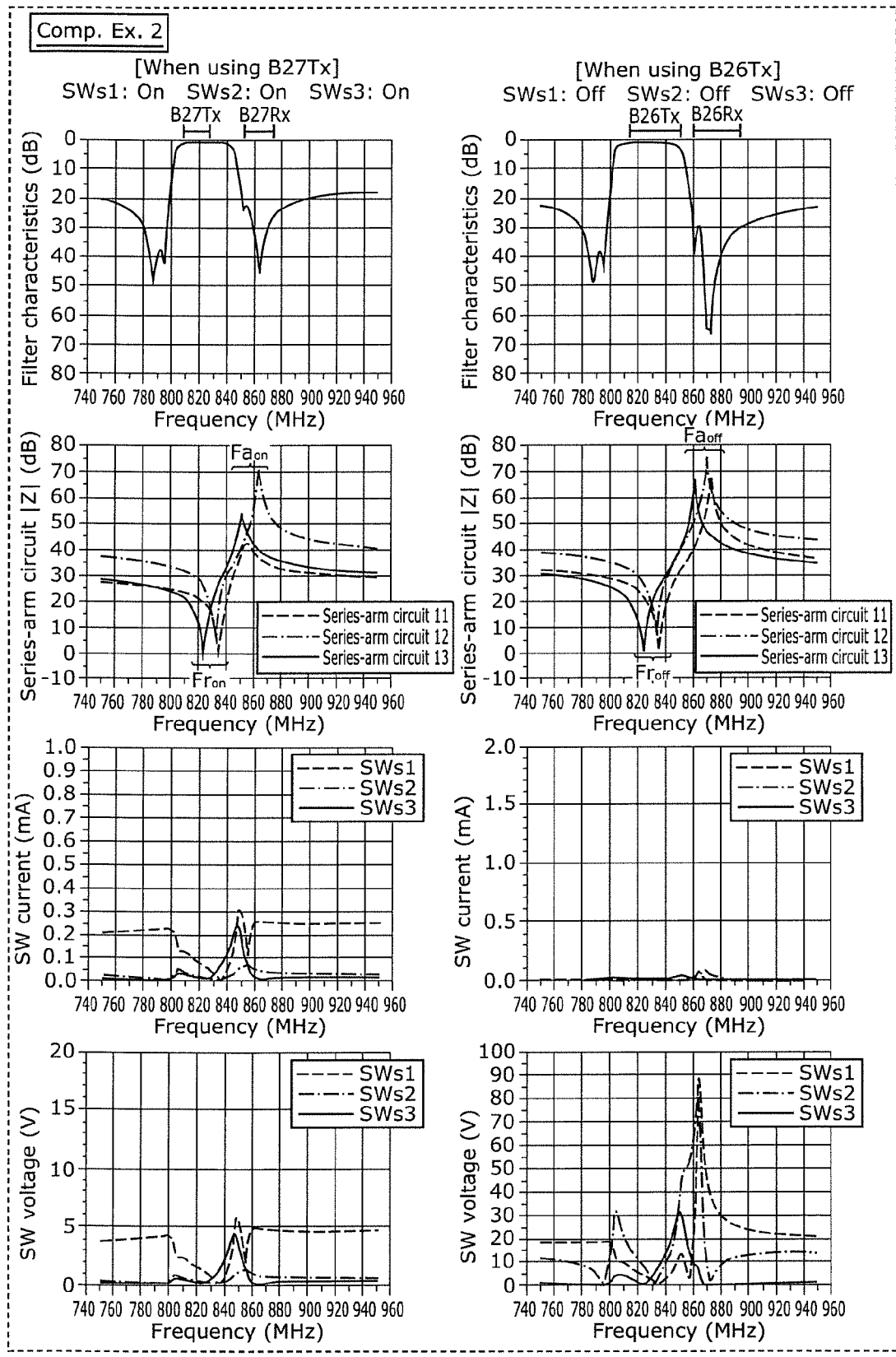
FIG. 10 is a graph showing various characteristics regarding the filter according to Comparative Example 2.

FIG. 10 is a graph showing various characteristics regarding the filter according to Comparative Example 2.

TABLE 13

| Comp. Ex. 2 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 0.95 | 39 | On | 835.1 | 855.5 | 308 | 5.8 | 308 | 89.50 | 17.18 |
| | | | Off | 835.1 | 872.7 | 0 | 89.5 | | | |
| Series-arm circuit 12 | 0.95 | 39 | On | 832.7 | 864.4 | 71 | 1.3 | 71 | 80.70 | 17.18 |
| | | | Off | 832.7 | 870.2 | 0 | 80.7 | | | |
| Series-arm circuit 13 | 0.95 | 39 | On | 823.9 | 851.9 | 236 | 4.4 | 236 | 31.77 | 17.18 |
| | | | Off | 823.9 | 861.0 | 0 | 31.8 | | | |

TABLE 14

| Comp. Ex. 2 | Allowable input current (mA) | Allowable input voltage (V) | Size (μm²) |
|---|---|---|---|
| Switch SWs1 | 302 | 97.5 | 37050 |
| Switch SWs2 | 302 | 97.5 | 37050 |
| Switch SWs3 | 302 | 97.5 | 37050 |
| Total | 906 | 292.5 | 111150 |

TABLE 15

| Comp. Ex. 2 | | IL@B27Tx (dB) | IL@B26Tx (dB) |
|---|---|---|---|
| Filter characteristics | SWs1-SWs3 On | 1.543 | — |
| | SWs1-SWs3 Off | — | 1.602 |

5.2) Example 4

In Example 4, the stack numbers and gate widths of the semiconductor elements included in switches SWs1-SWs3 are configured individually, and specifically satisfy the following relationships.

Stack number of switch SWs3>stack number of switch SWs2

Gate width of switch SWs3>gate width of switch SWs2

Stack number of switch SWs2>stack number of switch SWs1

Gate width of switch SWs2>gate width of switch SWs1

Note that in Example 4, input/output terminal 102 is the input terminal to which the high-frequency signal is inputted. In other words, switch SWs3 connected close to input/output terminal 102 (input terminal) is the first switch element and switch SWs1 connected close to input/output terminal 101 (output terminal) is the second switch element.

Table 16 shows design parameters and the like of the filter according to Example 4. Table 17 shows an allowable input current, an allowable input voltage, and a size of each switch of the filter according to Example 4, and total sums thereof. Table 18 shows insertion loss within the passband of the filter according to Example 4.

Figure 11:
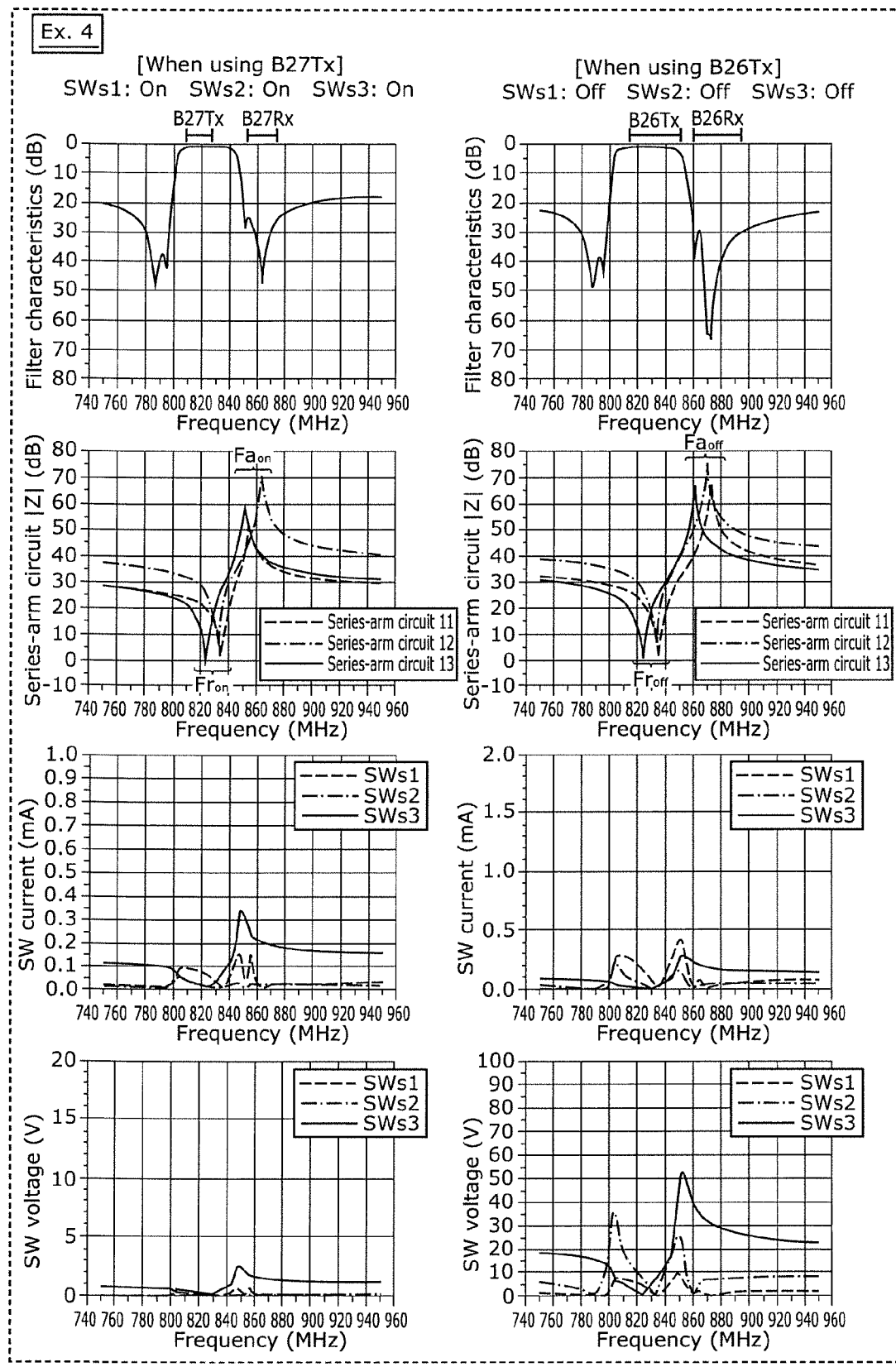
FIG. 11 is a graph showing various characteristics regarding the filter according to Example 4.

FIG. 11 is a graph showing various characteristics regarding the filter according to Example 4.

TABLE 16

| Ex. 4 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 0.40 | 4 | On | 835.1 | 855.4 | 159 | 0.7 | 159 | 10.24 | 4.19 |
| | | | Off | 835.1 | 872.6 | 0 | 10.24 | | | |
| Series-arm circuit 12 | 0.50 | 11 | On | 832.7 | 864.5 | 55 | 0.5 | 55 | 35.72 | 9.21 |
| | | | Off | 832.7 | 870.1 | 0 | 35.7 | | | |
| Series-arm circuit 13 | 1.00 | 17 | On | 823.9 | 852.0 | 340 | 2.6 | 340 | 52.73 | 7.12 |
| | | | Off | 823.9 | 861.0 | 0 | 52.7 | | | |

TABLE 17

| Ex. 4 | Allowable input current (mA) | Allowable input voltage (V) | Size (μm²) |
|---|---|---|---|
| Switch SWs1 | 127 | 10.0 | 1600 |
| Switch SWs2 | 159 | 27.5 | 5500 |
| Switch SWs3 | 318 | 42.5 | 17000 |
| Total | 604 | 80.0 | 24100 |

TABLE 18

| Ex. 4 | | IL@B27Tx (dB) | IL@B26Tx (dB) |
|---|---|---|---|
| Filter characteristics | SWs1-SWs3 On | 1.421 | — |
| | SWs1-SWs3 Off | — | 1.605 |

5.3) Comparison of Example 4 with Comparative Example 2

As illustrated in FIG. 10, FIG. 11, table 13, and table 16, the resonance characteristics (resonant frequencies and anti-resonant frequencies) of series-arm circuits 11-13 are substantially the same in the filters according to Comparative Example 2 and Example 4. As illustrated in the first row of FIG. 10 and FIG. 11, these filters are capable of switching between the first filter characteristics compatible with Band 27 and the second filter characteristics compatible with Band 26.

To be specific, in series-arm circuits 11-13, impedances of switches SWs1-SWs3 are exceedingly high (ideally limitless) when switches SWs1-SWs3 are not conducting, and characteristics of series-arm resonators s1-s3 become dominant. As such, in this case, characteristics of series-arm circuits 11-13 shown in the right column of the second row in FIG. 10 and FIG. 11 are respectively substantially the same as characteristics of series-arm resonators s1-s3. In other words, the antiresonant frequencies of series-arm resonators s1-s3 in this case ("Fa$_{off}$" in the drawings) are respectively substantially the same as the antiresonant frequencies of series-arm resonators s1-s3.

On the other hand, the impedances of switches SWs1-SWs3 are exceedingly low (ideally zero) when switches SWs1-SWs3 are conducting, and series-arm circuits 11-13 become circuits that constitute the series-arm resonators (s1-s3) and the capacitors (Cs1-Cs3) connected in parallel. In this case, as illustrated in the left column of the second row in FIG. 10 and FIG. 11, the antiresonant frequencies of the series-arm circuits (11-13) ("Fa$_{on}$" in the drawings) are respectively changed more toward the low frequency side than the antiresonant frequencies of the series-arm resonators (s1-s3).

Accordingly, by switching between conduction and non-conduction of switches SWs1-SWs3, it is possible to change the frequency of the attenuation pole at the high side of the passband, and to switch between the first filter characteristics and the second filter characteristics.

Upon comparing Example 4 with Comparative Example 2, in Example 4, the stack number (also referred to as the third stack number) of switch SWs2 (third switch element) is lower than the stack number (first stack number) of switch SWs3 (first switch element) and higher than the stack number (second stack number) of switch SWs1 (second switch element). The gate width of switch SWs2 is smaller than the gate width of switch SWs3 and larger than the gate width of switch SWs1.

In Example 4, the antiresonant frequency of series-arm resonator s3 (first series-arm resonator) in series-arm circuit 13 (first series-arm circuit) connected close to input/output terminal 102 (input terminal) is lower than the antiresonant frequency of series-arm resonator s1 (second series-arm resonator) in series-arm circuit 11 (second series-arm circuit) connected close to input/output terminal 101 (output terminal). Note that in Comparative Example 2, the antiresonant frequency of series-arm resonator s1 in series-arm circuit 11 connected close to input/output terminal 101 (input terminal) is higher than the antiresonant frequency of series-arm resonator s3 in series-arm circuit 13 connected close to input/output terminal 102 (output terminal).

Example 4 makes it possible to reduce insertion loss within the passband (1.421 dB: Example 4 (see table 18), 1.543 dB: Comparative Example 2 (see table 15)) when switches SWs1-SWs3 are conducting (i.e., when using Band 27-Tx), while reducing a total size of switches SWs1-SWs3 more than Comparative Example 2 (24100 pmt: Example 4 (see table 17), 111150 pmt: Comparative Example 2 (see table 14)).

To be specific, in Comparative Example 2, switches SWs2 and SWs3 are also designed the same taking into consideration switch SWs1 in which the switch voltage is at a maximum and the switch current is also at a maximum. In other words, switches SWs1-SWs3 are each designed to have a high stack number and a large gate width. Thus, the resistance per semiconductor element included in switches SWs1-SWs3 is low, but since the stack number is high, resistance Ron when switches SWs1-SWs3 are conducting increases to 17.18Ω. In Comparative Example 2, since switches SWs1-SWs3 each have a high stack number and a large gate width, the total size of total size is also large.

In Example 4, however, since the switch voltages and the switch currents of switches SWs1-SWs3 are lower on the whole than in Example 2, it is possible to reduce the stack numbers and the gate widths of switches SWs1-SWs3 more than in Comparative Example 2.

It is, therefore, possible in Example 4 to reduce resistance Ron when switch SWs3 is conducting more than in Comparative Example 2 to 4.19Ω, reduce resistance Ron when switch SWs2 is conducting more than in Comparative Example 2 to 9.21Ω, and reduce resistance Ron when switch SWs3 is conducting more than in Comparative Example 2 to 7.12Ω. In other words, it is possible to further reduce insertion loss within the passband when switches SWs1-SWs3 are conducting (i.e., when using Band 27-Tx). Since it is possible to reduce the stack numbers of switches SWs1-SWs3, it is also possible to reduce the total size of switches SWs1-SWs3.

6) Summary

The filter according to Embodiment 1 described above using Examples 1-4 produces the following advantageous effects (1) to (4).

(1) It is possible to scale down the filter and reduce insertion loss within the passband when the switches are conducting along with ensuring the electric power resistance that the filter requires, by making the stack number of the second switch element (switch SWs2 in Examples 1 and 2, and switch SWs1 in Examples 3 and 4) in the second series-arm circuit disposed close to the output terminal lower than the stack number of the first switch element (switch SWs1 in Examples 1 and 2, and switch SWs2 in Example 3) in the first series-arm circuit disposed close to the input terminal.

(2) It is possible to further scale down the filter and further reduce insertion loss within the passband when the switches are conducting along with ensuring the electric power resistance that the filter requires, by making the gate width of the second switch element in the second series-arm circuit disposed close to the output terminal smaller than the gate width of the first switch element in the first series-arm circuit disposed close to the input terminal.

(3) It is possible to further scale down the filter and further reduce insertion loss within the passband when the switches are conducting along with ensuring the electric power resistance that the filter requires, by making (i) the stack number of the third switch element (switch SWs2 in Example 4) lower than the stack number of the first switch element and higher than the stack number of the second switch element, and (ii) the gate width of the third switch element smaller than the gate width of the first switch element and larger than the gate width of the second switch element.

(4) It is possible to change the frequency of the attenuation pole at the high side of the passband by switching between conduction and non-conduction of the switches.

Note that the configuration of the parallel-arm circuit is not limited to the configuration described in Embodiment 1. Hereinafter, filters in which the configuration of the parallel-arm circuit differs from Embodiment 1 will be described as a variation of Embodiment 1.

Variation of Embodiment 1

In the above Embodiment 1, the parallel-arm circuit is a circuit including only the parallel-arm resonator. With regard to this, in the present variation, the parallel-arm circuit includes a switch circuit connected in series to a series-arm resonator.

7) Basic Configuration of Radio-Frequency Filter

Hereinafter, a filter according to the variation of Embodiment 1 will be described with reference to FIG. 12.

Figure 12:
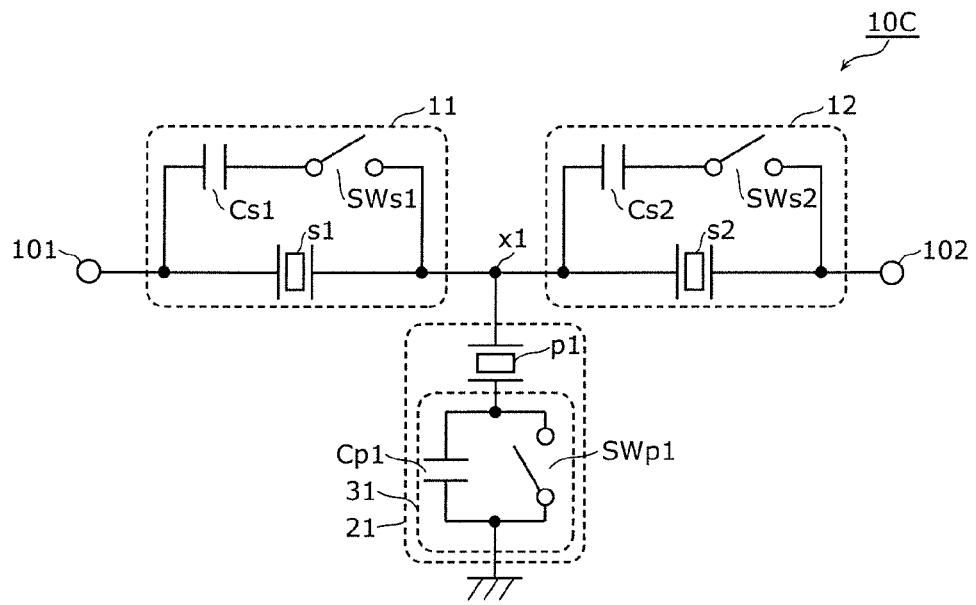
FIG. 12 is a circuit configuration diagram of a filter according to a variation of Embodiment 1.

FIG. 12 is a circuit configuration diagram of filter 10C according to the variation of Embodiment 1. Filter 10C shown in the drawing differs from filter 10 according to Embodiment 1 in that a circuit configuration of parallel-arm circuit 21 differs. Hereinafter, descriptions of filter 10C according to the present variation that are the same as filter 10 according to Embodiment 1 will be omitted and differences will be mainly described.

Parallel-arm circuit 21 includes parallel-arm resonator p1, and switch circuit 31 that will be described later connected in series to parallel-arm resonator p1.

Parallel-arm resonator p1 is an acoustic wave resonator using acoustic waves, and uses, for example, SAWs or BAWs, or is an FBAR, etc. Note that SAWs do not only include surface waves but also boundary waves.

Switch circuit 31 is connected in series to parallel-arm resonator p1, and in the present variation, connected in series to parallel-arm resonator p1 between parallel-arm resonator p1 and the ground. Note that switch circuit 31 may be connected in series to parallel-arm resonator p1 between node x1 and parallel-arm resonator p1, but with the objective of scaling down the filter, switch circuit 31 may be connected with a connection order of the present variation. This will be described later in Example 5.

To be specific, switch circuit 31 includes capacitor Cp1 that is an example of an impedance element being one of an inductor and a capacitor, and switch SWp1 that is a fourth switch element including at least one semiconductor element. In this switch circuit 31, switch SWp1 is switched between conduction and non-conduction in accordance with a control signal from the controller (not illustrated) such as an RFIC. By switching switch SWp1, the resonant frequency of parallel-arm circuit 21 and an impedance of switch circuit 31 are changed. In the present variation, switch circuit 31 is a circuit constituted by capacitor Cp1 and switch SWp1 connected in parallel.

An attenuation pole at the low side of a passband of filter 10C is configured through the antiresonant frequency of parallel-arm circuit 21. A frequency-tunable range of the attenuation pole of filter 10C is dependent on the element value of capacitor Cp1, and, for example, increases with a decrease in the element value of capacitor Cp1. Accordingly, it is possible to suitably determine the element value of capacitor Cp1 in accordance with the frequency specifications that filter 10C requires. Capacitor Cp1 may be a variable capacitor such as a varicap or a DTC.

Switch SWp1 is an SPST switch element including a transistor that is a semiconductor element. To be specific, switch SWp1 includes a FET, and contains, for example, GaAs or a CMOS. It is possible to scale down filter 10C, since the switch using such a semiconductor is compact.

In the present variation, switch SWp1 includes one or more semiconductor elements connected in series, similar to switch SWs1. Since a structure of switch SWp1 included in filter 10C is the same as the structure of switch SWs1 and the like, description thereof will be omitted.

With the above circuit configuration, an impedance of switch circuit 31 is changed by switching between conduction and non-conduction of switch SWp1, and with this, at least one of the resonant frequency or the antiresonant frequency of parallel-arm circuit 21 is changed. Note that in the present variation, only the resonant frequency of parallel-arm circuit 21 is changed. To be specific, parallel-arm circuit 21 has a resonant frequency and antiresonant frequency, and the resonant frequency changed to a low side or a high side in accordance with conduction and non-conduction of switch SWp1.

In filter 10C according to the variation of Embodiment 1, since switch circuit 31 includes a parallel circuit of capacitor Cp1 and switch SWp1, the antiresonant frequency of parallel-arm circuit 21 is changed to the high side by switching switch SWp1 from conduction to non-conduction. Since the passband and the attenuation band of filter 10C are regulated by the resonant frequencies and the antiresonant frequencies of series-arm circuits 11 and 12, and the resonant frequency and the antiresonant frequency of parallel-arm circuit 21, the frequencies of the passband and the attenuation band of filter 10C are changed (are tunable), by switching between conduction and non-conduction of switch SWp1.

Note that a parallel-arm circuit different from parallel-arm circuit 21 may be connected to a node different from node x1. In this case, a magnitude of voltage Vp1 across switch SWp1 is dependent on (i) from which of input/output terminals 101 and 102 high-frequency electric power is applied (application direction of high-frequency electric power), and (ii) the resonant frequency of parallel-arm resonator p1. For example, when high-frequency electric power is applied from the side of input/output terminal 102, a high-frequency applied voltage caused by applying the high-frequency electric power increases with switch SWp1 being connected close to input/output terminal 102. A high-frequency voltage applied to parallel-arm circuit 21 is divided between parallel-arm resonator p1 and switch circuit 31, and a voltage division ratio is dependent on impedances of parallel-arm resonator p1 and switch circuit 31. Since the impedance of parallel-arm resonator p1 changes greatly through the resonant frequency and the antiresonant frequency, a high-frequency partial voltage applied to switch circuit 31 among the high-frequency voltage applied to parallel-arm circuit 21 changes through resonance characteristics of parallel-arm resonator p1.

8) Analysis of Voltage Applied to Switch

A result of an analysis of how a voltage across a switch included in a parallel-arm circuit influences which circuit parameters will be described next.

Figure 13:
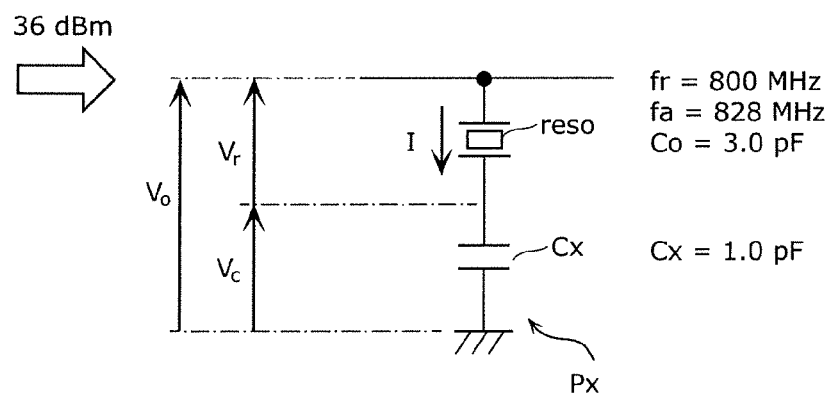
FIG. 13 is an equivalent circuit diagram of a parallel-arm circuit.
Figure 14:
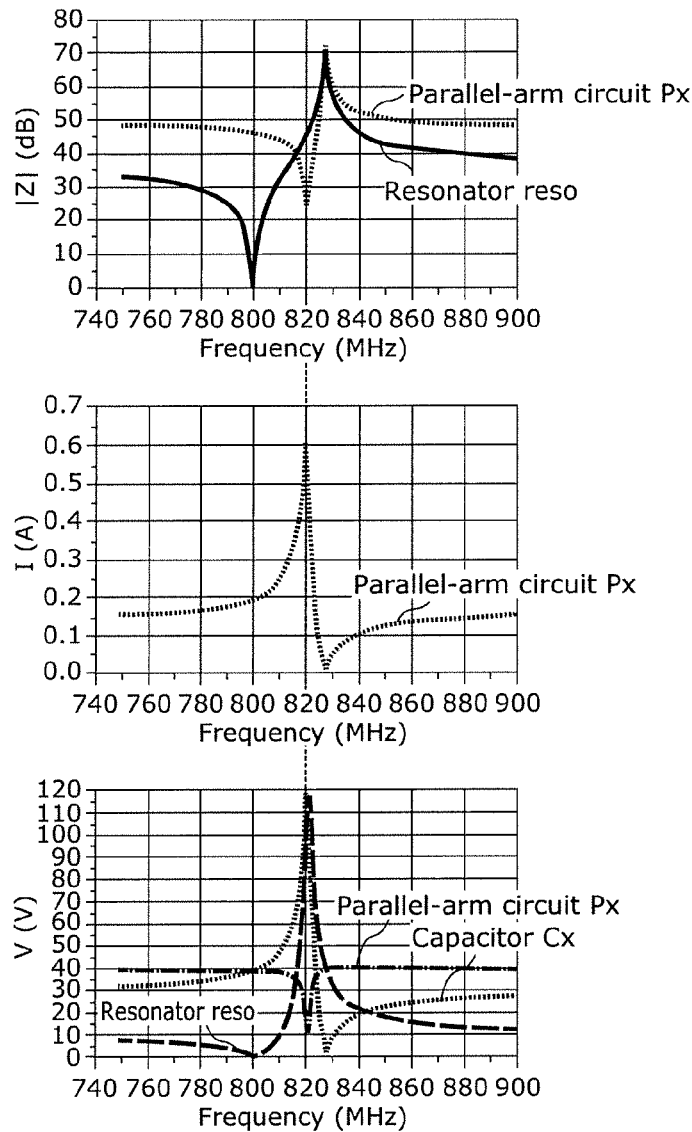
FIG. 14 is a graph showing impedance characteristics, current characteristics, and voltage characteristics of the parallel-arm circuit.

FIG. 13 is an equivalent circuit diagram of parallel-arm circuit Px when a switch is not conducting. FIG. 14 is a graph showing impedance characteristics, current characteristics, and voltage characteristics of parallel-arm circuit Px. In FIG. 13, parallel-arm circuit Px has a configuration in which resonator reso and capacitor Cx are connected in series. Capacitor Cx expresses a capacitance component when the switch is not conducting. As illustrated in the top diagram of FIG. 14, a resonant frequency of parallel-arm circuit Px is higher than a resonant frequency of resonator reso. As illustrated in the middle diagram of FIG. 14, current I that flows in parallel-arm circuit Px (i.e., current I that flows to capacitor Cx) is at a maximum at the resonant frequency of parallel-arm circuit Px. This is caused by the impedance of parallel-arm circuit Px being at a local minimum at the resonant frequency of parallel-arm circuit Px. As illustrated in the bottom diagram of FIG. 14, Voltage Vo applied to parallel-arm circuit Px is at a local minimum at the resonant frequency of parallel-arm circuit Px, but (an absolute value of) Voltage Vc applied to capacitor Cx and (an absolute value of) Voltage Vr applied to resonator reso are at a local maximum. In this manner, Voltage Vc and the current of capacitor Cx are at a maximum at the resonant frequency of parallel-arm circuit Px. In other words, a voltage and a current of the switch that is connected in series to resonator reso can be at a maximum at the resonant frequency of parallel-arm circuit Px when the switch is not conducting.

Figure 15A:
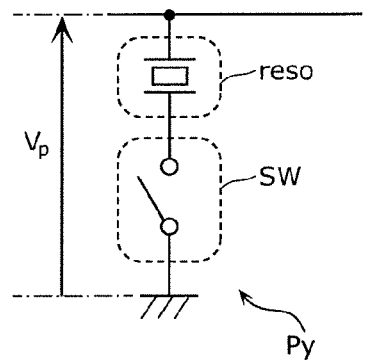
FIG. 15A is a circuit configuration diagram of a parallel-arm circuit.
Figure 15B:
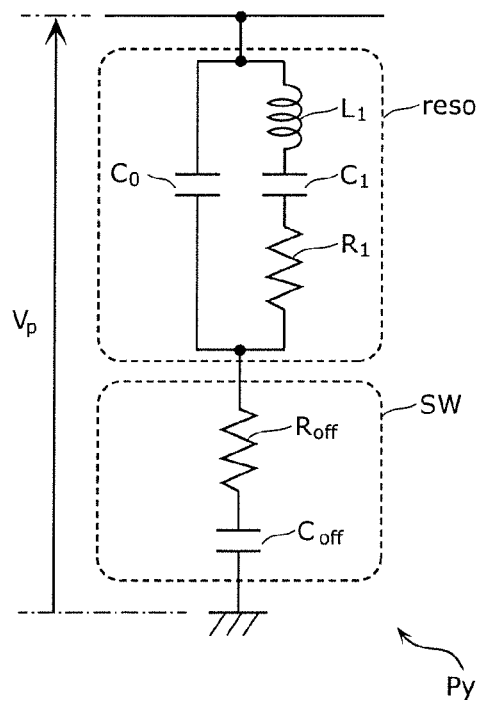
FIG. 15B is an equivalent circuit diagram of the parallel-arm circuit when a switch is not conducting.
Figure 15C:
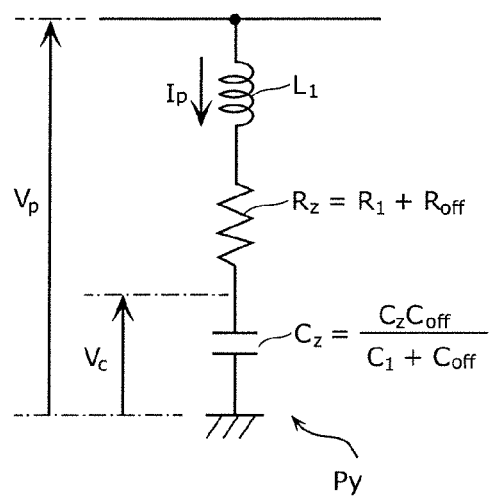
FIG. 15C is an equivalent circuit diagram with respect to a resonant frequency of the parallel-arm circuit when the switch is not conducting.

FIG. 15A is a circuit configuration diagram of parallel-arm circuit Py. FIG. 15B is an equivalent circuit diagram of parallel-arm circuit Py when a switch is not conducting. FIG. 15C is an equivalent circuit diagram with respect to the resonant frequency of parallel-arm circuit Py when the switch is not conducting.

As illustrated in FIG. 15A, parallel-arm circuit Py is a circuit that is constituted by resonator reso and switch SW connected in series. As illustrated in FIG. 15B, resonator reso is expressed as a circuit that is constituted by (i) a series circuit of inductor $L_1$ and capacitor $C_1$ and resistor $R_1$, and (ii) electrostatic capacitor $C_0$ connected in parallel. Switch SW is expressed as a circuit in which resistor $R_{off}$ and OFF capacitor $C_{off}$ are connected in series. As illustrated in FIG. 15C, the equivalent circuit with respect to the resonant frequency of parallel-arm circuit Py is expressed as a circuit in which inductor $L_1$, resistor $R_z$, and capacitor $C_z$ are connected in series. A resistance value of resistor $R_z$ and a capacitance value of capacitor $C_z$ are respectively expressed with Expression 1 and Expression 2.

[Math. 1]
$$R_Z = R_1 + R_{off} \qquad \text{Expression 1}$$

[Math. 2]
$$C_Z = \frac{C_1 \cdot C_{off}}{C_1 + C_{off}} \qquad \text{Expression 2}$$

Impedance Zp at the resonant frequency of parallel-arm circuit Py is expressed with Expression 3 through the equivalent circuit in FIG. 15C, and current Ip that flows in parallel-arm circuit Py when applying reference voltage Vp to parallel-arm circuit Py is expressed with Expression 4.

[Math. 3]
$$Z_p = R_Z + j\omega_r L_1 + \frac{1}{j\omega_r C_Z} \qquad \text{Expression 3}$$

[Math. 4]
$$I_p = \frac{V_p}{R_Z + j\omega_r L_1 + \frac{1}{j\omega_r C_Z}} \qquad \text{Expression 4}$$

Expression 5 holds true at the antiresonant frequency of parallel-arm circuit Py.

[Math. 5]
$$j\omega_r L_1 = \frac{1}{j\omega_r C_Z} \qquad \text{Expression 5}$$

With this, current Ipr that flows at the resonant frequency of parallel-arm circuit Py is expressed with Expression 6.

[Math. 6]
$$I_{pr} = \frac{V_p}{R_Z} \qquad \text{Expression 6}$$

Voltage Vc applied to capacitor Cz at the resonant frequency of parallel-arm circuit Py is expressed with Expression 7.

[Math. 7]
$$|V_C| = \left| I_p \frac{1}{j\omega_r C_Z} \right| = I_p \frac{1}{\omega_r C_Z} = \frac{V_p}{\omega_r C_Z R_Z} \qquad \text{Expression 7}$$

Since $\omega r = 1/\sqrt{(L_1 C_Z)}$ at the resonant frequency of parallel-arm circuit Py, Voltage Vc is expressed with Expression 8 upon incorporating this into Expression 7.

[Math. 8]
$$V_C = I_p \frac{V_p}{\frac{1}{\sqrt{L_1 C_Z}} C_Z R_Z} = \frac{V_p \sqrt{L_1 C_Z}}{C_Z R_Z} = \frac{V_p}{R_Z} \sqrt{\frac{L_1}{C_Z}} \qquad \text{Expression 8}$$

Note that a sharpness of a resonance (Q factor) is expressed with Expression 9.

[Math. 9]
$$Q = \frac{1}{R_Z} \sqrt{\frac{L_1}{C_Z}} \qquad \text{Expression 9}$$

Through Expression 8 and Expression 9, Voltage Vc is expressed with Expression 10.

[Math. 10]
$$V_C = Q \cdot V_p \qquad \text{Expression 10}$$

As such, through Expression 10, Voltage Vc applied to capacitor Cz is Q times reference voltage Vp of parallel-arm circuit Py, and a voltage exceeding reference voltage Vp is applied to switch SW in parallel-arm circuit Py when switch SW is not conducting.

Figure 15D:
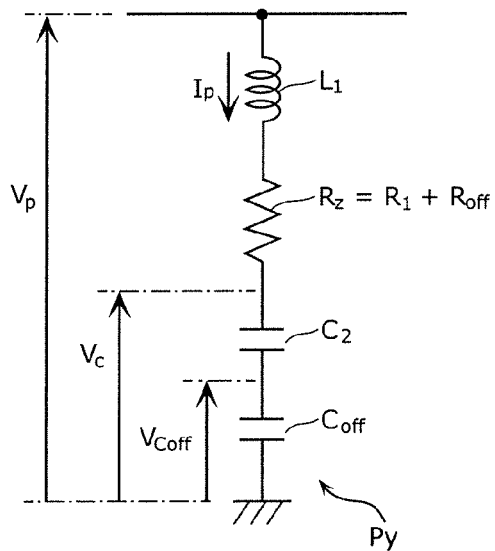
FIG. 15D is an equivalent circuit diagram with respect to the resonant frequency of the parallel-arm circuit when the switch is not conducting.

FIG. 15D is an equivalent circuit diagram with respect to the resonant frequency of parallel-arm circuit Py when switch SW is not conducting. The circuit equivalent circuit shown in FIG. 15D shows capacitor Cz factorized to OFF capacitor Coff of switch SW. In this case, Voltage $V_{Coff}$ applied to OFF capacitor $C_{off}$ is expressed with Expression 11, and the voltage applied to OFF capacitor $C_{off}$ of switch SW decreases with a decrease in a capacitance value of OFF capacitor $C_{off}$ of switch SW. The voltage applied to OFF capacitor $C_{off}$ of switch SW decreases with a decrease in the Q factor at the resonant frequency.

[Math. 11]

$$V_{C_{off}} = \frac{C_{off}}{C_Z} V_C = \frac{C_{off}}{C_1 + C_{off}} V_C = \frac{C_{off}}{C_1 + C_{off}} Q \cdot V_p \quad \text{Expression 11}$$

A circuit that is constituted by switch SW and capacitor $C_{p1}$ connected in parallel can be conceived with respect to parallel-arm circuit Py.

Figure 15E:
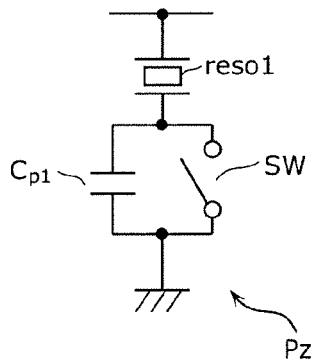
FIG. 15E is a circuit configuration diagram of a parallel-arm circuit.
Figure 15F:
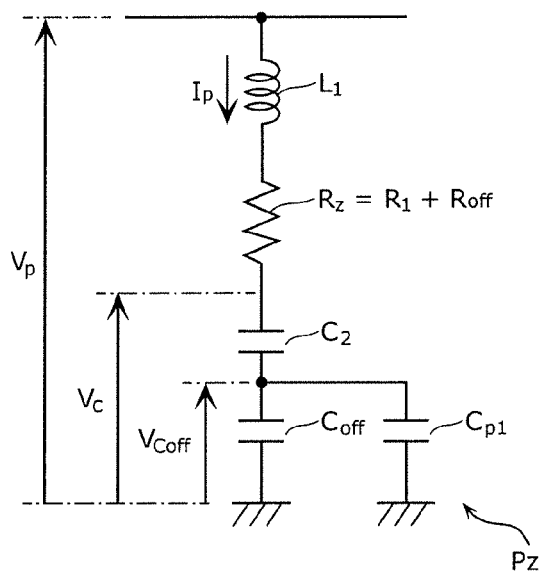
FIG. 15F is an equivalent circuit diagram with respect to a resonant frequency of the parallel-arm circuit when the switch is not conducting.

FIG. 15E is a circuit configuration diagram of parallel-arm circuit Pz. FIG. 15F is an equivalent circuit diagram with respect to a resonant frequency of parallel-arm circuit Pz when switch SW is not conducting.

Resonant frequency fr and antiresonant frequency fa of resonator reso are respectively expressed with Expression 12 and Expression 13 based on an equivalent circuit model of the resonator.

[Math. 12]

$$f_a = f_r \sqrt{1 + \frac{C_1}{C_0}} \quad \text{Expression 12}$$

[Math. 13]

$$f_r = \frac{1}{2\pi\sqrt{L_1 C_1}} \quad \text{Expression 13}$$

Voltage $V_{C_{off}}$ applied to OFF capacitor $C_{off}$ in parallel-arm circuit Pz is expressed with Expression 14 based on an expression in which $C_{off}$ in Expression 11 is replaced with $(C_{off}+C_{p1})$, Expression 12, and Expression 13.

[Math. 14]

$$V_{C_{off}} = \frac{C_{off} + C_{p1}}{C_0\left(\left(\frac{f_a}{f_r}\right)^2 - 1\right) + C_{off} + C_{p1}} Q \cdot V_p \quad \text{Expression 14}$$

The following can be understood about voltage $V_{C_{off}}$ of OFF capacitor $C_{off}$ through Expression 14.
(1) Voltage $V_{C_{off}}$ of OFF capacitor $C_{off}$ of switch SW decreases with an increase in a capacitance value of electrostatic capacitor $C_0$ of resonator reso.
(2) Voltage $V_{C_{off}}$ of OFF capacitor $C_{off}$ of switch SW decreases with an increase in a capacitance value of capacitor $C_{p1}$.
(3) Voltage $V_{C_{off}}$ of OFF capacitor $C_{off}$ of switch SW decreases with a decrease in frequency-tunable amount of parallel-arm circuit Pz.
(4) Voltage $V_{C_{off}}$ of OFF capacitor $C_{off}$ of switch SW decreases with an increase in fractional bandwidth (fa−fr)/fr of resonator reso.

In the present variation, a magnitude of voltage Vs across switch SW is dependent on the high-frequency electric power application direction and the resonant frequency of the parallel-arm resonator. However, as shown in the above analysis result, the magnitude of voltage Vs across switch SW is also dependent on the electrostatic capacitance of the parallel-arm resonator, equivalent capacitance $C_{p1}$ of switch SW, the frequency-tunable amount of the parallel-arm circuit, and the fractional bandwidth of the parallel-arm resonator.

9) Variation of Parallel-Arm Circuit

Note that the circuit configuration of the parallel-arm circuit is not limited to what is shown in FIG. 12. The parallel-arm circuit may have, for example, circuit configurations shown in FIG. 16 to FIG. 19.

FIG. 16 to FIG. 19 are circuit configuration diagrams showing other examples of filters according to the variation of Embodiment 1.

Figure 16:
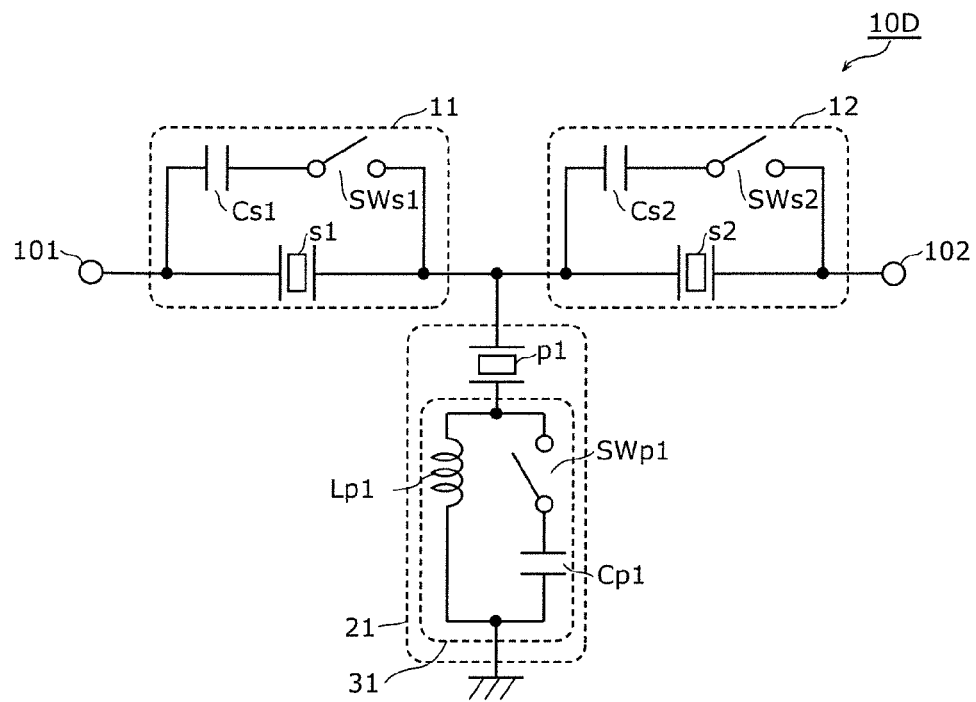
FIG. 16 is a circuit configuration diagram showing another example of a filter according to the variation of Embodiment 1.

Filter 10D shown in FIG. 16 differs from filter 10C according to the variation of Embodiment 1 in that a circuit configuration of switch circuit 31 is different. Switch circuit 31 includes inductor Lp1 (impedance element), switch SWp1 (fourth switch element), and capacitor Cp1. Capacitor Cp1 is connected in series to switch SWp1, and inductor Lp1 is connected in parallel to a circuit constituted by capacitor Cp1 and switch SW1a connected in series.

In filter 10D, since switch circuit 31 includes a parallel circuit of inductor Lp1 and switch SWp1, the resonant frequency of parallel-arm circuit 21 changes to the low side due to switch SWp1 being switched from conduction to non-conduction. When switch SWp1 is conducting, it is possible to cause the resonant frequency of parallel-arm circuit 21 when switch SWp1 is conducting to be located more toward the high frequency side than the resonant frequency of parallel-arm resonator p1, through capacitor Cp1 that is connected in series to switch SWp1. Accordingly, by switching between conduction and conduction of switch SWp1, it is possible to increase the frequency-tunable range of the frequency of the attenuation pole at the low side of the passband more than with filter 10C.

Figure 17:
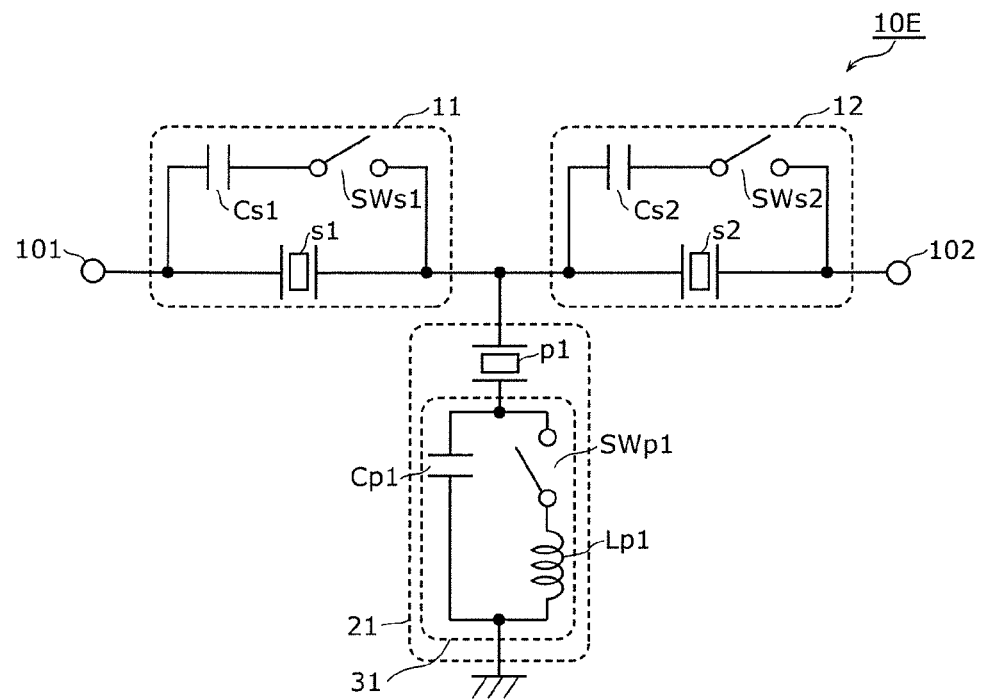
FIG. 17 is a circuit configuration diagram showing another example of a filter according to the variation of Embodiment 1.

Filter 10E shown in FIG. 17 differs from filter 10C according to the variation of Embodiment 1 in that the circuit configuration of switch circuit 31 is different. Switch circuit 31 includes capacitor Cp1 (impedance element), switch SWp1 (fourth switch element), and inductor Lp1. Inductor Lp1 is connected in series to switch SWp1, and capacitor Cp1 is connected in parallel to a circuit constituted by inductor Lp1 and switch SW1a connected in series.

In filter 10E, since switch circuit 31 is a parallel circuit of capacitor Cp1 and switch SWp1, the resonant frequency of parallel-arm circuit 21 changes to the high side, by switching switch SWp1 from conduction to non-conduction. When switch SWp1 is conducting, it is possible to cause the resonant frequency of parallel-arm circuit 21 when switch SWp1 is conducting to be located more toward the low frequency side than the resonant frequency of parallel-arm resonator p1, through inductor Lp1 that is connected in series to switch SWp1. Accordingly, by switching between conduction and conduction of switch SWp1, it is possible to increase the frequency-tunable range of the frequency of the attenuation pole at the low side of the passband more than with filter 10C.

Figure 18:
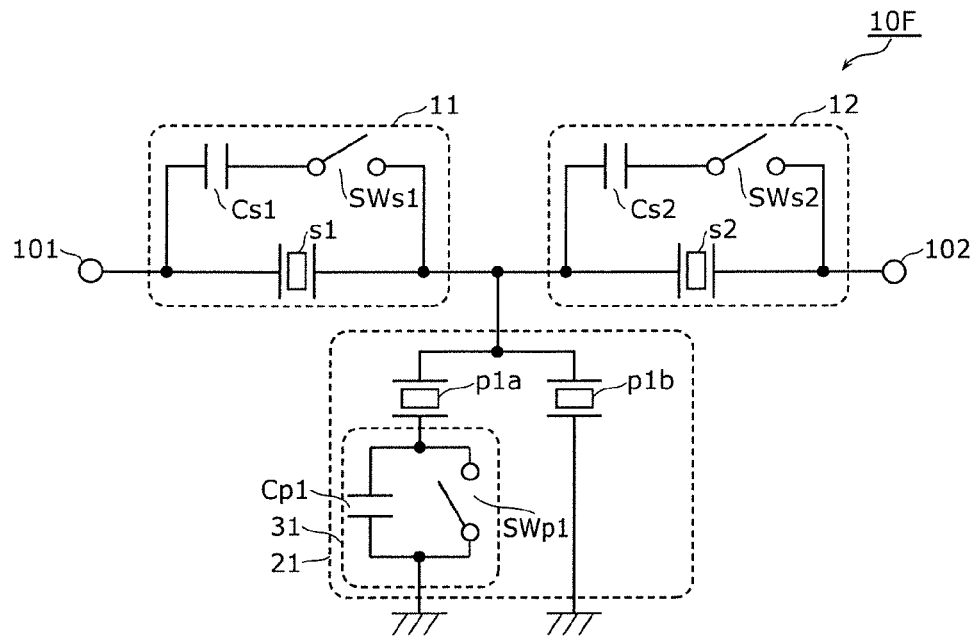
FIG. 18 is a circuit configuration diagram showing another example of a filter according to the variation of Embodiment 1.

Filter 10F shown in FIG. 18 differs from filter 10C according to the variation of Embodiment 1 in that the circuit configuration of switch circuit 21 is different. To be specific, one parallel-arm circuit includes two parallel-arm resonators.

Parallel-arm circuit 21 includes parallel-arm resonators p1a and p1b, and switch circuit 31 connected in series to parallel-arm resonator p1a. (i) A circuit constituted by parallel-arm resonator p1a and switch circuit 31 connected in series and (ii) parallel-arm resonator p1b are connected in parallel between a node and the ground. A resonant frequency of parallel-arm resonator p1b differs from a resonant frequency of parallel-arm resonator p1a, and an antiresonant frequency of parallel-arm resonator p1b differs from an antiresonant frequency of parallel-arm resonator p1a.

When the resonant frequency of parallel-arm resonator p1a is lower than the resonant frequency of parallel-arm resonator p1b, a pass characteristic of filter 10F is that an attenuation slope at the low side of the passband changes to the high side while maintaining a steepness thereof, by switching switch SWp1 from conduction to non-conduction. In other words, the filter is capable of changing the frequency of the low end of the passband and the frequency of the attenuation band to the high side while limiting an increase in insertion loss at the low end of the passband.

When the resonant frequency of parallel-arm resonator p1a is higher than the resonant frequency of parallel-arm resonator p1b, a pass characteristic of filter 10F is that an attenuation slope at the high side of the passband is changed to the high side while maintaining a steepness thereof, by switching switch SWp1 from conduction to non-conduction. In other words, the filter is capable of changing the frequency at the high end of the passband and the frequency of the attenuation band to the high side while limiting an increase in insertion loss at the high end of the passband.

Figure 19:
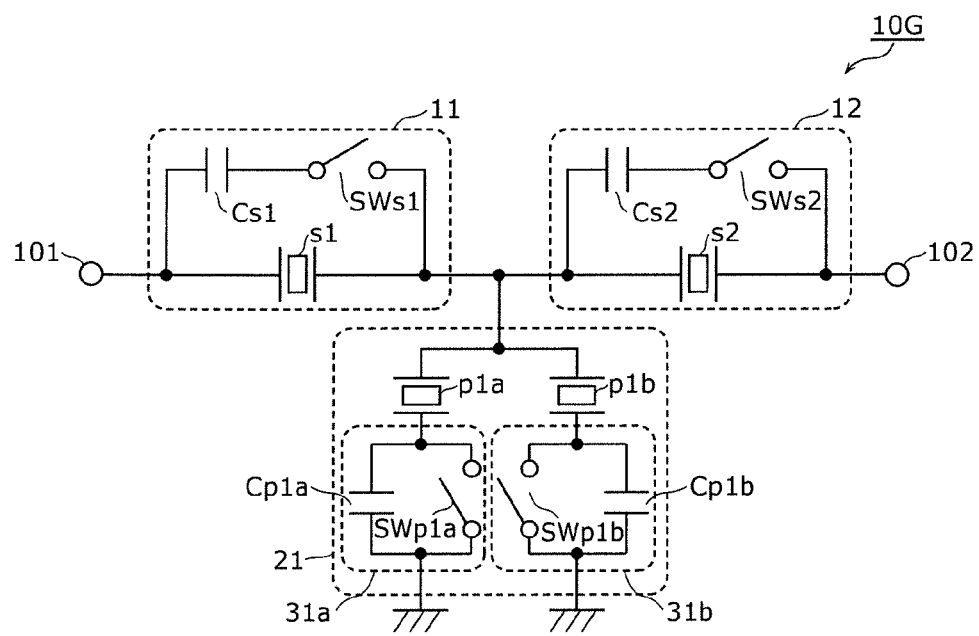
FIG. 19 is a circuit configuration diagram showing another example of a filter according to the variation of Embodiment 1.

Filter 10G shown in FIG. 19 differs from filter 10C according to the variation of Embodiment 1 in that the circuit configuration of switch circuit 21 is different. To be specific, one parallel-arm circuit includes two parallel-arm resonators and two switch circuits. More specifically, one parallel-arm circuit includes two circuits that each constitute a parallel-arm resonator and a switch circuit connected in series, these two circuits being connected in parallel.

Parallel-arm circuit 21 includes parallel-arm resonators p1a and p1b, switch circuit 31a connected in series to parallel-arm resonator p1a, and switch circuit 31b connected in series to parallel-arm resonator p1b. (i) A circuit constituted by parallel-arm resonator p1a and switch circuit 31a connected in series and (ii) a circuit constituted by parallel-arm resonator p1b and switch circuit 31b connected in series are connected in parallel between a node and the ground. Switch circuit 31a includes capacitor Cp1a and switch SWp1a. Switch SWp1a is connected in parallel to capacitor Cp1a. Switch circuit 31b includes capacitor Cp1b and switch SWp1b. Switch SWp1b is connected in parallel to capacitor Cp1b. The resonant frequency of parallel-arm resonator p1b differs from the resonant frequency of parallel-arm resonator p1a, and the antiresonant frequency of parallel-arm resonator p1b differs from the antiresonant frequency of parallel-arm resonator p1a.

A pass characteristic of filter 10G is that the passband is changed to the high side while an attenuation slope at the low side of the passband maintains a steepness thereof and an attenuation slope at the high side of the passband maintains a steepness thereof, by respectively switching switch SWp1 and switch SWp1b from conduction to non-conduction. In other words, in filter 10G, it is possible to shift the passband to the high side while limiting an increase in insertion loss at the low end of the passband, and at the same time shift the attenuation pole at the low side of the passband to the high side and the attenuation pole at the high side of the passband to the high side, by switching each switch from conduction to non-conduction. On the other hand, it is possible to shift the passband to the low side while limiting an increase in insertion loss at the high end of the passband, and at the same time shift the attenuation pole at the low side of the passband to the low side and the attenuation pole at the high side of the passband to the low side, by switching each switch from non-conduction to conduction.

Note that capacitors Cp1, Cp1a, and Cp1b (impedance element) in the present variation may be replaced with inductors. In this case, too, is each filter in the present variation frequency-tunable.

Switch circuit 31 includes switch SWp1 and a capacitor or an inductor, but may also include at least switch SWp1. In other words, parallel-arm circuit 21 (first parallel-arm circuit) may include parallel-arm resonator p1 and switch SWp1 (fourth switch element) connected in series to parallel-arm resonator p1.

10) Example 5

The present variation described above makes it possible to ensure electric power resistance while reducing insertion loss within the passband and scaling down filters 10C-10G being frequency-tunable. Hereinafter, this advantageous effect will be described with reference to Example 5.

Figure 20:
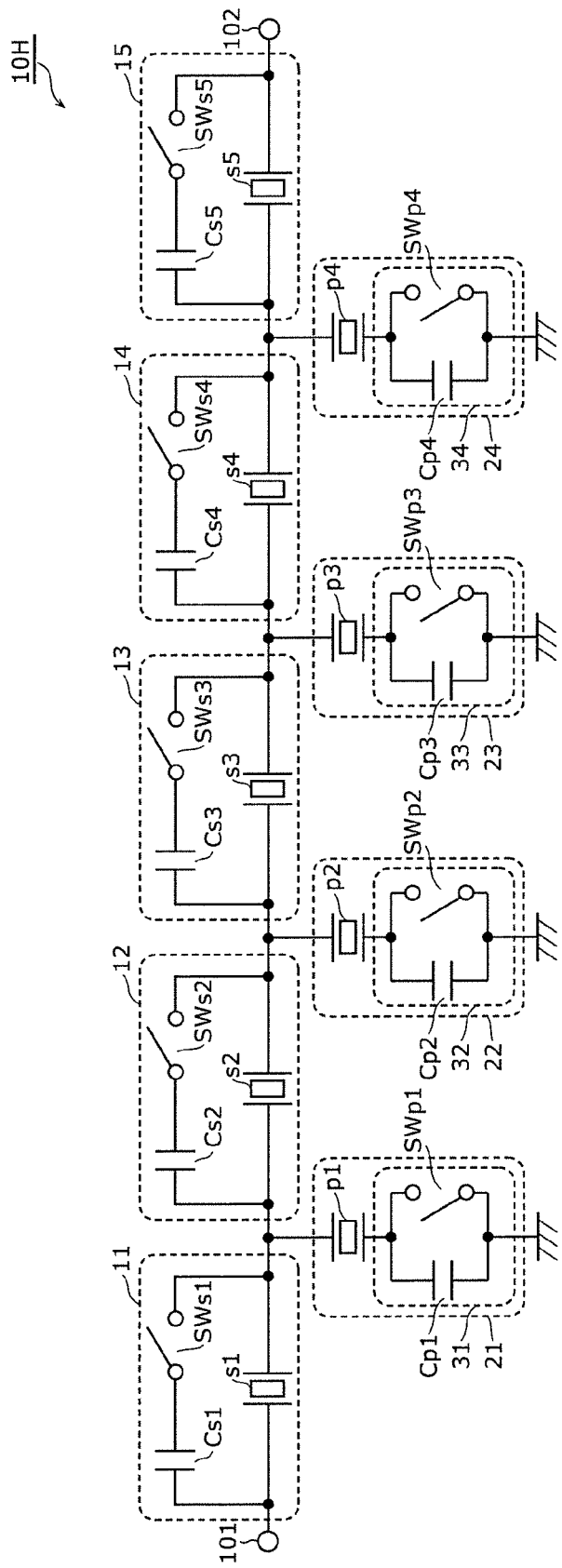
FIG. 20 is a circuit configuration diagram of a filter according to Example 5.

FIG. 20 is a circuit configuration diagram of filter 10H according to Example 5. Filter 10H shown in the drawing differs from filter 10C in that the number of series-arm circuits and the number parallel-arm circuits differ.

As illustrated in FIG. 20, filter 10H includes series-arm circuits 11, 12, 13, 14, and 15; parallel-arm circuits 21, 22, 23, and 24; and input/output terminals 101 and 102.

Series-arm circuit 11 is disposed on the path that connects input/output terminal 101 and input/output terminal 102. Series-arm circuit 12 is disposed closer to input/output terminal 102 than the path-shaped series-arm circuit 11 is. Series-arm circuit 13 is disposed closer to input/output terminal 102 than the path-shaped series-arm circuit 12 is. Series-arm circuit 14 is disposed closer to input/output terminal 102 than the path-shaped series-arm circuit 13 is. Series-arm circuit 15 is disposed closer to input/output terminal 102 than the path-shaped series-arm circuit 14 is.

Series-arm circuit 11 includes series-arm resonator s1, capacitor Cs1, and switch SWs1. Switch SWs1 is a switch element that is (i) connected in series to capacitor Cs1 and (ii) includes one or more semiconductor elements connected in series. Series-arm resonator s1 is connected in parallel to the circuit constituted by capacitor Cs1 and switch SWs1 connected in series.

Series-arm circuit 12 includes series-arm resonator s2, capacitor Cs2, and switch SWs2. Switch SWs2 is a switch element that is (i) connected in series to capacitor Cs2 and (ii) includes one or more semiconductor elements connected in series. Series-arm resonator s2 is connected in parallel to the circuit constituted by capacitor Cs2 and switch SWs2 connected in series.

Series-arm circuit 13 includes series-arm resonator s3, capacitor Cs3, and switch SWs3. Switch SWs3 is a switch element that is (i) connected in series to capacitor Cs3 and (ii) includes one or more semiconductor elements connected in series. Series-arm resonator s3 is connected in parallel to the circuit constituted by capacitor Cs3 and switch SWs3 connected in series.

Series-arm circuit 14 includes series-arm resonator s4, capacitor Cs4, and switch SWs4. Switch SWs4 is a switch element that is (i) connected in series to capacitor Cs4 and (ii) includes one or more semiconductor elements connected in series. Series-arm resonator s4 is connected in parallel to a circuit constituted by capacitor Cs4 and switch SWs4 connected in series.

Series-arm circuit 15 includes series-arm resonator s5, capacitor Cs5, and switch SWs5. Switch SWs5 is a switch element that is (i) connected in series to capacitor Cs5 and (ii) includes one or more semiconductor elements connected in series. Series-arm resonator s5 is connected in parallel to a circuit constituted by capacitor Cs5 and switch SWs5 connected in series.

Parallel-arm circuit 21 is connected to the ground and a node on a path between series-arm circuits 11 and 12. Parallel-arm circuit 22 is connected to the ground and a node on a path between series-arm circuits 12 and 13. Parallel-arm circuit 23 is connected to the ground and a node on a path between series-arm circuits 13 and 14. Parallel-arm circuit 24 is connected to the ground and a node on a path between series-arm circuits 14 and 15.

Parallel-arm circuit 21 includes parallel-arm resonator p1, and switch circuit 31 connected in series to parallel-arm resonator p1. Parallel-arm circuit 22 includes parallel-arm resonator p2, and switch circuit 32 connected in series to parallel-arm resonator p2. Parallel-arm circuit 23 includes parallel-arm resonator p3, and switch circuit 33 connected in series to parallel-arm resonator p3. Parallel-arm circuit 24 includes parallel-arm resonator p4, and switch circuit 34 connected in series to parallel-arm resonator p4.

Switch circuit 31 includes capacitor Cp1 and switch SWp1. Switch SWp1 is a switch element that is (i) connected in parallel to capacitor Cp1 and (ii) includes one or more semiconductor elements connected in series. Switch circuit 32 includes capacitor Cp2 and switch SWp2. Switch SWp2 is a switch element that is (i) connected in parallel to capacitor Cp2 and (ii) includes one or more semiconductor elements connected in series. Switch circuit 33 includes capacitor Cp3 and switch SWp3. Switch SWp3 is a switch element that is (i) connected in parallel to capacitor Cp3 and (ii) includes one or more semiconductor elements connected in series. Switch circuit 34 includes capacitor Cp4 and switch SWp4. Switch SWp4 is a switch element that is (i) connected in parallel to capacitor Cp4 and (ii) includes one or more semiconductor elements connected in series.

In filter 10H, a passband is configured through the resonant frequency of each series-arm circuit and an attenuation pole at the high side of the passband is configured through the antiresonant frequency of each series-arm circuit. The passband is configured through the antiresonant frequency of each parallel-arm circuit and the attenuation pole at the low side of the passband is configured through the resonant frequency of each series-arm circuit. In each series-arm circuit, a series-arm resonator is connected in parallel to a circuit constituted by a capacitor and a switch element. In each parallel-arm circuit, a parallel-arm resonator is connected in series to a circuit constituted by a capacitor and a switch element connected in parallel. By switching between conduction and non-conduction of each switch element in accordance with a control signal from the controller (not illustrated) such as an RFIC, impedances of each series-arm circuit and each parallel-arm circuit are changed, i.e., the antiresonant frequency of each series-arm circuit and the resonant frequency of each parallel-arm circuit are changed. With this, the frequencies of the passband and attenuation pole of filter 10 are changed. When each switch is not conducting, each series-arm circuit substantially has the same resonance characteristics as each series-arm resonator since the circuit that is constituted by the capacitor and the switch connected in series in each series-arm circuit does not function, and each parallel-arm circuit substantially has the same resonance characteristics as each parallel-arm resonator since the circuit that is constituted by the capacitor and the switch connected in series in each parallel-arm circuit does not function. However, when each switch is conducting, the antiresonant frequency of each series-arm circuit is lower than the antiresonant frequency of each series-arm resonator since each series-arm circuit becomes the circuit that is constituted by the series-arm resonator and the capacitor connected in parallel, and each parallel-arm circuit substantially has the same resonance characteristics as each parallel-arm resonator since the capacitor in each parallel-arm circuit does not function.

In filter 10H, since the series circuits of the capacitors (Cs1-Cs5) and the switches (SWs1-SWs5) are respectively connected in parallel to each series-arm resonator (s1-s5), the antiresonant frequency of each series-arm circuit (11-15) is changed to the high side (Fason⇒Fasoff), by switching switches SWs1-SWs5 from conduction to non-conduction. Since each switch circuit (31-34) respectively includes the parallel circuits of the capacitors (Cp1-Cp4) and the switches (SWp1-SWp4), the resonant frequency of each parallel-arm circuit (21-24) is changed to the high side (Frpon⇒Frpoff), by switching switches SWp1-SWp4 from conduction to non-conduction. Since the passband and the attenuation band of filter 10H are regulated by the resonant frequencies and the antiresonant frequencies of series-arm circuits 11-15, and the resonant frequencies and the antiresonant frequencies of parallel-arm circuits 21 and 24; the frequency of the passband and the frequency of the attenuation band of filter 10H become tunable, by switching between conduction and non-conduction of switches SWs1-SWs5 and switches SWp1-SWp4.

The filter according to Example 5 is a radio-frequency filter that is capable of switching between (i) the first filter characteristics in which Band 28a-Tx (703-733 MHZ) is the first passband and Band 28a-Rx (758-788 MHZ) is the first attenuation band when each switch is conducting, and (ii) the second filter characteristics in which Band 28b-Tx (718-748 MHZ) is the second passband and Band 28b-Rx (773-803 MHZ) is the second attenuation band when each switch is not conducting, by switching between conduction and non-conduction of each switches. In other words, these filters are radio-frequency filters being frequency-tunable (tunable filters) that are capable of switching between being a transmission filter compatible with Band 28a and a transmission filter compatible with Band 28b, by switching between conduction and non-conduction of each switch.

In Example 5, switches SWs1-SWs5 and switches SWp1-SWp4 are designed to ensure withstand current and withstand voltage for switches SWs1-SWs5 and switches SWp1-SWp4 when +36 dBm of high-frequency electric power is applied to input/output terminal 102. Hereinafter, designs of switches SWs1-SWs5 and switches SWp1-SWp4 in Example 5 will be concretely described.

Note that in Example 5, input-output terminal 102 is the input terminal to which the high-frequency signal is inputted. In other words, switch SWs5 connected close to input/output terminal 102 (input terminal) is the first switch element and switch SWs1 connected close to input/output terminal 101 (output terminal) is the second switch element.

The antiresonant frequency of series-arm resonator s5 (first series-arm resonator) in series-arm circuit 15 (first series-arm circuit) connected close to input/output terminal 102 (input terminal) is lower than the antiresonant frequency of series-arm resonator s1 (second series-arm resonator) in series-arm circuit 11 (second series-arm circuit) connected close to input/output terminal 101 (output terminal).

In Example 5, the stack numbers and gate widths of the semiconductor elements included in switches SWs1-SWs5 are configured individually, and specifically satisfy the following relationships.

Stack number of switch SWs5>stack number of switch SWs1

Gate width of switch SWs5>gate width of switch SWs1

Stack number of switch SWs5>stack number of at least one switch element among switches SWs2-SWs4

Gate width of switch SWs5>gate width of at least one switch element among switches SWs2-SWs4

Stack number of at least one switch element among switches SWs2-SWs4>stack number switch SWs1

Gate width of at least one switch element among switches SWs2-SWs4>gate width of switch SWs1

In Example 5, the stack numbers and gate widths of the semiconductor elements included in switches SWp1-SWp4 are configured individually, and specifically satisfy the following relationships.

Stack number of switch SWp4>stack number of switch SWp1

Gate width of switch SWp4>gate width of switch SWp1

The switch elements in the series-arm circuits and the switch elements in the parallel-arm circuits satisfy the following relationships Stack number of switch SWs1 or SWs5<stack number of at least one switch element among switches SWp1-SWp4

Gate width of switch SWs1 or SWs5<gate width of at least one switch element among switches SWp1-SWp4

Table 19 shows design parameters and the like of the filter according to Example 5. Table 20 shows an allowable input current, an allowable input voltage, and a size of each switch of the filter according to Example 5, and total sums thereof. Table 21 shows insertion loss within the passband of the filter according to Example 5.

Figure 21A:
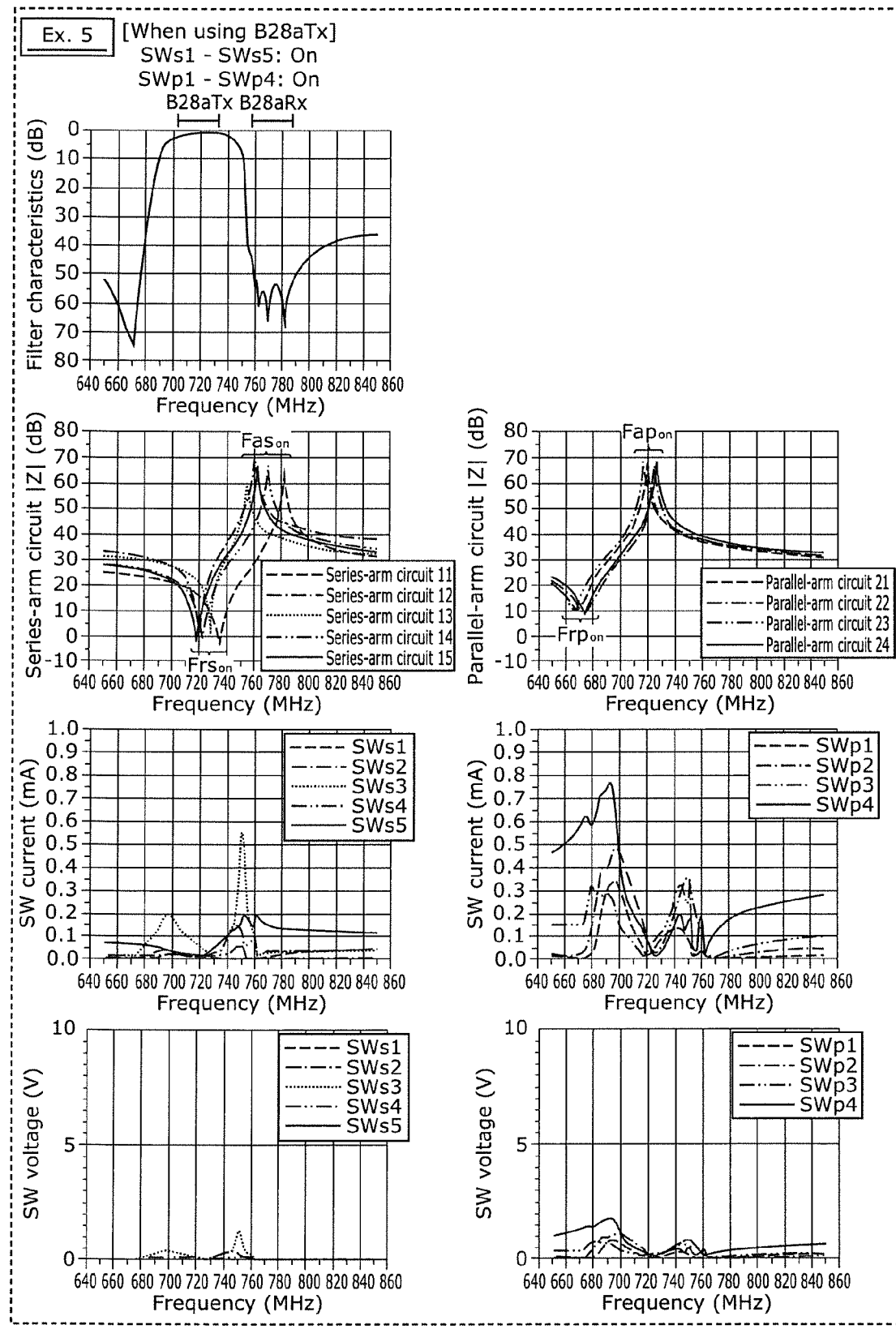
FIG. 21A is a graph showing various characteristics regarding the filter according to Example 5 when using Band 28a-Tx.

FIG. 21A is a graph showing various characteristics regarding filter 10H according to Example 5 when using Band 28a-Tx when switches SWs1-SWs5 and switches SWp1-SWp4 are conducting.

Figure 21B:
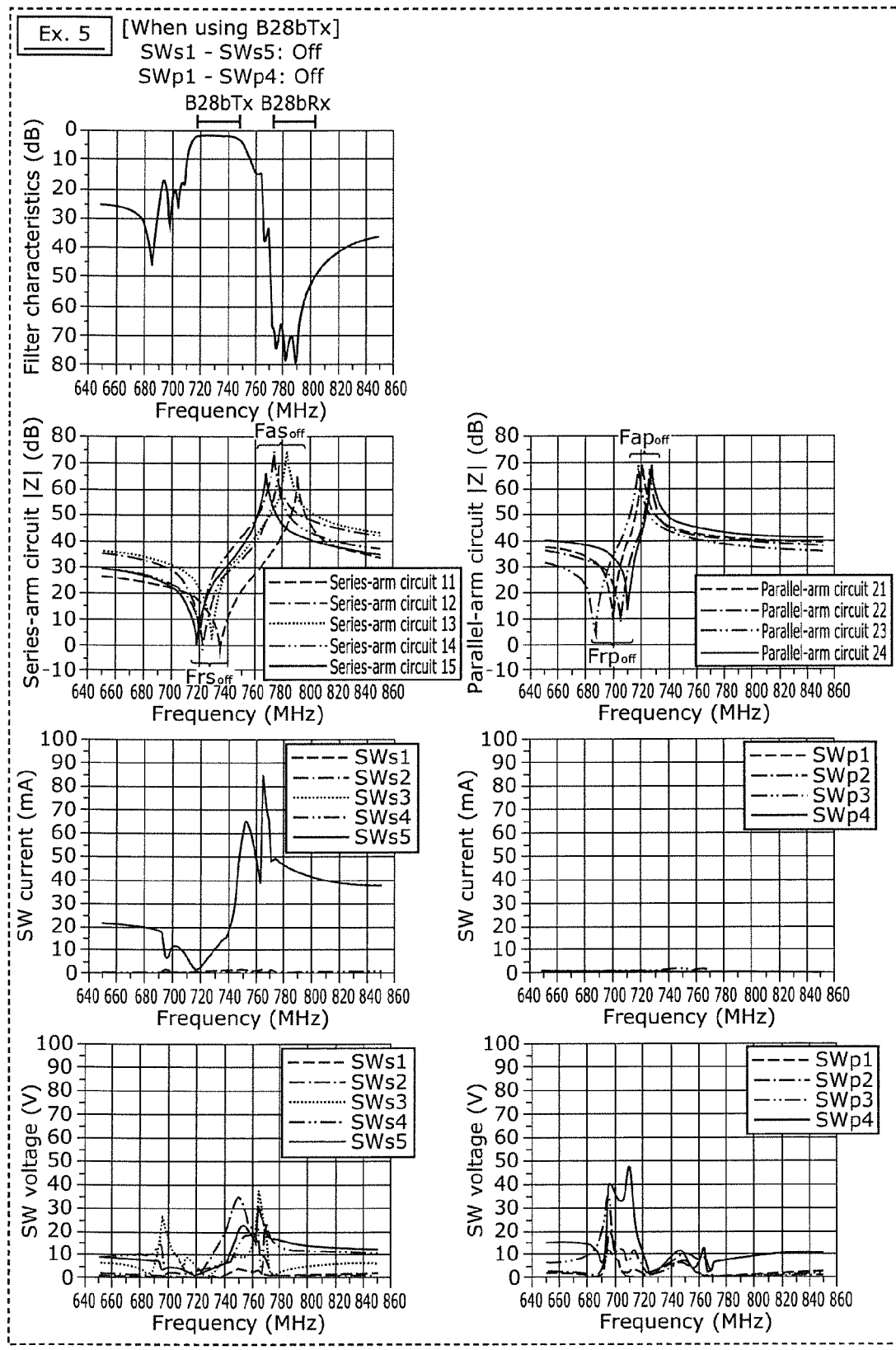
FIG. 21B is a graph showing various characteristics regarding the filter according to Example 5 when using Band 28b-Tx.

FIG. 21B is a graph showing various characteristics regarding filter 10H according to Example 5 when using Band 28b-Tx when switches SWs1-SWs5 and switches SWp1-SWp4 are not conducting.

TABLE 19

| Ex. 5 | WF (mm) | Ns (No.) | SW | Fr (MHz) | Fa (MHz) | Is_max (mA) | Vs_max (V) | Is_max (mA) | Vs_max (V) | Ron (Ω) |
|---|---|---|---|---|---|---|---|---|---|---|
| Series-arm circuit 11 | 0.45 | 2 | On | 735.0 | 782.1 | 19 | 0.0 | 19 | 3.23 | 1.86 |
| | | | Off | 735.0 | 790.1 | 0 | 3.2 | | | |
| Series-arm circuit 12 | 0.45 | 14 | On | 719.4 | 759.5 | 136 | 0.3 | 136 | 33.43 | 13.02 |
| | | | Off | 719.4 | 773.3 | 1 | 33.4 | | | |
| Series-arm circuit 13 | 0.50 | 4 | On | 728.2 | 754.2 | 558 | 1.3 | 558 | 36.98 | 3.35 |
| | | | Off | 728.2 | 782.7 | 1 | 37.0 | | | |
| Series-arm circuit 14 | 0.45 | 7 | On | 722.1 | 769.5 | 93 | 0.2 | 93 | 25.02 | 6.51 |
| | | | Off | 722.1 | 776.2 | 1 | 25.0 | | | |
| Series-arm circuit 15 | 0.70 | 7 | On | 717.6 | 762.2 | 193 | 0.0 | 193 | 28.93 | 4.19 |
| | | | Off | 717.6 | 767.4 | 0 | 28.9 | | | |
| Parallel-arm circuit 21 | 0.80 | 1 | On | 669.1 | 720.2 | 347 | 0.8 | 347 | 12.02 | 0.52 |
| | | | Off | 698.6 | 720.3 | 0 | 12.0 | | | |
| Parallel-arm circuit 22 | 1.40 | 2 | On | 674.0 | 725.8 | 486 | 1.1 | 486 | 20.24 | 0.60 |
| | | | Off | 704.3 | 725.8 | 1 | 20.2 | | | |
| Parallel-arm circuit 23 | 0.55 | 2 | On | 666.2 | 717.0 | 330 | 0.7 | 330 | 34.85 | 1.52 |
| | | | Off | 685.9 | 717.0 | 1 | 34.8 | | | |
| Parallel-arm circuit 24 | 1.05 | 3 | On | 675.0 | 726.7 | 768 | 1.7 | 768 | 47.49 | 1.20 |
| | | | Off | 709.6 | 726.7 | 1 | 47.5 | | | |

TABLE 20

| Ex. 5 | Allowable input current (mA) | Allowable input voltage (V) | Size (μm²) |
|---|---|---|---|
| Switch SWs1 | 143 | 5.0 | 900 |
| Switch SWs2 | 143 | 35.0 | 6300 |
| Switch SWs3 | 159 | 10.0 | 2000 |
| Switch SWs4 | 143 | 17.5 | 3150 |
| Switch SWs5 | 223 | 17.5 | 4900 |
| Switch SWp1 | 254 | 2.5 | 800 |
| Switch SWp2 | 445 | 5.0 | 2800 |
| Switch SWp3 | 175 | 5.0 | 1100 |
| Switch SWp4 | 334 | 7.5 | 3150 |
| Total | 2019 | 105.0 | 25100 |

TABLE 21

| Ex. 5 | | IL@B28aTx (dB) | IL@B28bTx (dB) |
|---|---|---|---|
| Filter characteristics | SWs1-SWs5 On SWp1-SWp4 On | 2.071 | — |
| | SWs1-SWs5 Off SWp1-SWp4 Off | — | 1.500 |

In filter 10H according to Example 5, (i) the first filter characteristics are implemented when switches SWs1-SWs5 and switches SWp1-SWp4 are conducting as illustrated in the first row of FIG. 21A, and (ii) the second filter characteristics are implemented when switches SWs1-SWs5 and switches SWp1-SWp4 are not conducting as illustrated in the first row of FIG. 21B. In other words, filter 10H is a radio-frequency filter being frequency-tunable (tunable filter) that is capable of switching the passband between Band 28a-Tx and Band 28b-Tx and the attenuation band between Band 28a-Rx and Band 28b-Rx, by switching between conduction and non-conduction of switches SWs1-SWs5 and switches SWp1-SWp4.

To be specific, in series-arm circuits 11-15, impedances of switches SWs1-SWs5 are exceedingly high (ideally limitless) when switches SWs1-SWs5 are not conducting, and the characteristics of series-arm resonators s1-s5 become dominant. As such, in this case, characteristics of series-arm circuits 11-15 shown in the left column of the second row in FIG. 21B are respectively substantially the same as the characteristics of series-arm resonators s1-s5. In other words, the antiresonant frequencies of series-arm circuits 11-15 in this case ("Fas$_{off}$" in the drawing) are respectively substantially the same as antiresonant frequencies of series-arm resonators s1-s5.

On the other hand, the impedances of switches SWs1-SWs5 are exceedingly low (ideally zero) when switches SWs1-SWs5 are conducting, and series-arm circuits 11-15 respectively become circuits that constitute the series-arm resonators (s1-s5) and the capacitors (Cs1-Cs5) connected in parallel. As such, in this case, as illustrated in the left column of the second row of FIG. 21A, the antiresonant frequencies of series-arm circuits 11-15 ("Fas$_{on}$" in the drawing) are respectively changed to be more to the low frequency side than the antiresonant frequencies of series-arm circuits 11-15 when switches SWs1-SWs5 are not conducting.

In parallel-arm circuits 21-24, impedances of switches SWp1-SWp4 are exceedingly low (ideally zero) when switches SWp1-SWp4 are conducting, capacitors Cp1-Cp4 short-circuit, and characteristics of parallel-arm resonators p1-p4 become dominant. As such, in this case, characteristics of parallel-arm circuits 21-24 shown in the right column of the top row in FIG. 21A are respectively substantially the same as characteristics of parallel-arm resonators p1-p4. In other words, the resonant frequencies of parallel-arm circuits 21-24 in this case ("Frp$_{on}$" in the drawing) are respectively substantially the same as the resonant frequencies of parallel-arm resonators p1-p4.

On the other hand, the impedances of switches SWp1-SWp4 are exceedingly high (ideally limitless) when switches SWp1-SWp4 are not conducting, and parallel-arm circuits 21-24 respectively become circuits that constitute the parallel-arm resonators (p1-p4) and the capacitors (Cp1-Cp4) connected in series. As such, in this case, as illustrated in the right column of the top row of FIG. 21B, the resonant frequencies of parallel-arm circuits 21-24 ("Frp$_{off}$" in the drawing) are respectively changed to be more to the high frequency side than the resonant frequencies of parallel-arm circuits 21-24 when switches SWp1-SWp4 are conducting.

Accordingly, by switching between conduction and non-conduction of switches SWs1-SWs5 and switches SWp1-SWp4, it is possible to (i) change the frequency of the attenuation pole at the high side of the passband configured through the antiresonant frequencies of series-arm circuits 11-15 and the frequency of the attenuation pole at the low side of the passband configured through the resonant frequencies of parallel-arm circuits 21-24, and (ii) switch between the first filter characteristics and the second filter characteristics.

In Example 5, the stack number (third stack number) of switch SWs3 (third switch element) is lower than the stack number (first stack number) of switch SWs5 (first switch element) and higher than the stack number (second stack number) of switch SWs1 (second switch element). The gate width of switch SWs3 is smaller than the gate width of switch SWs5 and larger than the gate width of switch SWs1. The stack number of switch SWp1 connected close to the output terminal is lower than the stack number of switch SWp4 connected close to the input terminal, and the gate width of switch SWp1 is smaller than the gate width of switch SWp4.

In Example 5, the stack number (second stack number) of switch SWs1 (second switch element) is lower than the stack number (also referred to as fourth stack number) of switch SWp4 (fourth switch element). This is because the voltage applied to switch SWp4 is higher than the voltage applied to switch SWs1. The gate width of switch SWs1 is smaller than the gate widths of switches SWp1-SWp4. This is because the current flowing to switch SWp4 is greater than the current flowing to switch SWs1.

Example 5 makes it possible to reduce insertion loss within the passband (2.071 dB: see table 21, 1.543 dB: see table 15) when switches SWs1-SWs5 and switches SWp1-SWp4 are conducting (i.e., when using Band 28a-Tx), while reducing a total size of switches SWs1-SWs5 and switches SWp1-SWp4 (25100 pmt: see table 20).

11) Configuration Example

Figure 22:
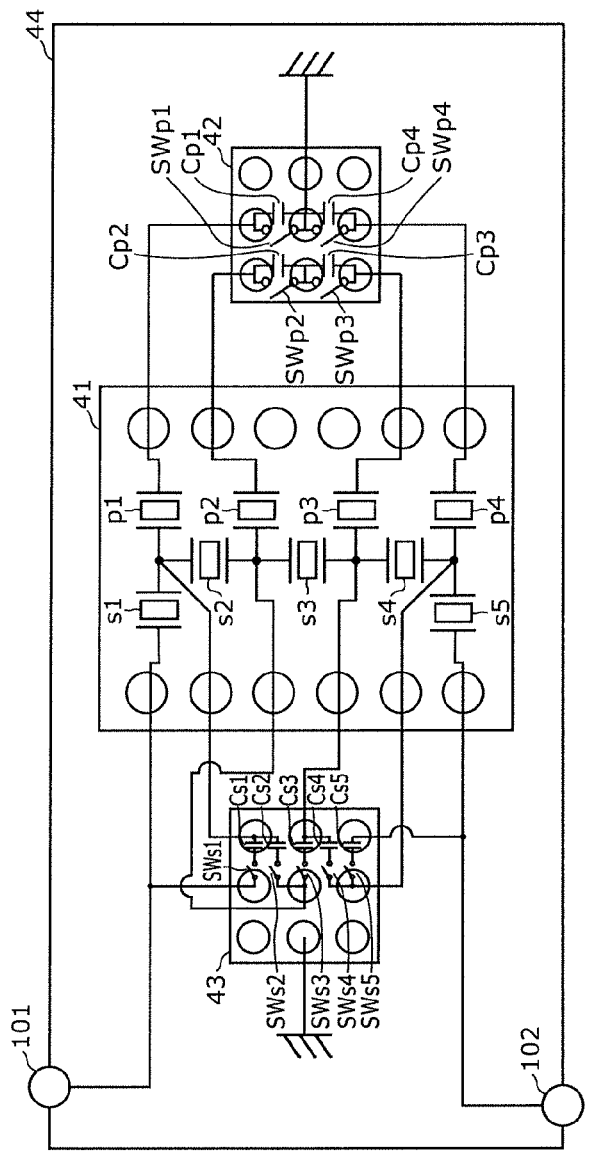
FIG. 22 is a plan view for describing a structure of the filter according to Example 5.

FIG. 22 is a plan view for describing a structure of filter 10H according to Example 5 shown in FIG. 20. Series-arm resonator s1-s5 and parallel-arm resonators p1-p4 are each a surface acoustic wave resonator including an interdigital transducer (IDT) electrode disposed on a piezoelectric substrate 41 or a bulk acoustic wave resonator disposed on substrate 41, and are included in one package. Switches SWs1-SWs5 and capacitors Cs1-Cs5 are included in package 43 different from the package in which series-arm resonator s1-s5 and parallel-arm resonators p1-p4 are included. Switches SWp1-SWp4 and capacitors Cp1-Cp4 are included in package 42 different from the package in which series-arm resonator s1-s5 and parallel-arm resonators p1-p4 are included. These three packages are mounted on wiring substrate 44 and are connected by wiring disposed on wiring substrate 44.

In the present configuration, capacitors Cs1-Cs5 and capacitors Cp1-Cp4 are disposed in the package close to the switches, but may also be disposed on substrate 41 including each resonator when capacitors Cs1-Cs5 and capacitors Cp1-Cp4 are formed using comb capacitor electrodes or metal-insulator-metal (MIM) capacitor electrodes. However, with the objective of scaling down the filter, each capacitor may be disposed in the package close to the switches. The reason being that when each capacitor is disposed in the package including each resonator, it is necessary to increase the number of terminals of the package, causing an increase in size.

In the present configuration example, a switch circuit including a capacitor and a switch is disposed closer to the ground than a node on a path that connects input/output terminals 101 and 102. In contrast, when the switch circuit is disposed closer to the above node, it is necessary to increase the number of terminals in the package including the resonators and the package including the switches, causing an increase in size. From this standpoint, it is possible to scale down filter 10H by disposing the switch circuit closer to the ground than to the node with respect to the parallel-arm resonators.

12) Summary

The filter according to the variation of Embodiment 1 described above using Example 5 produces the following advantageous effects (1)-(5).

(1) It is possible to further scale down the filter and further reduce insertion loss within the passband when the switches are conducting along with ensuring electric power resistance that the filter requires, by making (i) the stack number of the third switch element (switch SWs3 in Example 5) lower than the stack number of the first switch element (switch SWs5 in Example 5) and higher than the stack number of the second switch element (switch SWs1 in Example 5), and (ii) the gate width of the third switch element smaller than the gate width of the first switch element and larger than the gate width of the second switch element.

(2) It is possible to further scale down the filter and further reduce insertion loss within the passband when the switches are conducting along with ensuring electric power resistance that the filter requires, by making the stack number of the first switch element or the second switch element (switch SWs1 in Example 5) lower than the stack number of the fourth switch element (switch SWp4 in Example 5).

(3) It is possible to further scale down the filter and further reduce insertion loss within the passband when the switches are conducting along with ensuring electric power resistance that the filter requires, by making the gate width of the first switch element or the second switch element (switch SWs1 in Example 5) smaller than the gate width of the fourth switch element (switches SWp1-SWp4 in Example 5).

(4) It is possible to change the frequency of the attenuation poles at the high side and the low side of the passband, by switching between conduction and non-conduction of the switches.

(5) It is possible to scale down the filter, by disposing the switch circuit closer to the ground than to the node with respect to the parallel-arm resonators.

Embodiment 2

The filters described in Embodiment 1 and the examples thereof can also be applied to a multiplexer and a radio-frequency front-end circuit compatible with systems using a higher number of bands. Accordingly, in Embodiment 2, such a multiplexer, radio-frequency front-end circuit, and communication device will be described.

Figure 23:
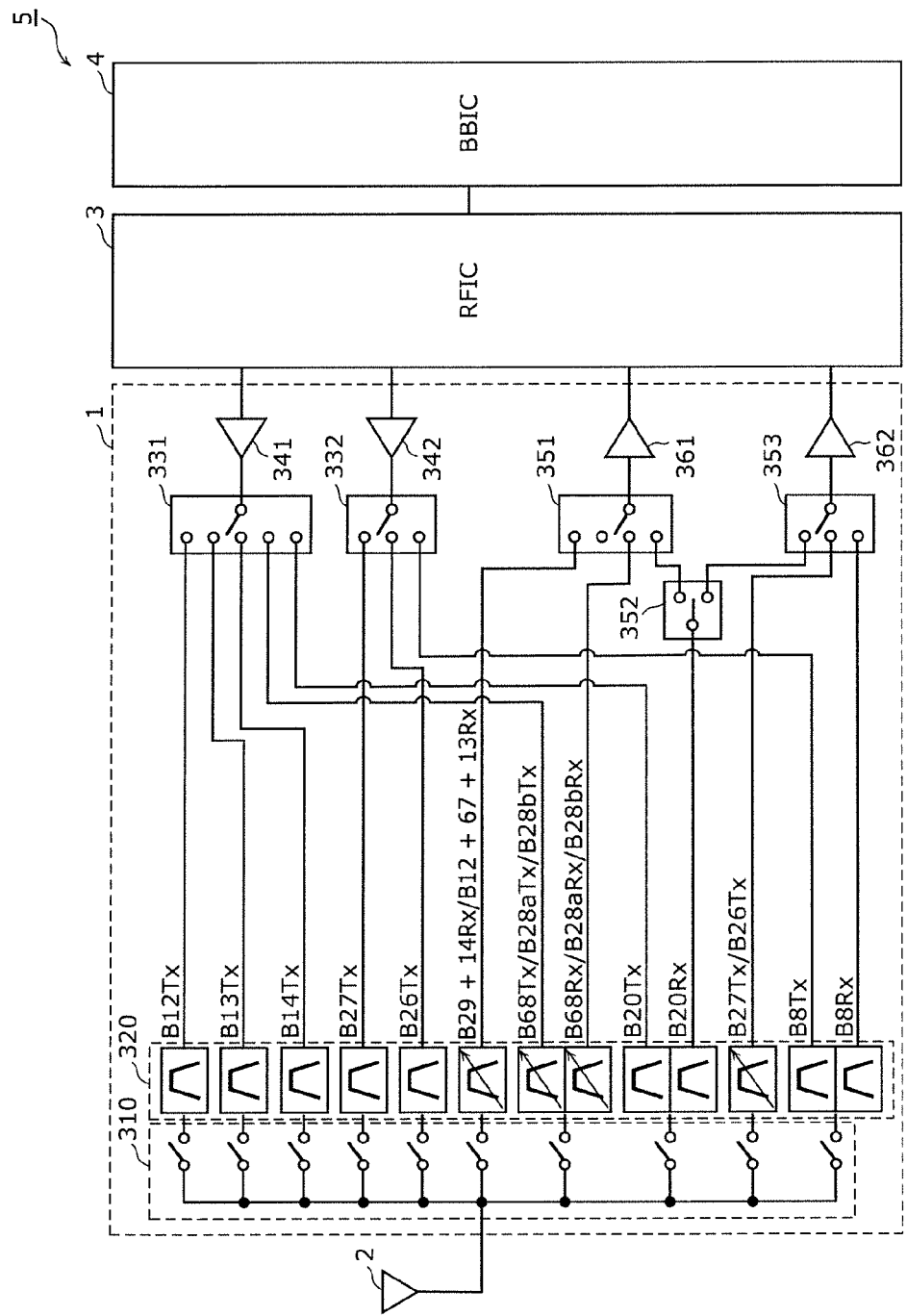
FIG. 23 is a configuration diagram of a communication device and peripheral circuits thereof according to Embodiment 2.

FIG. 23 is a configuration diagram of communication device 5 according to Embodiment 2.

As illustrated in the drawing, communication device 5 includes switch group 310 including multiple switches; filter group 320 including multiple switches; transmission-end switches 331 and 332; reception-end switches 351, 352, and 353; transmission amplifier circuits 341 and 342; reception amplifier circuits 361 and 362; RF signal processing circuit (RFIC) 3; baseband signal processing circuit (BBIC) 4; and antenna element 2.

Switch group 310 connects antenna element 2 to a signal path compatible with a predetermined band in accordance with the control signal from the controller (not illustrated), and includes, for example, multiple SPST switches. Note that the signal path connected to antenna element 2 is not limited to be one signal path and may also be multiple signal paths. In other words, communication device 5 may be compatible with career aggregation.

Filter group 320 includes, for example, multiple filters (including a duplexer) having the following bands as their passband. To be specific, the bands are (i) a Band 12 transmission band, (ii) a Band 13 transmission band, (iii) a Band 14 transmission band, (iv) a Band 27 transmission band, (v) a Band 26 transmission band, (vi) a Band 29 and Band 14 reception band or Band 12, Band 67, and Band 13 reception band, (vii-Tx) a Band 68, Band 28a, or a Band 28b transmission band, (vii-Rx) a Band 68, Band 28a, or Band 28b reception band, (viii-Tx) a Band 20 transmission band, (viii-Rx) a Band 20 reception band, (ix-Tx) a Band 27 or Band 26 transmission band, (x-Tx) a Band 8 transmission band, and (x-Rx) a Band 8 reception band.

Transmission-end switch 331 is a switch circuit including multiple selection terminals connected to multiple low-band transmission-end signal paths whose center frequency among the bands in filter group 320 is low, and a common terminal connected to transmission amplifier circuit 341. Transmission-end switch 332 is a switch circuit including multiple selection terminals connected to multiple high-band transmission-end signal paths whose center frequency among the bands in filter group 320 is high, and a common terminal connected to transmission amplifier circuit 342. These transmission-end switches 331 and 332 are switch circuits that are disposed in a front part of filter group 320 (here, front part at the transmission-end signal paths) and change a connection state in accordance with the control signal from the controller (not illustrated). With this, the high-frequency signal amplified by transmission amplifier circuits 341 and 342 (here, the high-frequency transmission signal) are outputted to antenna element 2 via a predetermined filter of filter group 320.

Reception-end switch 351 is a switch circuit including multiple selection terminals connected to multiple low-band reception-end signal paths whose center frequency among the bands in filter group 320 is low, and a common terminal connected to reception amplifier circuit 361. Reception-end switch 352 is a switch circuit including a common terminal connected to a reception-end signal path of a predetermined band (here, Band 20), and two selection terminals connected to the common terminal of reception-end switch 351 and the common terminal of reception-end switch 352. Reception-end switch 353 is a switch circuit including multiple selection terminals connected to multiple high-band reception-end signal paths whose center frequency among the bands in filter group 320 is high, and a common terminal connected to reception amplifier circuit 362.

These reception-end switches 351-353 are switch circuits that are disposed in a rear part of filter group 320 (here, rear part at the reception-end signal paths) and change a connection state in accordance with the control signal from the controller (not illustrated). With this, the high-frequency signal inputted to antenna element 2 (here, the high-frequency reception signal) is amplified by reception amplifier circuits 361 and 362 and outputted to the RF signal processing circuit (RFIC), via the predetermined filter of filter group 320. Note that an RF signal processing circuit (RFIC) compatible with the low band and an RF signal processing circuit (RFIC) compatible with the high band may be disposed separately.

Transmission amplifier circuit 341 is a power amplifier that power amplifies the low-band high-frequency transmission signal, and transmission amplifier circuit 342 is a power amplifier that power amplifies the high-band high-frequency transmission signal.

Reception amplifier circuit 361 is a low-noise amplifier that power amplifies the low-band high-frequency reception signal, and reception amplifier circuit 362 is a low-noise amplifier that power amplifies the high-band high-frequency reception signal.

RF signal processing circuit (RFIC) 3 processes a high-frequency signal to be transmitted by antenna element 2 and a high-frequency signal to be received by antenna element 2. To be specific, RF signal processing circuit (RFIC) 3 signal-processes, through downscaling and the like, the high-frequency signal (here, the high-frequency reception signal) inputted from antenna element 2 via the reception-end signal paths, and outputs the signal-processed and generated reception signal to baseband signal processing circuit (BBIC) 4. RF signal processing circuit (RFIC) 3 signal-processes, through upscaling and the like, the transmission signal inputted from baseband signal processing circuit (BBIC) 4, and outputs the signal-processed and generated high-frequency signal (here, the high-frequency transmission signal) to the transmission-end signal paths.

Communication device 5 configured as such includes the filters according to any of Embodiment 1 and the examples thereof as at least one of: a filter having (vi) a Band 29 and Band 14 reception band or a Band 12, Band 67, and Band 13 reception band as its passband; a filter having (vii-Tx) a Band 68, Band 28a, or Band 28b transmission band as its passband; a filter having (vii-Rx) a Band 68, Band 28a, or Band 28b reception band as its passband; and a filter having (ix-Tx) a Band 27 or Band 26 transmission band as its passband. In other words, the filter changes the frequency of the passband and the frequency of the attenuation band in accordance with the control signal.

Note that among communication device 5, switch group 310; filter group 320; transmission-end switches 331 and 332; reception-end switches 351, 352, and 353; transmission amplifier circuits 341 and 342; reception amplifier circuits 361 and 362; and the above controller constitute radio-frequency front-end circuit 1. Switch group 310 and filter group 320 constitute the multiplexer. Note that in the multiplexer according to the present disclosure, filter group 320 may be connected to the common terminal via switch group 310 as in Embodiment 2, but the multiplexer may also have a configuration in which multiple filters according to according to Embodiment 1 are directly connected to the common terminal.

The above controller is not illustrated in FIG. 23, but may be included in RF signal processing circuit (RFIC) 3, and the controller may also be included in a switch integrated circuit (IC) along with each switch controller by the controller.

Radio-frequency front-end circuit 1 and communication device configured as such make it possible to implement a high-performance radio-frequency front-end circuit and communication device capable of scaling down the filter and reducing insertion loss within the passband when each switch is conducting, along with ensuring the required electric power resistance, by including the filters according to the above Embodiment 1 and the examples thereof. It is possible to scale down the filter since it is possible to reduce the number of filters more than when a filter is disposed per band.

Radio-frequency front-end circuit 1 according to Embodiment 2 includes transmission-end switches 331 and 332 and reception-end switches 351-353 (switch circuits) disposed in the front part or the rear part of filter group 320 (multiple radio-frequency filters). This makes it possible to share a portion of the signal paths through which the high-frequency signal is transmitted. As such, it is possible, for example, to share transmission amplifier circuit 341 and 242 or reception amplifier circuit 361 and 362 (amplifier circuits) corresponding to the multiple filters. It is, therefore, possible to scale down and reduce cost of the radio-frequency front-end circuit.

Note that at least one of transmission-end switches 331 and 332 and reception-end switches 351-353 may be disposed. A number of transmission-end switches 331 and 332 and a number of reception-end switches 351-353 is not limited to the above description, and, for example, one transmission-end switch and one-reception end switch may also be disposed. A number of selection terminals and the like of the transmission-end switches and the reception-end switches are also not limited to Embodiment 2, and two of each may also be disposed.

OTHER EMBODIMENTS

The radio-frequency filter, the multiplexer, the radio-frequency front-end circuit, and the communication device according to the present disclosure have been described above with Embodiments 1 and 2 as examples, but the present disclosure is not limited to the above embodiments. Other embodiments that can be realized by combining optional structural elements in the above embodiments, variations obtainable through various modifications to the above embodiments that can be conceived by a person of ordinary skill in the art without departing from the essence of the present disclosure, or various devices including the radio-frequency filter, the multiplexer, the radio-frequency front-end circuit, and the communication device according to the present disclosure are also included in the present disclosure.

For example, at least five series-arm circuits may be disposed as long as at least two series-arm circuits are disposed.

Each of the series-arm resonators and parallel-arm resonators described above is not limited to being one resonator, and may also include multiple split resonators in which one resonator is split.

In the above description, the gate width of one switch element has been compared with the gate width of another switch element with each switch element including multiple transistors (specifically FETs) having the same configuration for the sake of brevity. However, the configuration of each switch element is not limited to the foregoing, and the configuration of at least one transistor may differ from the configurations of the other transistors. In other words, in each switch element, the gate widths of the multiple transistors are not limited to being the same and may also differ from one another.

Even in a configuration including such switch elements, the same advantageous effect as in the above description is produced due to the above relationships of the gate widths holding true.

To be specific, withstand current of switch elements formed due to multiple transistors being connected in series is throttled back (i.e., restricted) by the withstand current of a transistor with the smallest gate width among the multiple transistors. Accordingly, it is desired to realize withstand current of each of the multiple transistors in order to satisfy the withstand current that the switch element including the multiple transistors requires.

Therefore, concerning the first switch element that requires greater withstand current than the second switch element, the gate width of each of the multiple transistors included in the first switch element is larger than at least one gate width of the multiple transistors included in the second switch element, for example.

This makes it possible to ensure withstand current realizing the electric power resistance that the radio-frequency filter and the like require, while reducing the total size of the first switch element and the second switch element.

In switch elements formed by multiple transistors being connected in series, enlarging the gate width of a transistor other than the transistor with the smallest gate width does not contribute to improving withstand current of all switch elements and also hinders scaling down the switch elements. Accordingly, in order to scale down the switch elements, it is desired to not enlarge the gate widths of the other transistors too much.

Therefore, for example, concerning the second switch element that does not require as great a withstand current as the first switch element, the gate width of each of the multiple transistors included in the second switch element may be smaller than the gate width of any of the multiple transistors included in the first switch element. This makes it possible to further scale down the second switch element, while ensuring withstand current realizing the electric power resistance that the radio-frequency filter and the like require. In other words, it is possible to further scale down the radio-frequency filter and the like including the second switch element, while reducing insertion loss within the passband and ensuring electric power resistance.

In the above description, an example of each switch element including multiple transistors has been described, but each switch element may also include one transistor.

In the above embodiments, the semiconductor elements included in each switch element are transistors, but may also be diode switches and the like.

For example, the controller may be disposed outside of RF signal processing circuit (RFIC) 3, but may also be disposed, for example, in radio-frequency front-end circuit 1. In other words, radio-frequency front-end circuit 1 is not limited to the above-described configuration and may also include the radio-frequency filter having a frequency-tunable circuit, and the controller that controls conduction and non-conduction of a switch element of the frequency-tunable circuit. Radio-frequency front-end circuit 1 configured as such makes it possible to change the passband in accordance with the required frequency specifications, while limiting an increase in insertion loss at an end of the passband.

For example, in radio-frequency front-end circuit 1 or communication device 5, an inductor or a capacitor may be connected between each of the structural elements. Note that the inductor may include a wiring inductor through wiring connected each of the structural elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication devices, such as mobile telephones, as a compact filter, multiplexer, front-end circuit, and communication device that can be adopted for use in multi-band systems.

The invention claimed is:

1. A radio-frequency filter, comprising:
    a first series-arm circuit disposed on a path that connects an input terminal and an output terminal;
    a second series-arm circuit disposed on the path closer to the output terminal than the first series-arm circuit; and
    a first parallel-arm circuit connected to a ground and a node that is disposed on the path between the first series-arm circuit and the second series-arm circuit, wherein
    the first series-arm circuit includes a first series-arm resonator, and a first switch element, the first switch element including first semiconductor elements arranged in series,
    the second series-arm circuit includes a second series-arm resonator, and a second switch element, the second switch element including at least one second semiconductor element, and
    a first stack number being higher than a second stack number, the first stack number being a number of the first semiconductor elements and the second stack number being a number of the one or more second semiconductor elements.

2. The radio-frequency filter according to claim 1, wherein
    the first series-arm circuit further comprising a first capacitor in series with the first switch element, and the first series arm resonator in parallel with the first capacitor and first series switch element,
    the second series arm circuit further comprising a second capacitor in series with the second switch element, and the second series arm resonator in parallel with the second capacitor and second series switch element.

3. The radio-frequency filter according to claim 2, further comprising:
    a third series-arm circuit and a second parallel-arm circuit, wherein
    the third series-arm circuit is disposed on the path between the first series-arm circuit and the second series-arm circuit,
    the first parallel-arm circuit is connected to the ground and a node that is disposed on the path between the first series-arm circuit and the third series-arm circuit,
    the second parallel-arm circuit is connected to the ground and a node that is disposed on the path between the second series-arm circuit and the third series-arm circuit,
    the third series-arm circuit includes a third series-arm resonator, a third capacitor, and a third switch element,
    the third capacitor and the third switch element are connected in series,
    the third series-arm resonator is connected in parallel to a circuit that is constituted by the third capacitor and the third switch element connected in series,
    the third switch element includes one or more semiconductor elements, and
    a third stack number is lower than the first stack number and higher than the second stack number, the third stack number being a number of the one or more semiconductor elements included in the third switch element.

4. The radio-frequency filter according to claim 3, wherein
    the first semiconductor elements, the at least one second semiconductor element, and the one or more semiconductor elements included in the third switch element are transistors, and a gate width of each of the transistors included in the third switch element being smaller than that of transistors in the first switch element and larger than that of any transistor included in the second switch element.

5. The radio-frequency filter according to claim 3, wherein
the first parallel-arm circuit includes a parallel-arm resonator and a fourth switch element connected in series to the parallel-arm resonator.

6. The radio-frequency filter according to claim 5, wherein
the fourth switch element is configured to be switched between conduction and non-conduction to change at least one of a resonant frequency or an antiresonant frequency of the first parallel-arm circuit.

7. The radio-frequency filter according to claim 5, wherein
the fourth switch element includes one or more semiconductor elements connected in series, and
the first stack number or the second stack number is lower than a fourth stack number that is a number of the one or more semiconductor elements included in the fourth switch element.

8. The radio-frequency filter according to claim 7, wherein
the one or more semiconductor elements included in the fourth switch element are transistors, and
a gate width of transistors included in the first switch element or a gate width of each of transistors included in the second switch element being smaller than a gate width of at least one of the transistors included in the fourth switch element.

9. The radio-frequency filter according to claim 5, wherein
the first switch element, the second switch element, the third switch element, and the fourth switch element are included in one package.

10. The radio-frequency filter according to claim 5, wherein
the one or more semiconductor elements included in each of the first switch element, the second switch element, the third switch element, and the fourth switch element are field-effect transistor switches containing gallium arsenide (GaAs) or a complementary metal-oxide-semiconductor (CMOS).

11. The radio-frequency filter according to claim 5, wherein
the first series-arm resonator, the second series-arm resonator, the third series-arm resonator, and the parallel-arm resonator are configured to use surface acoustic waves (SAWs) or bulk acoustic waves (BAWs) in operation.

12. The radio-frequency filter according to claim 1, wherein in response to a change in an on/off state of at least one of the first switch element and the second switch element, a center frequency of a passband of the radio-frequency filter is changed.

13. The radio-frequency filter according to claim 1, wherein
the first semiconductor elements and the at least one second semiconductor element being transistors, and
a gate width of the transistors in the first switch element being larger than that for any transistor in the second switch element.

14. The radio-frequency filter according to claim 1, wherein
an antiresonant frequency of the first series-arm resonator is lower than an antiresonant frequency of the second series-arm resonator.

15. The radio-frequency filter according to claim 1, further comprising:
means for frequency-tuning a passband of the radio-frequency filter, and
means for providing protection against damage to the radio-frequency filter caused by voltage, current and/or electrical power.

16. A multiplexer, comprising:
a plurality of filters, an input terminal or an output terminal of each of the plurality of filters being directly or indirectly connected to a common terminal, the plurality of filters includes a radio-frequency filter, the radio-frequency filter comprising
a first series-arm circuit disposed on a path that connects the input terminal and the output terminal,
a second series-arm circuit disposed on the path closer to the output terminal than the first series-arm circuit, and
a first parallel-arm circuit connected to a ground and a node that is disposed on the path between the first series-arm circuit and the second series-arm circuit, wherein
the first series-arm circuit includes a first series-arm resonator, and a first switch element, the first switch element including first semiconductor elements arranged in series,
the second series-arm circuit includes a second series-arm resonator, and a second switch element, the second switch element including at least one second semiconductor element, and
a first stack number being higher than a second stack number, the first stack number being a number of the first semiconductor elements and the second stack number being a number of the one or more second semiconductor elements.

17. A radio-frequency front-end circuit, comprising:
a multiplexer having a plurality of filters, an input terminal or an output terminal of each of the plurality of filters being directly or indirectly connected to a common terminal, the plurality of filters includes a radio-frequency filter; and
an amplifier circuit directly or indirectly connected to the radio-frequency filter, wherein
the radio-frequency filter, comprising
a first series-arm circuit disposed on a path that connects the input terminal and the output terminal,
a second series-arm circuit disposed on the path closer to the output terminal than the first series-arm circuit, and
a first parallel-arm circuit connected to a ground and a node that is disposed on the path between the first series-arm circuit and the second series-arm circuit, wherein
the first series-arm circuit includes a first series-arm resonator, and a first switch element, the first switch element including first semiconductor elements arranged in series,
the second series-arm circuit includes a second series-arm resonator, and a second switch element, the second switch element including at least one second semiconductor element, and a first stack number being higher than a second stack number, the first stack number being a number of the first semiconductor elements and the second stack number being a number of the one or more second semiconductor elements.

18. The radio-frequency front-end circuit according to claim 17, wherein
the amplifier circuit is a power amplifier that amplifies a radio-frequency transmission signal, and
the radio-frequency transmission signal amplified by the power amplifier is inputted to the input terminal of each of the plurality of filters.

19. The radio-frequency front-end circuit according to claim 17, wherein
the amplifier circuit is a low-noise amplifier that amplifies a radio-frequency reception signal, and
the radio-frequency reception signal amplified by the low-noise amplifier is outputted from the output terminal of each of the plurality of filters.

20. A communication device, comprising:
a radio frequency (RF) signal processing circuit that processes a radio-frequency signal to be transmitted by an antenna element and a radio-frequency signal to be received by the antenna element; and
the radio-frequency front-end circuit of claim 17 that conveys the radio-frequency signals between the antenna element and the RF signal processing circuit.

* * * * *